US012062638B2

(12) United States Patent
Chaji

(10) Patent No.: US 12,062,638 B2
(45) Date of Patent: Aug. 13, 2024

(54) MICRODEVICE TRANSFER SETUP AND INTEGRATION OF MICRO-DEVICES INTO SYSTEM SUBSTRATE

(71) Applicant: VueReal Inc., Waterloo (CA)

(72) Inventor: Gholamreza Chaji, Waterloo (CA)

(73) Assignee: VueReal Inc., Waterloo (CA)

( * ) Notice: Subject to any disclaimer, the term of this patent is extended or adjusted under 35 U.S.C. 154(b) by 789 days.

(21) Appl. No.: 17/017,071

(22) Filed: Sep. 10, 2020

(65) Prior Publication Data

US 2020/0411471 A1 Dec. 31, 2020

Related U.S. Application Data

(60) Division of application No. 16/206,393, filed on Nov. 30, 2018, now Pat. No. 10,916,523, which is a (Continued)

(30) Foreign Application Priority Data

Oct. 30, 2017 (CA) .................................. CA 2984214
Nov. 23, 2017 (CA) .................................. CA 2986503

(51) Int. Cl.
*B23P 19/00* (2006.01)
*H01L 21/66* (2006.01)
(Continued)

(52) U.S. Cl.
CPC .......... *H01L 24/97* (2013.01); *H01L 21/6835* (2013.01); *H01L 22/20* (2013.01);
(Continued)

(58) Field of Classification Search
CPC ..... H01L 21/6835; H01L 22/14; H01L 22/20; H01L 24/80; H01L 24/95; H01L 24/97;
(Continued)

(56) References Cited

U.S. PATENT DOCUMENTS 6,132,909 A 10/2000 Phillips
6,555,408 B1* 4/2003 Jacobsen ................. H01L 24/95
438/149

(Continued)

FOREIGN PATENT DOCUMENTS

CN 102113089 A 6/2011
CN 102737719 A 10/2012
(Continued)

OTHER PUBLICATIONS

International Search Report and Written Opinion in International Application No. PCT/IB2017/057310, mailed Mar. 7, 2018 (6 pages).
(Continued)

*Primary Examiner* — Paul D Kim
(74) *Attorney, Agent, or Firm* — NIXON PEABODY LLP

(57) ABSTRACT

This invention relates to integrating pixelated micro-devices into a system substrate. Defined are methods of transferring a plurality of micro-devices into a receiver substrate where a plurality of micro-devices is arranged in one or more cartridges that are aligned and bonded to a template. Further, defining the transfer process, the micro-devices may be selected, identified as defective and a transfer adjustment made based on defective micro-devices.

8 Claims, 45 Drawing Sheets

Related U.S. Application Data continuation-in-part of application No. 15/820,683, filed on Nov. 22, 2017, now Pat. No. 10,468,472.

(60) Provisional application No. 62/426,353, filed on Nov. 25, 2016, provisional application No. 62/473,671, filed on Mar. 20, 2017, provisional application No. 62/482,899, filed on Apr. 7, 2017, provisional application No. 62/515,185, filed on Jun. 5, 2017.

(51) Int. Cl.
| | |
|---|---|
| *H01L 21/683* | (2006.01) |
| *H01L 23/00* | (2006.01) |
| *H01L 33/00* | (2010.01) |
| *H01L 33/08* | (2010.01) |
| *H01L 33/12* | (2010.01) |
| *H01L 33/62* | (2010.01) |
| *H05K 13/04* | (2006.01) |
| *H01L 25/075* | (2006.01) |
| *H01L 33/06* | (2010.01) |

(52) U.S. Cl.
CPC ............ *H01L 24/80* (2013.01); *H01L 24/95* (2013.01); *H01L 33/0093* (2020.05); *H01L 33/08* (2013.01); *H01L 33/12* (2013.01); *H01L 33/62* (2013.01); *H05K 13/046* (2013.01); *H01L 22/14* (2013.01); *H01L 25/0753* (2013.01); *H01L 33/0095* (2013.01); *H01L 33/06* (2013.01); *H01L 2221/68309* (2013.01); *H01L 2221/68322* (2013.01); *H01L 2221/68354* (2013.01); *H01L 2221/68359* (2013.01); *H01L 2221/68368* (2013.01); *H01L 2224/80006* (2013.01); *H01L 2224/80132* (2013.01); *H01L 2224/95001* (2013.01)

(58) Field of Classification Search
CPC . H01L 2221/68309; H01L 2221/68322; H01L 2221/68354; H01L 2221/68359; H01L 2221/68368; H01L 2224/80006; H01L 2224/80132; H01L 2224/95001; H01L 25/0753; H01L 33/0095; H01L 33/06; H01L 33/08; H01L 33/12; H01L 33/62

See application file for complete search history.

(56) References Cited

U.S. PATENT DOCUMENTS

| | | | |
|---|---|---|---|
| 6,946,322 | B2 | 9/2005 | Brewer |
| 7,033,842 | B2 * | 4/2006 | Haji ............... H01L 21/681 228/19 |
| 7,148,127 | B2 | 12/2006 | Oohata |
| 7,972,875 | B2 | 7/2011 | Rogers |
| 8,349,116 | B1 | 1/2013 | Bibl |
| 9,178,123 | B2 | 11/2015 | Sakariya |
| 9,607,907 | B2 | 3/2017 | Wu |
| 9,773,750 | B2 | 9/2017 | Bibl |
| 9,825,014 | B2 | 11/2017 | Cha |
| 2004/0142575 | A1 | 7/2004 | Brewer |
| 2004/0154733 | A1 * | 8/2004 | Morf ............... H01L 24/83 156/716 |
| 2009/0057681 | A1 | 3/2009 | Komatsu |
| 2010/0140633 | A1 | 6/2010 | Emerson |
| 2010/0317132 | A1 | 12/2010 | Rogers |
| 2011/0151153 | A1 | 6/2011 | Felder |
| 2012/0115262 | A1 | 5/2012 | Menard |
| 2012/0314388 | A1 | 12/2012 | Bower et al. |
| 2012/0320581 | A1 | 12/2012 | Rogers |
| 2013/0130440 | A1 | 5/2013 | Hu |
| 2014/0159065 | A1 | 6/2014 | Hu |
| 2014/0312368 | A1 | 10/2014 | Lee |
| 2014/0340900 | A1 | 11/2014 | Bathurst |
| 2014/0363928 | A1 | 12/2014 | Hu |
| 2016/0087165 | A1 | 3/2016 | Lee |
| 2016/0126218 | A1 | 5/2016 | Kurita |
| 2016/0240516 | A1 | 8/2016 | Chang |
| 2016/0268491 | A1 | 9/2016 | Wu |
| 2016/0308103 | A1 | 10/2016 | Hu |
| 2016/0360712 | A1 | 12/2016 | Yorio |
| 2016/0372893 | A1 | 12/2016 | McLaurin |
| 2017/0025399 | A1 | 1/2017 | Takeya |
| 2017/0062397 | A1 | 3/2017 | Park |
| 2017/0215280 | A1 | 7/2017 | Chaji |
| 2017/0263811 | A1 | 9/2017 | Zhou |
| 2017/0330856 | A1 | 11/2017 | Zou |
| 2017/0338199 | A1 | 11/2017 | Zhou |
| 2017/0345692 | A1 | 11/2017 | Liu |
| 2018/0006083 | A1 | 1/2018 | Zhu |
| 2018/0033768 | A1 | 2/2018 | Kumar |
| 2018/0045383 | A1 | 2/2018 | Hasegawa et al. |
| 2018/0053751 | A1 | 2/2018 | Zou |
| 2018/0096877 | A1 | 4/2018 | Horibe |
| 2018/0138071 | A1 | 5/2018 | Onohara et al. |
| 2018/0138357 | A1 | 5/2018 | Henley |
| 2018/0158706 | A1 | 6/2018 | Hsu |
| 2018/0166429 | A1 | 6/2018 | Chong |
| 2018/0218952 | A1 | 8/2018 | Horibe |
| 2018/0226287 | A1 | 8/2018 | Bower et al. |
| 2018/0247922 | A1 | 8/2018 | Robin |
| 2018/0261582 | A1 | 9/2018 | Henry |
| 2018/0358246 | A1 | 12/2018 | Kobrin |
| 2018/0374987 | A1 | 12/2018 | Zou |
| 2019/0027639 | A1 | 1/2019 | Yoon |
| 2019/0115235 | A1 | 4/2019 | Ahn |
| 2019/0157501 | A1 | 5/2019 | An |
| 2019/0164946 | A1 | 5/2019 | Fu |
| 2019/0187375 | A1 | 6/2019 | Nemouchi |
| 2019/0252350 | A1 | 8/2019 | Schwarz |
| 2019/0304818 | A1 | 10/2019 | Ahn |
| 2019/0305178 | A1 | 10/2019 | Ahn et al. |
| 2019/0326149 | A1 | 10/2019 | Bower et al. |
| 2019/0393201 | A1 | 12/2019 | Caplet et al. |
| 2020/0235076 | A1 | 7/2020 | Bartres |
| 2020/0303359 | A1 | 9/2020 | Robin |
| 2023/0078708 | A1 * | 3/2023 | Chaji ............... H01L 25/0753 257/776 |

FOREIGN PATENT DOCUMENTS

| | | |
|---|---|---|
| CN | 103646893 A | 3/2014 |
| CN | 105129259 A | 9/2015 |
| CN | 105493297 | 4/2016 |
| CN | 105723528 | 6/2016 |
| CN | 105576088 B | 11/2016 |
| CN | 107017319 | 8/2017 |
| CN | 107210293 | 9/2017 |
| GB | 2545155 A | 6/2017 |
| JP | 2001196444 | 7/2001 |
| JP | 2006140398 A | 6/2006 |
| WO | WO 1997/036194 | 10/1997 |
| WO | WO 2002/022374 | 3/2002 |
| WO | WO-2007015561 A1 * | 2/2007 ............ H05K 13/04 |

OTHER PUBLICATIONS

International Search Report and Written Opinion in International Application No. PCT/IB2017/056082, mailed Jan. 30, 2018 (6 pages).

* cited by examiner

Average device performance

MICRODEVICE TRANSFER SETUP AND INTEGRATION OF MICRO-DEVICES INTO SYSTEM SUBSTRATE

CROSS-REFERENCE TO RELATED APPLICATIONS

This application is a division of U.S. Nonprovisional patent application Ser. No. 16/206,393, filed Nov. 30, 2018, now U.S. Pat. No. 10,916,523, which is a continuation-in-part of U.S. Nonprovisional patent application Ser. No. 15/820,683, filed on Nov. 22, 2017, now U.S. Pat. No. 10,468,472, which claims the benefit of and priority to U.S. Provisional Patent Application No. 62/426,353, filed Nov. 25, 2016, U.S. Provisional Patent Application No. 62/473,671, filed Mar. 20, 2017, U.S. Provisional Patent Application No. 62/482,899, filed Apr. 7, 2017, and U.S. Provisional Patent Application No. 62/515,185, filed Jun. 5, 2017, and Canadian Patent Application No. 2,984,214 filed Oct. 30, 2017, and Canadian Patent Application No. 2,986,503 filed Nov. 23, 2017, each of which is incorporated herein by reference in its entirety.

TECHNICAL FIELD

The present invention relates to an integration of micro-devices into a system substrate.

BACKGROUND

An object of the present invention is to overcome the shortcomings of the prior art by providing a system and method for transferring micro-devices from a donor substrate to a system substrate.

SUMMARY OF THE INVENTION

A few embodiments of this description are related to integration micro-devices into the system substrate. The system substrate may comprise micro light emitting diodes (LEDs), Organic LEDs, sensors, solid state devices, integrated circuits, (micro-electro-mechanical systems) MEMS, and/or other electronic components. Other embodiments are related to patterning and placing of micro devices in respect to the pixel arrays to optimize the micro-device utilizations in selective transfer process. The receiving substrate may be, but is not limited to, a printed circuit board (PCB), thin film transistor backplane, integrated circuit substrate, or, in one case of optical micro devices such as LEDs, a component of a display, for example a driving circuitry backplane. The patterning of micro device donor substrate and receiver substrate can be used in combination with different transfer technology including but not limited to pick and place with different mechanisms (e.g. electrostatic transfer head, elastomer transfer head), or direct transfer mechanism such as dual function pads and more.

According to one embodiment, a method of transferring a plurality of microdevices into a receiver substrate is provided. The method comprising arranging the plurality of microdevices in one or more cartridges, aligning the one or more cartridges with a template that has at least one alignment mark, bonding the one or more cartridges with the template, aligning the template with the receiver substrate; and transferring the plurality of microdevices from the template into the receiver substrate.

According to another embodiment, a transfer setup is provided. The transfer setup comprising a template that holds at least one cartridge filled with microdevices; and a bonding apparatus, on the template, to assist a transfer of the microdevices from the at least one cartridge to a receiver substrate by a transfer force.

According to yet another embodiment, a method of transferring a plurality of microdevices into a system substrate is provided. The method comprising arranging the plurality of microdevices on one or more cartridges in the system substrate; selecting one or more transferable sets of micro devices in each cartridge; identifying a number of defected micro devices in each transferable set of micro devices; and simultaneously adjusting transfer of the defected micro devices into the system substrate.

BRIEF DESCRIPTION OF THE DRAWINGS

The invention will be described in greater detail with reference to the accompanying drawings which represent preferred embodiments thereof, wherein.

Figure 1A:
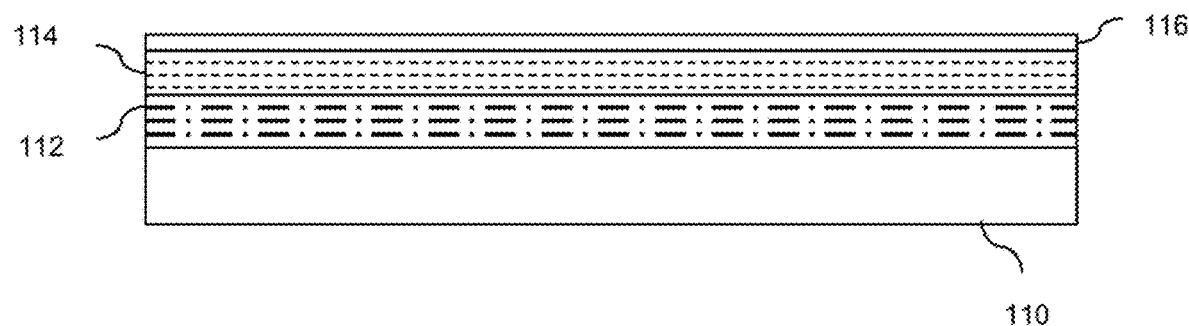
FIG. 1A illustrates a cross-sectional view of a lateral functional structure on a donor substrate in accordance with an embodiment of the present invention.

The present disclosure is susceptible to various modifications and alternative forms, specific embodiments or implementations as have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1B:
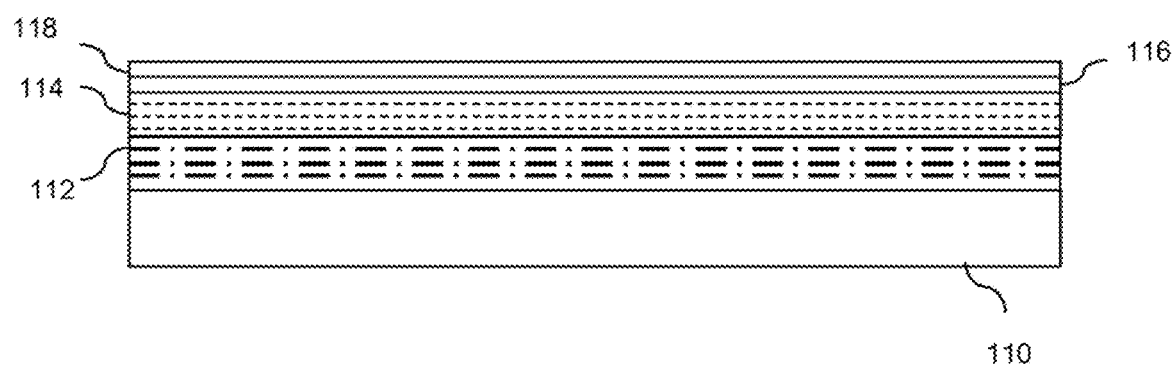
FIG. 1B illustrates a cross-sectional view the lateral structure of FIG. 1A with a current distribution layer deposited thereon.
Figure 1C:
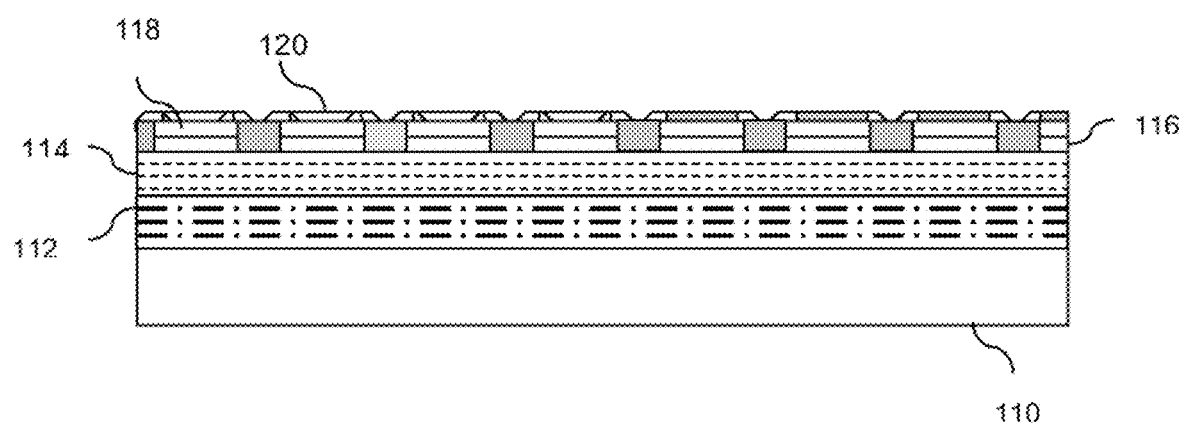
FIG. 1C illustrates a cross-sectional view of the lateral structure of FIG. 1B after patterning the dielectric, top conductive layer, and deposition of a second dielectric layer.
Figure 1D:
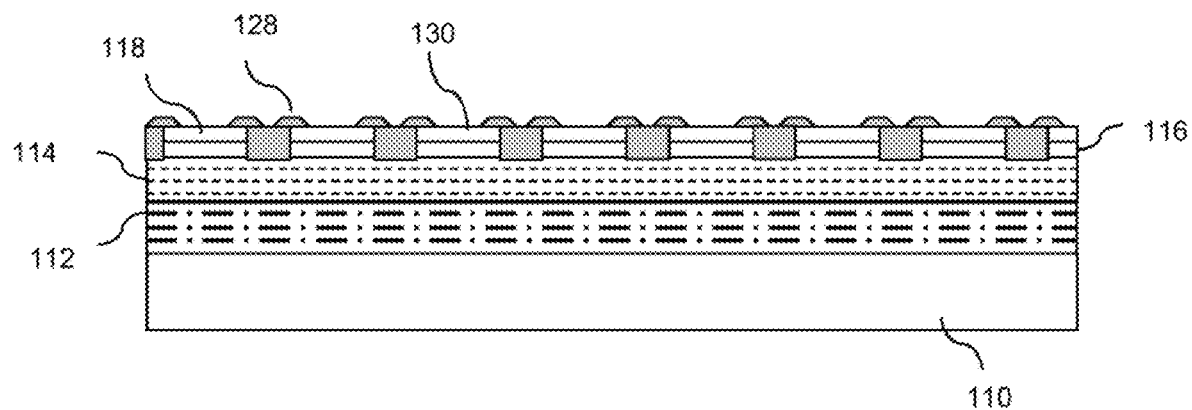
FIG. 1D illustrates a cross-sectional view of the lateral structure after patterning of the second dielectric layer.

FIG. 1A illustrates an embodiment including of a donor substrate 110 with a lateral functional structure comprising a bottom planar of sheet conductive layer 112, a functional layer, e.g. light-emitting quantum wells, 114, and a top pixelated conductive layer 116. The conductive layers 112 and 116 may be comprised of doped semiconductor material or other suitable types of conductive layers. The top conductive layer 116 may comprise a few different layers. In one embodiment, as shown in FIG. 1B, a current distribution layer 118 is deposited on top of the conductive layer 116. The current distribution layer 118 may be patterned. In one embodiment, the patterning may be done through lift off. In another case, the patterning may be done through photolithography. In an embodiment, a dielectric layer may be deposited and patterned first and then used as a hard mask for patterning the current distribution layer 118. After the patterning of current distribution layer 118, the top conductive layer 116 may be patterned as well forming a pixel structure. A final dielectric layer 120 may be deposited over and between the patterned conductive and current distribution layers 116 and 118, after patterning the current distribution layer 118 and/or conductive layer 116, as shown in FIG. 1C. The dielectric layer 120 can also be patterned to create openings 130 as shown in FIG. 1D providing access to the patterned current distribution layers 118. Additional leveling layers 128 may also be provided to level the upper surface, as shown in FIG. 1E.

Figure 1E:
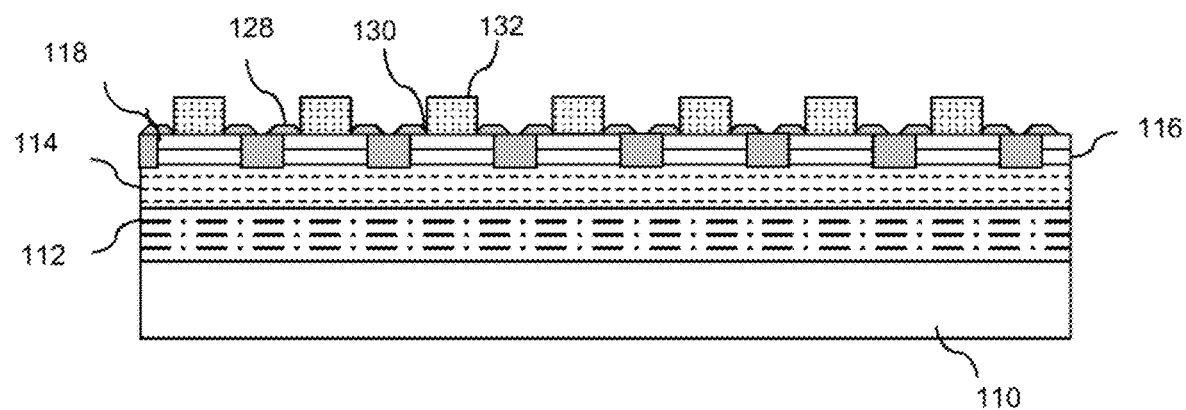
FIG. 1E illustrates a cross-sectional view of the lateral structure after deposition and patterning of pads.
Figure 1F:
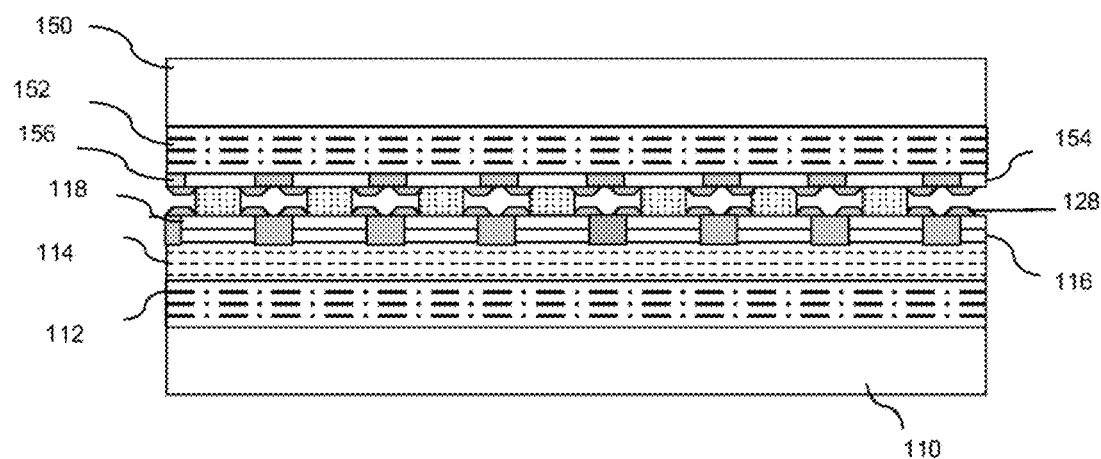
FIG. 1F illustrates a cross-sectional view of the lateral structure after bonding to a system substrate with bonding areas forming an integrated structure.

As shown in FIG. 1E, a pad 132 is deposited on the top of the current distribution layer 118 in each opening 130. The developed structure with pads 132 is bonded to the system substrate 150 with pads 154, as shown in FIG. 1F. The pads 154 in the system substrate 150 may be separated by a dielectric layer 156. Other layers 152 such as circuitry, planarization layers, conductive traces may be between the system substrate pads 154 and the system substrate 150. The bonding of the substrate system pads 154 to the pads 132 may be done either through fusion, anodic, thermocompression, eutectic, or adhesive bonding. There can also be one or more other layers deposited in between the system and lateral devices.

Figure 1G:
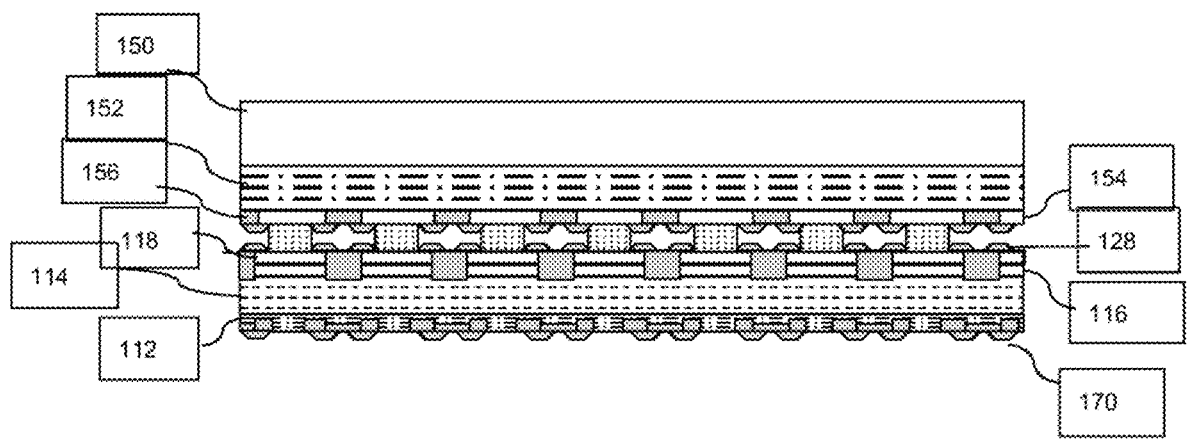
FIG. 1G illustrates a cross-sectional view of the integrated structure after removing the donor substrate and patterning the bottom electrode.

As shown in FIG. 1G, the donor substrate 110 may be removed from the lateral functional devices, e.g. the conductive layer 112. The conductive layer 112, may be thinned and/or partially or fully patterned. A reflective layer or black matrix 170 may be deposited and patterned to cover the areas on the conductive layer 112 between the pixels. After this stage, other layers may be deposited and patterned depending on the function of the devices. For example, a color conversion layer may be deposited in order to adjust the color of the light produced by the lateral devices and the pixels in the system substrate 150. One or more color filters may also be deposited before or/and after the color conversion layer. The dielectric layers, e.g. dielectric layer 120, in these devices may be organic, such as polyamide, or inorganic, such as SiN, $SiO_2$, $Al_2O_3$, and others. The deposition may be done with different process such as Plasma-enhanced chemical vapor deposition (PECVD), Atomic layer deposition (ALD), and other methods. Each layer may be a composition of one deposited material or different material deposited separately or together. The bonding materials may be deposited only as part of the pads 132 of donor substrate 110 or the system substrate pads 154. There can also be some annealing process for some of the layers. For example, the current distribution layer 118 may be annealed depending on the materials. In one example, the current distribution layer 118 maybe annealed at 500 C for 10 minutes. The annealing may also be done after different steps.

Figure 2A:
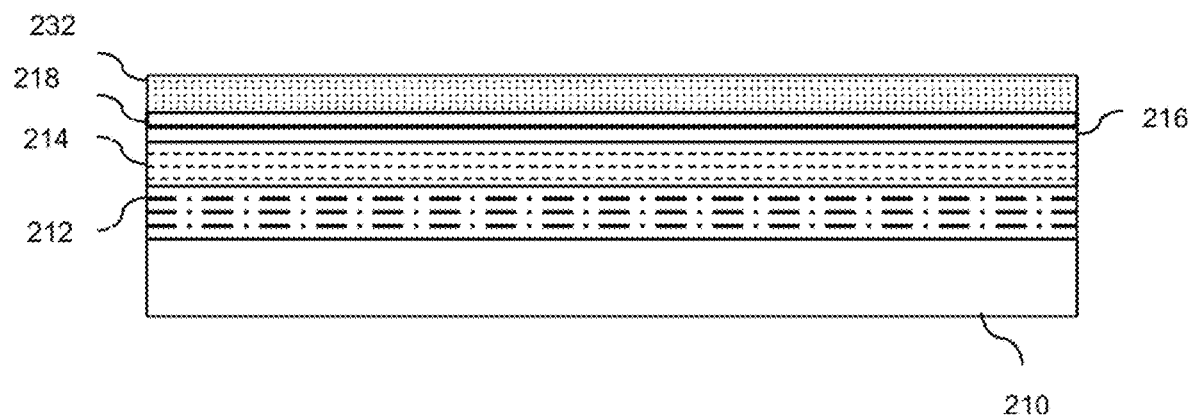
FIG. 2A illustrates a cross-sectional view of another embodiment of a lateral functional structure on a donor substrate with pad layers.
Figure 2B:
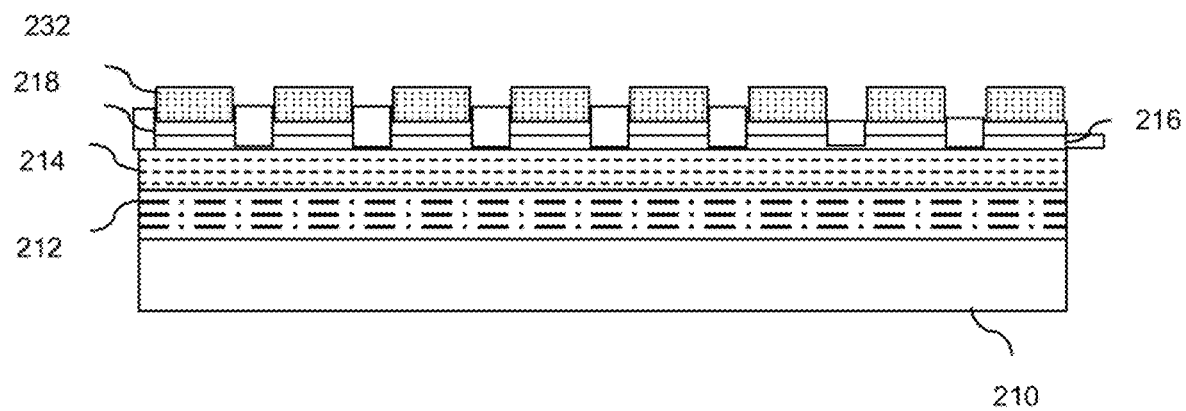
FIG. 2B illustrates a cross-sectional view of the lateral structure of FIG. 2A after patterning the pad layers and the contact and current distribution layers.
Figure 2C:
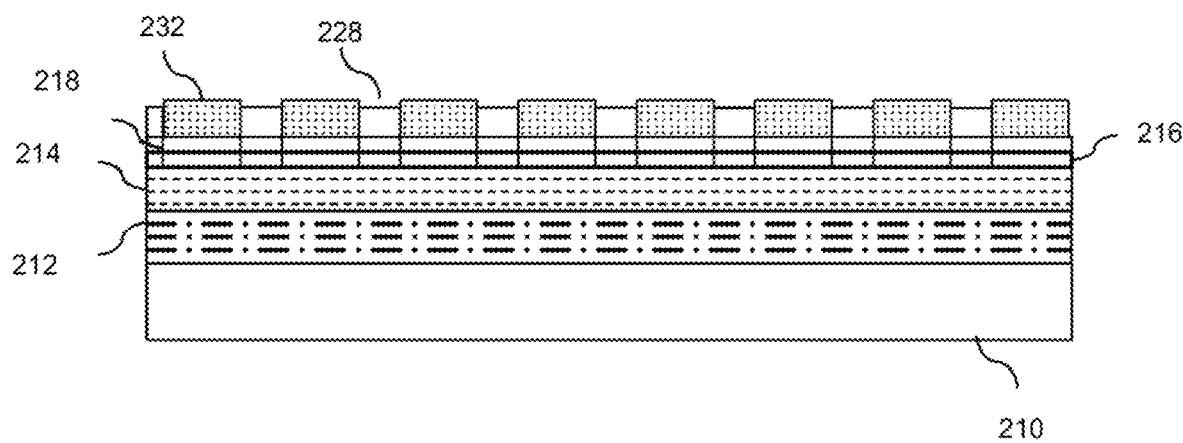
FIG. 2C illustrates a cross-sectional view of the lateral structure of FIG. 2A after the distance between the patterned pads are filled.
Figure 2D:
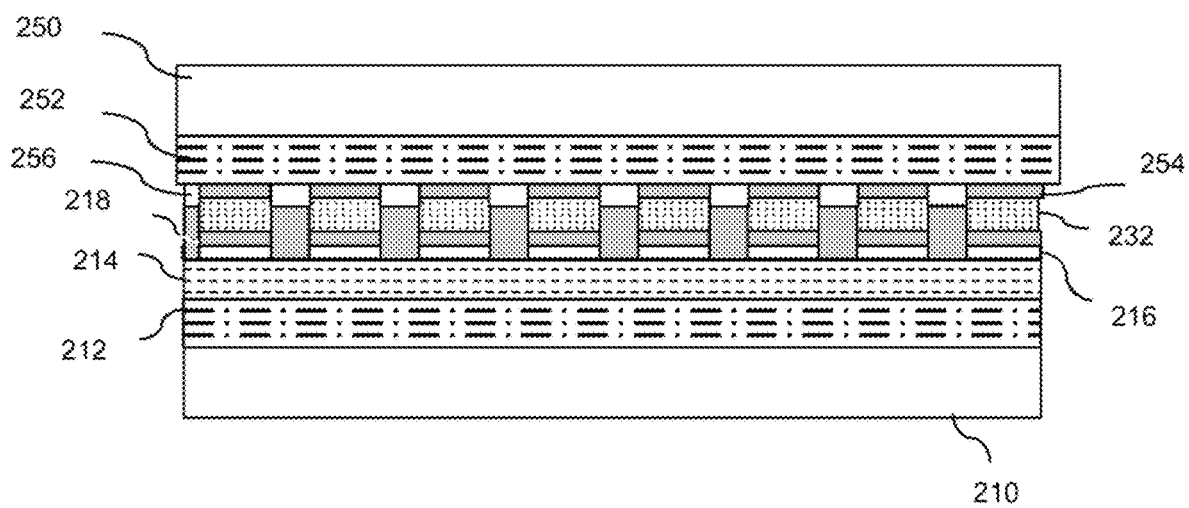
FIG. 2D illustrates a cross-sectional view of the lateral structure of FIG. 2A aligned and bonded to the system substrate through the patterned pads.
Figure 2E:
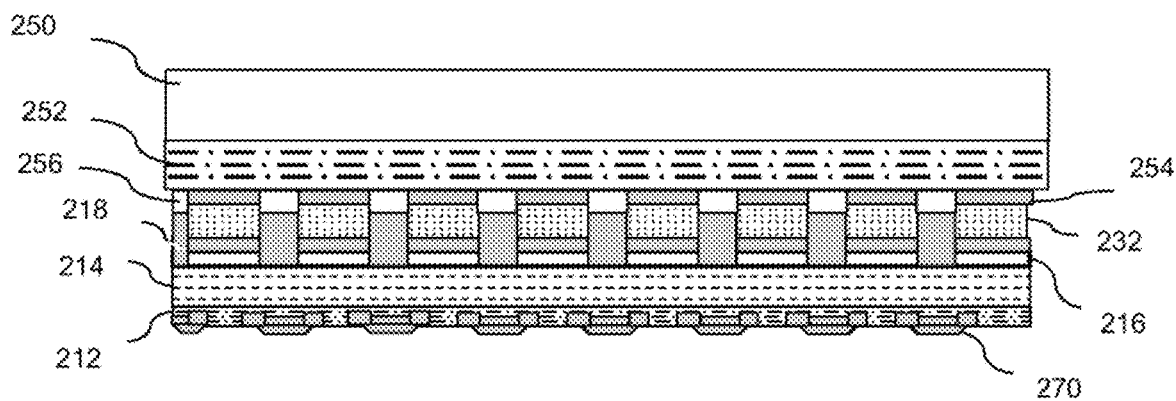
FIG. 2E illustrates a cross-sectional view of the lateral structure of FIG. 2A with the device substrate removed.

FIG. 2A illustrates an exemplary embodiment of a donor substrate 210 with lateral functional structure comprising a first top planar or sheet conductive layer 212, functional layers, e.g. light emitting, 214, a second bottom pixelated conductive layer 216, a current distribution layer 218, and/or a bonding pad layer 232. FIG. 2B illustrates the patterning of all or one of the layers 216, 218, 232 forming a pixel structure. The conductive layers 212 and 216 may be comprised of a plurality of layers including a highly doped semiconductor layer. Some layers 228, e.g. dielectric, may be used in between the patterned layers 216, 218 and 232 to level the upper surface of the lateral functional structure, as shown in FIG. 2C. The layers 228 can also do other functions, such as black matrix. The developed structure with pads 232 is bonded to a system substrate 250 with substrate pads 254, as shown in FIG. 2D. The pads 254 in in the system substrate may also be separated by a dielectric layer 256. Other layers 252 such as circuitry, planarization layers, and conductive traces may be between the system substrate pads 254 and the system substrate 250. The bonding may be done, for example, through fusion, anodic, thermocompression, eutectic, or adhesive bonding. There may also be other layers deposited in between the system and lateral devices.

The donor substrate 210 may be removed from the lateral functional devices. The conductive layer 212 may be thinned and/or patterned. A reflective layer or black matrix 270 may be deposited and patterned to cover the areas on the conductive layer 212 between the pixels. After this stage, other layers may be deposited and patterned depending on the function of the devices. For example, a color conversion layer may be deposited in order to adjust the color of the light produced by the lateral devices and the pixels in the system substrate 250. One or more color filters may also be deposited before or/and after the color conversion layer. The dielectric layers, e.g. 228 and 256, in these devices may be organic, such as polyamide, or inorganic, such as SiN, $SiO_2$, $Al_2O_3$, and others. The deposition may be done with different process, such as Plasma-enhanced chemical vapor deposition (PECVD), Atomic layer deposition (ALD), and other methods. Each layer may be a composition of one deposited material or different material deposited separately or together. The material of the bonding pads 232 may be deposited as part of the pads 232 of the donor substrate 210 or the system substrate pads 254. There can also be some annealing process for some of the layers. For example, the current distribution layer 218 may be annealed depending on the materials. In an example, it may be annealed at 500 C for 10 minutes. The annealing may also be done after different steps.

Figure 3A:
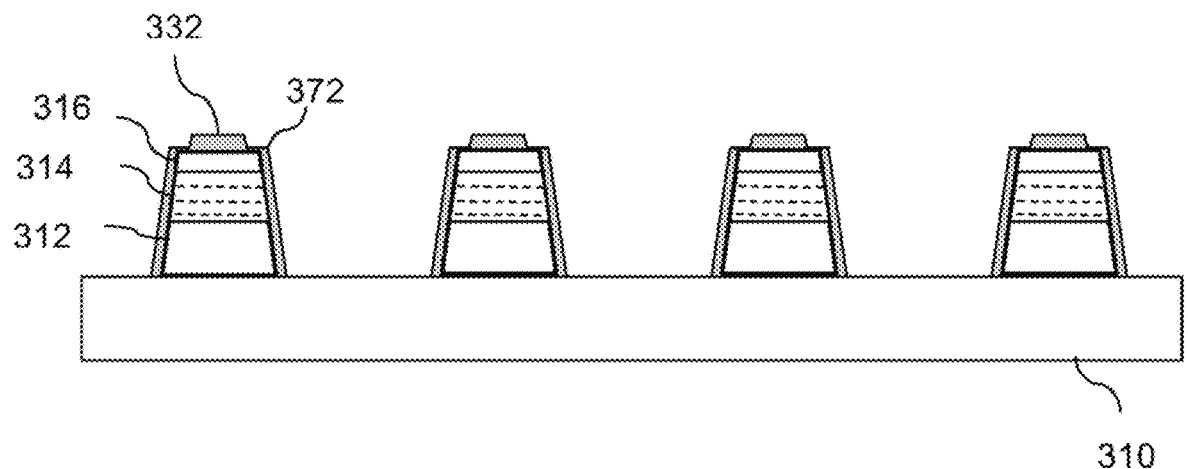
FIG. 3A illustrates a cross-sectional view of a mesa structure on a device (donor) substrate.
Figure 3B:
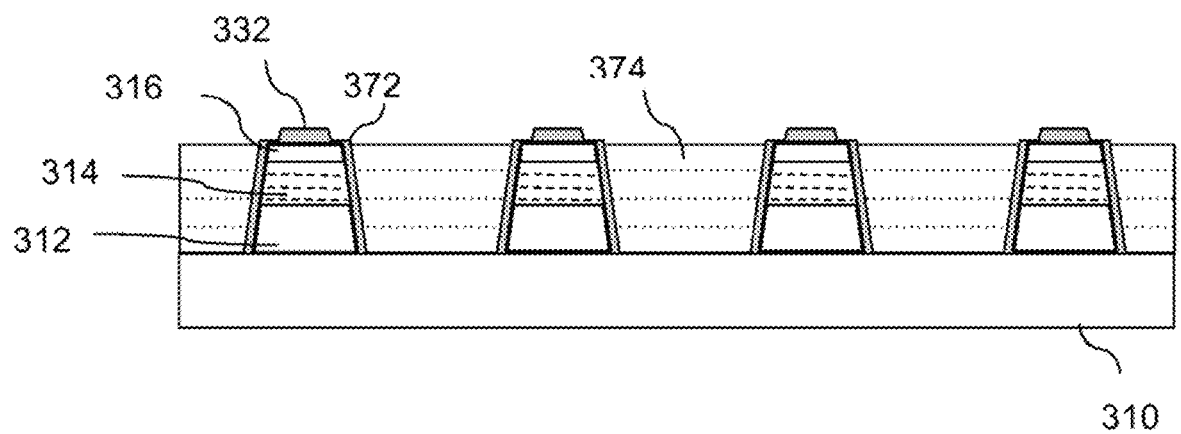
FIG. 3B illustrates a cross-sectional view of the step of filling the empty space between the mesa structures of FIG. 3A.
Figure 3C:
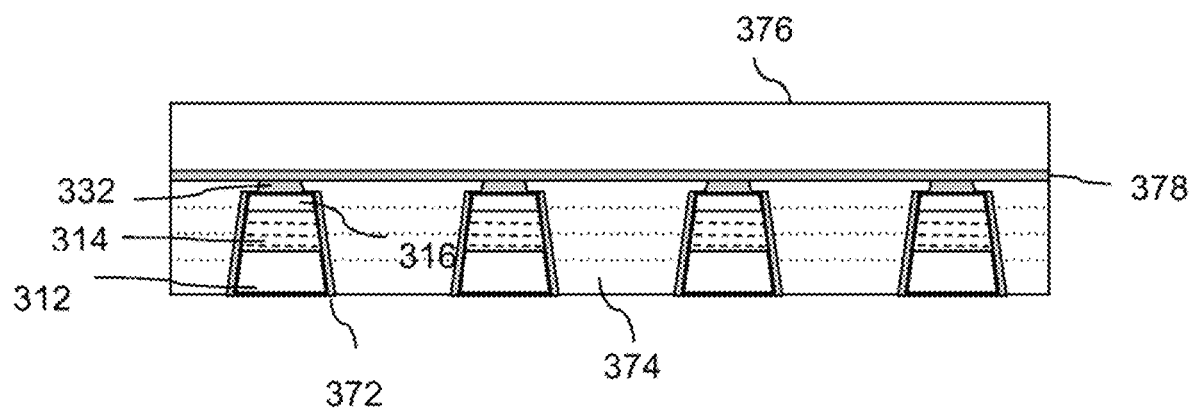
FIG. 3C illustrates a cross-sectional view of the step of transferring the devices (mesa structure) of FIG. 3B to a temporary substrate.

In another embodiment shown in FIG. 3A, a mesa structure is developed on a donor substrate 310. Micro-device structures are formed by etching through different layers, e.g. a first bottom conductive layer 312, functional layers 314, and a second top conductive layer 316. A top contact 332 may be deposited before or after the etching on top of the top conductive layer 316. In another case a multi-layer contact 332 may be used. In this case, it is possible that part of the contact layers 332 are deposited before etching and part of them after. For example, initial contact layers that create the ohmic contact through annealing with top conductive layer 316 may be deposited first. In one example, the initial contact layer may be gold and nickel. Other layers 372, such as dielectric, or MIS (metal insulator structure), may be also used in between the mesa structures to isolate and/or insulate each structure. After forming the microdevices, a filler layer 374, such as polyamide, may be deposited, as shown in FIG. 3B. The filler layer 374 may also patterned if only selected micro devices are transferred to the cartridge (temporary) substrate 376 during the next steps. The filler layer 374 also may be deposited after the transfer of the device to a temporarily substrate. The filler layer 374 may act as housing for the micro devices. Using the filler layer 374 before transfer, the lift off process may be more reliable.

Figure 3D:
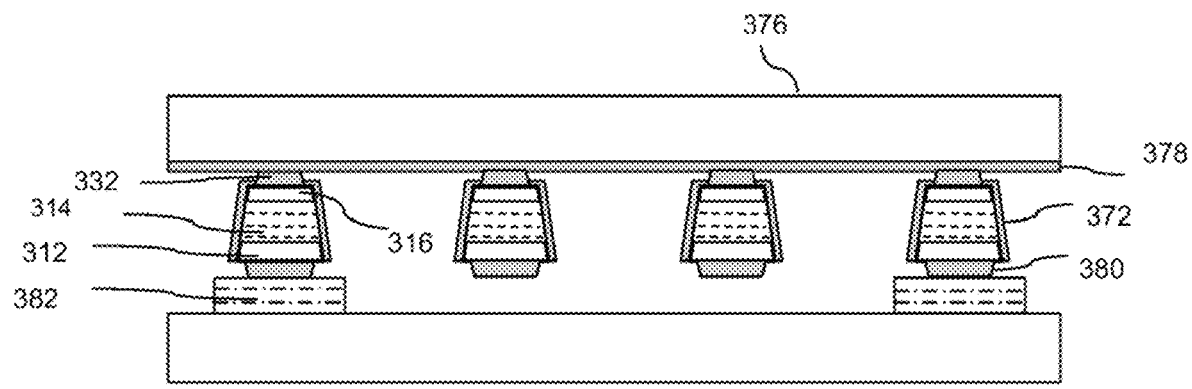
FIG. 3D illustrates a cross-sectional view of the step of aligning and bonding the devices of FIG. 3C to a system substrate.
Figure 3E:
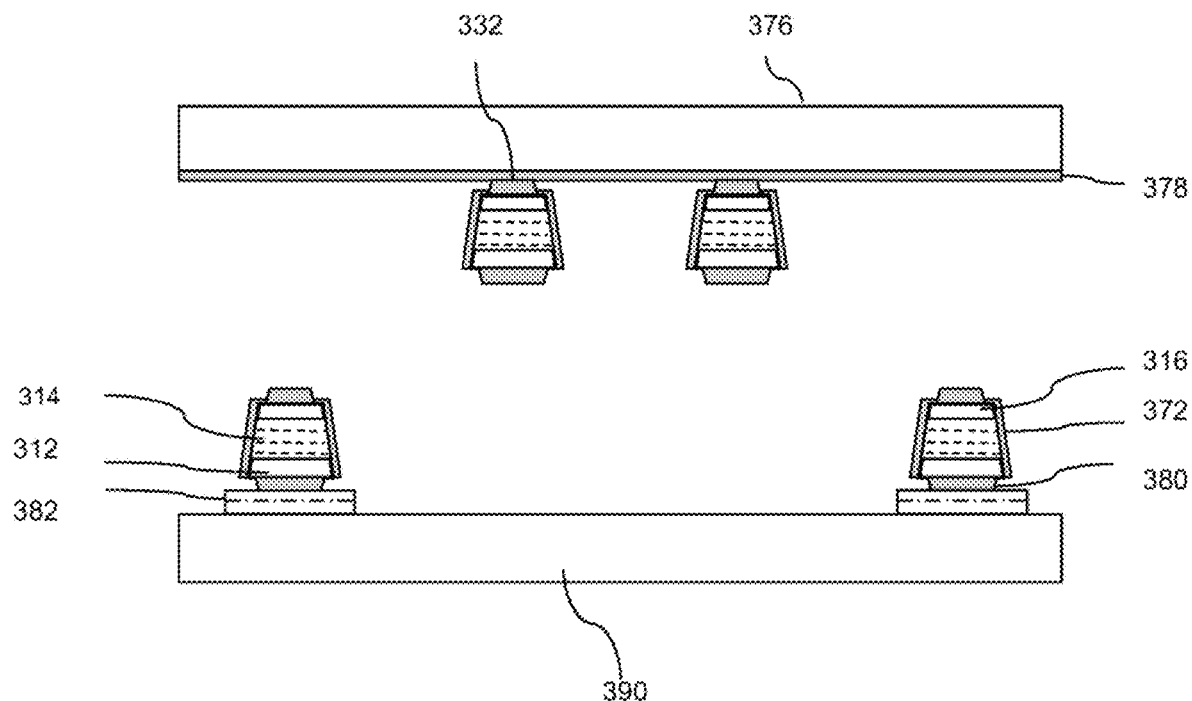
FIG. 3E illustrates a cross-sectional view of the step of transferring the devices to the system substrate.

The devices are bonded to a temporary substrate (cartridge) 376. The source of bonding may vary, for example, and may comprise one or more of: electrostatic, electromagnetic, adhesive, or Van-Der-Waals force, or thermal bonding. In case of the thermal bonding, a substrate bonding layer 378 may be used, which has a melting temperature of T1. The bonding layer 378 may be conductive or comprise a conductive layer and a bonding layer which may be adhesive, thermal, or light assisted bonding. The conductive layer may be used to bias the devices on the substrate 376 for identifying defects, and characterizing the performance. This structure can be used for other embodiments presented here. To accommodate some surface profile non-uniformity, pressure may be applied during the bonding process. It is possible to remove either the temporary substrate 376 or the donor substrate 310 and leave the device on either of them. The process is explained herein based on leaving the devices in the temporary substrate 376, however, similar steps can be used when the devices are left on the donor substrate 310. After this stage, an extra process may be done on the micro devices, such as thinning the device, creating a contact bond 380 on the bottom conductive layer 312, and removing the filler layer 374. The devices may be transferred to a system substrate 390 as shown in FIGS. 3D and 3E. The transfer may be done using different techniques. In one case, a thermal bonding is used for transfer. In this case, the contact bonding layer 380 on system substrate contact pads 382 has a melting point of T2 where T2>T1. Here, the temperature higher than T2 will melt both the substrate bonding layer 378 and the contact bonding layer 380 on the pads 382.

In a subsequent step, the temperature is reduced to between T1 and T2. At this point, the device is bonded with the contact bonding layer 380 to the system substrate 390, as the contact bonding layer 380 is solidified, but the substrate bonding layer 378 is still melted. Therefore moving the temporary substrate 376 will leave the micro devices on system substrate 390, as shown in FIG. 3E. This may be selective by applying localized heating to the selected pads 382. Also, a global temperature, e.g. by placing the substrates 376 and 390 in an oven and conducting the process therein by raising the entire atmosphere therein, may be used in addition to the localized heating to improve the transfer speed. Here, the global temperature on the temporary substrate 376 or the system substrate 390 may bring the temperature close, e.g. 5° C. to 10° C., to the melting point of the contact bonding layers 380, and localized temperature can be used to melt the contact bonding layers 380 and the substrate bonding layer 378 corresponding to selected devices. In another case, the temperature may be raised close, e.g. 5° C. to 10° C., to the melting point of the substrate bonding layer 378 (above the melting point of the contact bonding layers 378) and temperature transfer from the pads 382 through the device melt the selected areas of the substrate bonding layer 378 for the devices in contact with the heated pads 382.

Figure 3F:
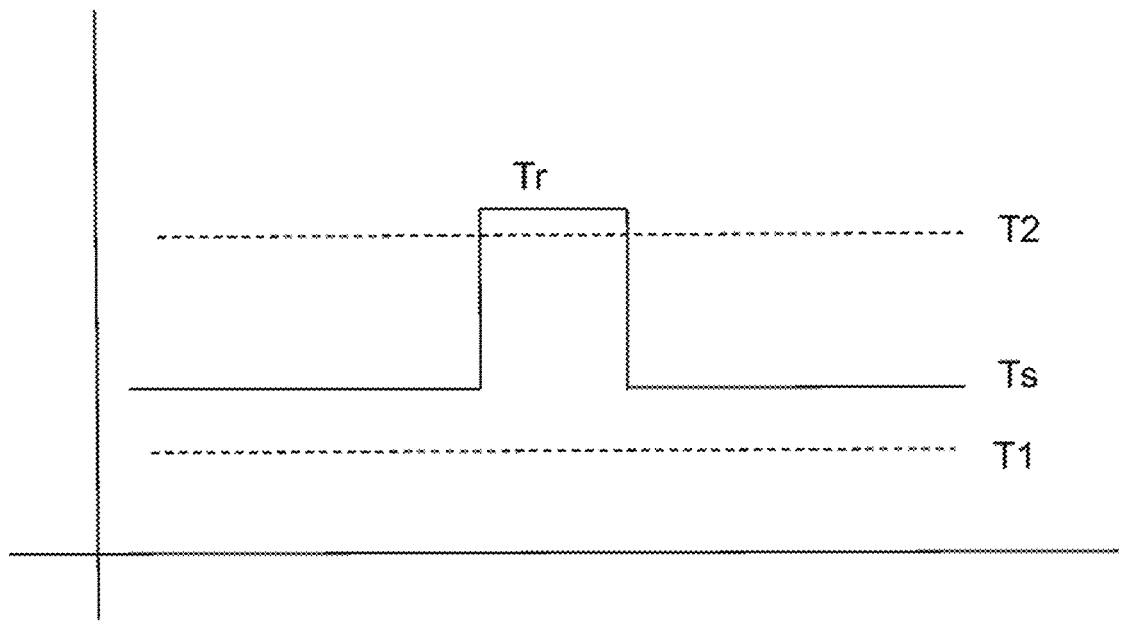
FIG. 3F illustrates a thermal profile for the thermal transfer steps.

An example of a thermal profile is shown in FIG. 3F where the melting temperature Tr melts both the contact bonding layers 380 and the substrate bonding layer 378 and solidifying temperature Ts solidify the contact bonding layer 380 with the bond pads 382, while the substrate bonding layer 378 is still melted. The melting may be partial or at least make the bonding layers soft enough to release the micro device or activate the process of forming an alloy. Here, other forces in combination or stand-alone also may be used to hold the device on the bond pads 382. In another case, the temperature profile may be created by applying current through the device. As the contact resistance will be higher prior to bonding, the power dissipated across the bond pads 382 and device will be high, melting both the contact bonding layer 380 and the substrate bonding layer 378. As the bonding forms, the resistance will drop and so will the power dissipation, thereby reducing the localized temperature. The voltage or current going through the pads 382 may be used as indicator of bonding quality and when to stop the process. The donor substrate 310 and temporary substrate 376 may be the same or different. After the device is transferred to a system substrate 390, different process steps may be done. These extra processing steps may be planarization, electrode deposition, color conversion deposition and patterning, color filter deposition and patterning, and more.

In another embodiment, the temperature to release the micro device from the cartridge substrate 376 increases as the alloys start to form. In this case, the temperature may be kept constant as the bonding alloy forms on the bonding pads 382 of the receiver substrate 390, and the bonding layers solidify, thereby keeping the micro device in place on the receiver substrate 390. At the same time, the bonding layer 378 on the cartridge 376 connected to the selected micro device is still melted (or soft enough) to release the device. Here, the part of the material required for forming alloy may be on the micro device and the other part are deposited on the bonding pads 382.

In another embodiment, the filler layer 374 may be deposited on top of the cartridge substrate 376 to form a combined filler/bonding layer 374/378. The micro devices from the donor substrate 310 may then be pushed into the polymer filler layer 374. The micro devices may then be separated from the donor substrate 310 selectively or generally. The polymer bonding layer 378/378 may be cured before or after the devices are separated from the donor substrate 310. The polymer bonding layer 37/378 may be patterned specially if multiple different devices are integrated into the cartridge substrate 374 may be created for one type, the micro devices buried in the layer and separated from their donor 310. Then another polymer bonding layer 378 is deposited and patterned for the next type of micro devices. Then, the second microdevices may be buried in the associated layer 374. In all cases, the polymer bonding layer 374 may cover part of the micro devices or the entire devices.

Another method of increasing the temperature may be the use of microwaves or lights. Accordingly, a layer may be deposited on the bonding pads 382; part of the pads 382; on the micro device; (or on part of the cartridge 376 that absorbs the microwave or light and locally heat up the micro devices. Alternatively, the cartridge 376 and/or the receiver substrate 390 may include a heating element that may selectively and/or globally heat up the micro devices.

Other methods also may be used to separate the micro devices from the temporary substrate 376, such as chemical, optical, or mechanical force. In one example, the micro devices may be covered by a sacrificial layer that may be debonded from the temporary substrate 376 by chemical, optical, thermal, or mechanical forces. The debonding process may be selective or global. In case of global debonding transfer to the system substrate 390 is selective. If the debonding process of the device from the temporary substrate (cartridge) 376 is selective, the transfer force to the system substrate 390 may be applied either selectively or globally.

The process of transfer from cartridge 376 to receiver substrate 390 may be based on different mechanism. In one case, the cartridge 376 has bonding materials that releases the device at the presence of a light while the same light cures the bonding of device to the receiver substrate.

In another embodiment, the temperature for curing the bonding layer 380 of the device to the receiver substrate 390 releases the device from the cartridge 376.

In another case, the electrical current or voltage cures the bonding layer 380 of the device to the donor substrate 310. The same current or voltage may release the device from the cartridge 376. Here the release could be function of piezoelectric, or temperature created by the current.

In another method, after curing the bonding of the device to the receiver substrate 390, the bonded devices are pulled out of the cartridge 376. Here, the force holding the device to the cartridge 376 is less than the force bonding the device to the receiver substrate 390.

In another method, the cartridge 376 has vias, which can be used to push devices out of cartridge 376 into the receiver substrate 390. The push can be done with different means, such as using array of micro rods, or pneumatically. In case of pneumatic structure, the selected devices may be pushed by the pneumatic force to the receiver substrate 390 or the pull force of selected devices are disconnected. In case of micro rods, the selected devices are moved toward receiver substrate 390 by passing the micro rods through the associated vias with the selected devices. The micro rods may have different temperature to facilitate the transfer. After the transfer of selected devices are finished, the micro rods are retracted. either the same rods are aligned with vias of another set of micro devices or a set aligned with the new selected micro devices is used to transfer the new devices.

In one embodiment, the cartridge 376 may be stretched to increase the device pitch in the cartridge 376 in order to increase the throughput. For example, if the cartridge 376 is 1×1 cm$^2$ with 5-micrometer device pitch, and receiver substrate 390 (e.g. display) has 50 micrometer pixel pitch, the cartridge 376 may populate 200×200 (40,000) pixels at once. However, if the cartridge 376 is stretched to 2×2 cm$^2$ with 10 micrometer device pitch, the cartridge 376 may populate 400×400 (160,000) pixels at once. In another case, the cartridge 376 may be stretched so that at least two micro devices on the cartridge 376 becomes aligned with two corresponding positions in a receiver substrate. The stretch may be done in one or more directions. The cartridge substrate 376 may comprise or consist of a stretchable polymer. The micro devices are also secured in another layer or the same layer as the cartridge substrate 376.

A combination of the methods described above can also be used for transfer process of micro devices from the cartridge 376 to the receiver substrate 390.

During development of the cartridge (temporary substrate) 376, the devices may be tested to identify different defects and device performance. In one embodiment, before separating the top electrode, the devices may be biased and tested. In the case in which the devices are emissive types, a camera (or sensor) may be used to extract the defects and device performance. In the case in which the devices are sensors, a stimulus may be applied to the devices to extract defects and performance. In another embodiment, the top electrode 332 may be patterned to group for testing before being patterned to individual devices. In another example, a temporary common electrode between more than one devices is deposited or coupled to the devices to extract the device performance and/or extract the defects.

The methods described in the above related to FIGS. 3A-3D including but not limited to separation, formation of filler layers, different roles of filler layer, testing, and other structure may be used for the other structures including the ones described hereafter.

The methods discussed here for transferring micro devices from cartridge 376 (temporarily substrate) to receiver substrate 390 may be applied to the all the configuration of cartridges and receiver substrate presented here.

The devices on donor substrate 310 may be developed to have two contacts 332 and 380 on the same side facing away from the donor substrate 310. In this embodiment, the conductive layer on the cartridge 376 can be patterned to bias the two contacts 332 and 380 of the device independently. In one case, the devices may be transferred to receiver substrate 390 directly from the cartridge substrate 376. Here, the contacts 332 and 380 may not be directly bonded to the receiver substrate 390, i.e. the receiver substrate 390 does not need to have special pads. In this case, conductive layers are deposited and patterned to connect the contacts 332 and 380 to proper connection in the receiver substrate 390. In another embodiment, the devices may be transferred to a temporally substrate first from the cartridge 376 prior to transferring to the receiver substrate 390. Here, the contacts 332 and 380 may be bonded directly to the receiver substrate pads 382. The devices may be tested either in the cartridge 376 or in the temporary substrate.

Figure 4A:
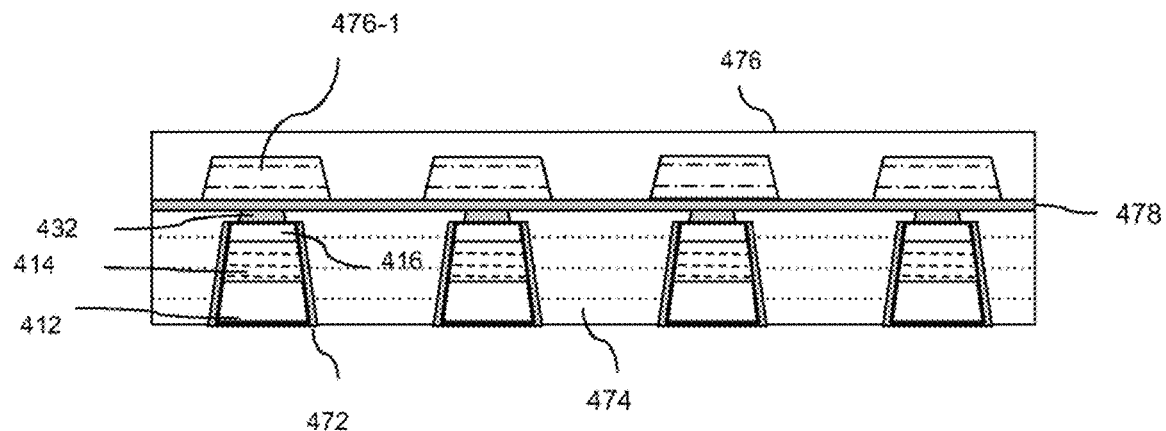
FIG. 4A illustrates a cross-sectional view of a temporary substrate with grooves and devices transferred thereto.

In another embodiment shown in FIG. 4A, a mesa structure is developed on a donor substrate, as hereinbefore described, with micro-device structures formed by etching through different layers, e.g. a first bottom conductive layer 412, functional layers, e.g. light emitting, 414, and a second top conductive layer 416. A top contact 432 may be deposited before or after the etching on top of the top conductive layer 416.

Figure 4B:
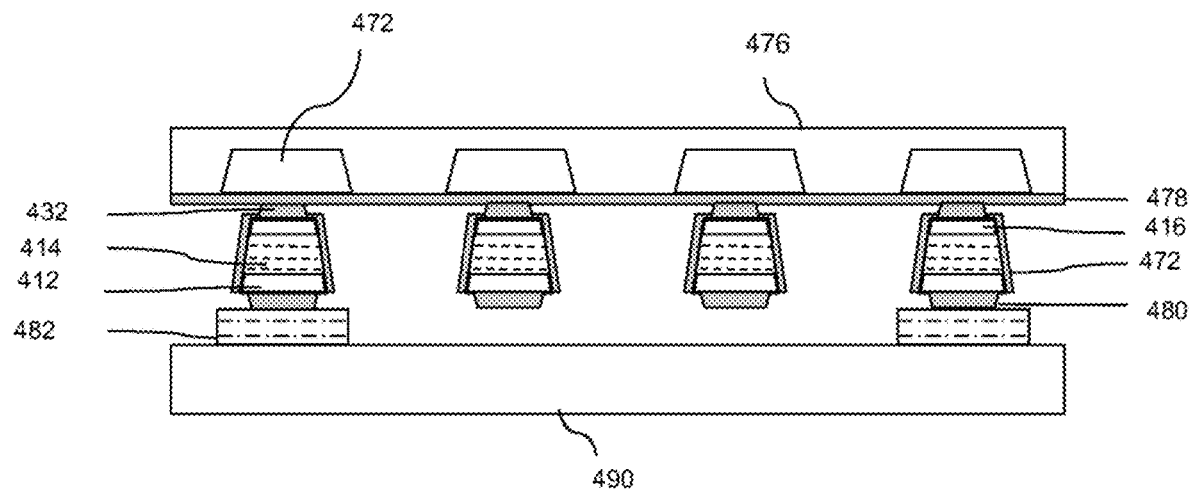
FIG. 4B illustrates a cross-sectional view of the temporary substrate of FIG. 4A after cleaning the filling from between the device space and the grooves.
Figure 4C:
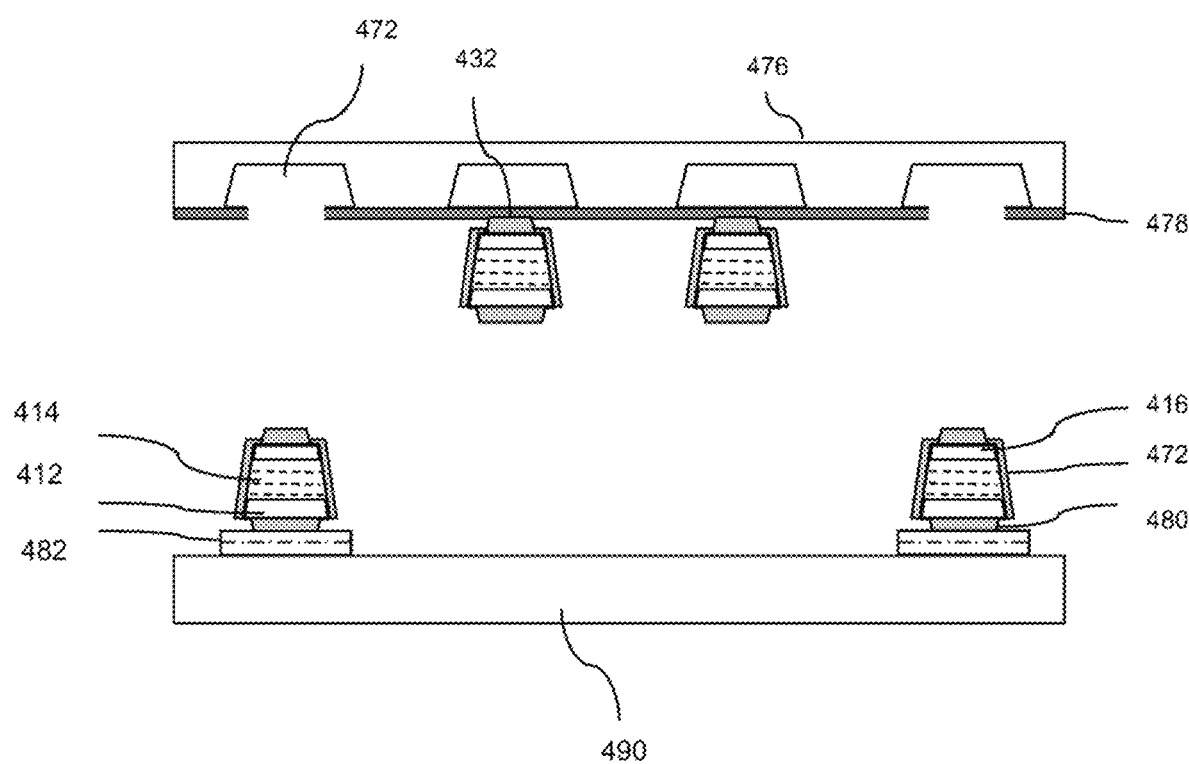
FIG. 4C illustrates a cross-sectional view of the step of transferring the devices to s system substrate by breaking the released surface.

A temporary substrate 476 includes a plurality of grooves 476-2 that are initially filled with filler materials, e.g. soft materials, such as polymers, or solid materials, such as SiO$_2$, SiN, etc. The grooves 476-2 are underneath the surface and/or the substrate bonding layer 478. The devices are transferred to the temporary substrate 476 on top of the grooves 476-2, and the devices include a contact pad 432. Also, each micro-device may include other passivation layers and/or MIS layer 472 surrounding each micro-device for isolation and/or protection. The space between the devices may be filled with filling material 474. After post processing the devices, another lower contact pad 480 may be deposited on the opposite surface of the device. The contact layer 412 may be thinned prior to the deposition of the lower contact pad 480. The filling material 474 may then be removed and the grooves may be emptied by various suitable means, such as for example chemical etching or evaporation, to cause or facilitate the release of the surface and/or selected sections of the bonding layer 478. A similar process as previously described above may be used to transfer the devices to the system (receiver) substrate 490. In addition, in another embodiment, forces applied from the pads 432, e.g. a pushing or a pulling force, may break the surface and/or bonding layer 478 above the evacuated grooves 476-2, while maintaining the unselected mesa structures attached to the temporary substrate. This force can release the devices from the temporary substrate 476 as well, as shown in FIG. 4B and FIG. 4C. The depth of the grooves 476-2 may be selected to manage some of the micro device height differences. For example, if the height difference is H, the depth of the groove may be larger than H.

The devices on substrate 310 can be developed to have two contacts 432 and 480 on the same side facing away from the substrate 310. In this case, the conductive layer on 476 can be patterned to bias the two contacts of the device independently. In one case, the devices may be transferred to the receiver substrate directly from the cartridge substrate 476. Here, the contacts 432 and 480 will not be directly bonded to the receiver substrate (receiver substrate does not need to have special pads). In this case, conductive layers are deposited and patterned to connect the contacts 432 and 380 to proper connection in the receiver substrate. In another case, the devices may be transferred to a temporally substrate first from the cartridge 476 prior to transferring to the receiver substrate. Here, the contacts 432 and 480 can be bonded directly to the receiver substrate pads. The devices can be tested either in the cartridge or in the temporally substrate.

Figure 5A:
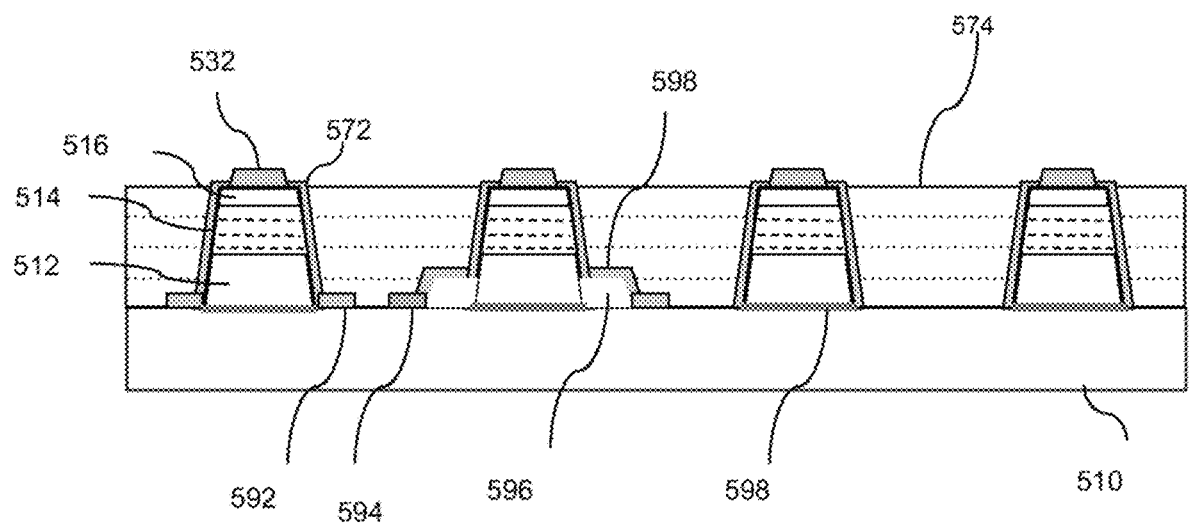
FIG. 5A illustrates a cross-sectional view of embodiments of micro devices with different anchors in a filling layer.

In another embodiment shown in FIG. 5A, a mesa structure is developed on a donor substrate 510, as hereinbefore described, with micro-device structures formed by etching through different layers, e.g. a first bottom conductive layer 512, functional layers, e.g. light-emitting, 514, and a second top conductive layer 516. A top contact pad 532 may be deposited before or after the etching on top of the top conductive layer 516. Also, each micro-device may include other passivation layers and/or MIS layer 572 surrounding each micro-device for isolation and/or protection. In this embodiment the devices may be provided with different anchors, whereby after liftoff of the devices, the anchor holds the device to the donor substrate 510. The lift off may be done by laser. In an example, only the devices are scanned by a laser. In an embodiment a mask may be used that has an opening for the device only at the back of the donor substrate 510 to block the laser from the other area. The mask can be separate or part of the donor substrate 510. In another case, another substrate can be connected to the devices before the liftoff process to hold the devices. In another case, a filler layer 574, e.g. dielectric, may be used between the devices.

In a first illustrated case, a layer 592 is provided to hold the device to the donor substrate 510. The layer 592 may be a separate layer or part of the layers of the micro devices that are not etched during development of mesa structure. In another case, the layer 592 may be the continuation of one of the layers 572. In this case, the layer 592 may be either a metal or dielectric layer (SiN or $SiO_2$, or other materials). In another case, the anchor is developed as a separate structure comprising extensions 594, a void/gap 596, and/or a bridge 598. Here, a sacrificial layer is deposited and patterned with the same shape as the gap/void 596. Then the anchor layer is deposited and patterned to form the bridge 598 and/or the extension 594. The sacrificial material may be removed later to create the void/gap 596. One can avoid the extension 594 as well. Similar to the previous anchor 592, another anchor may be made of different structural layers. In another case, the filling layers 574 act as anchor. In this case, the filling layers 574 can be etched or patterned or left as it is.

Figure 5B:
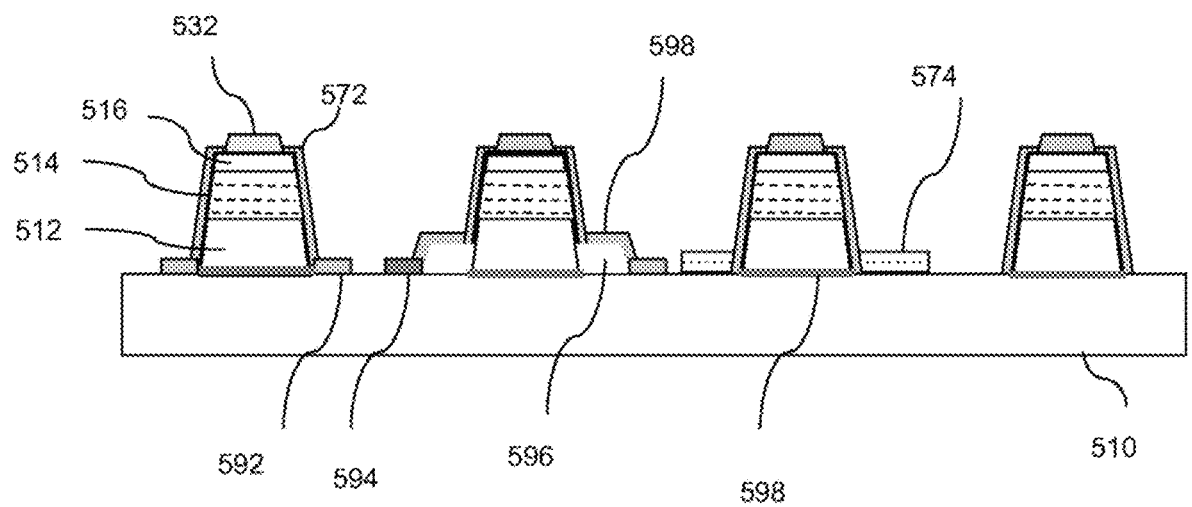
FIG. 5B illustrates a cross-sectional view of examples of micro devices after post processing the filling layer.
Figure 5C:
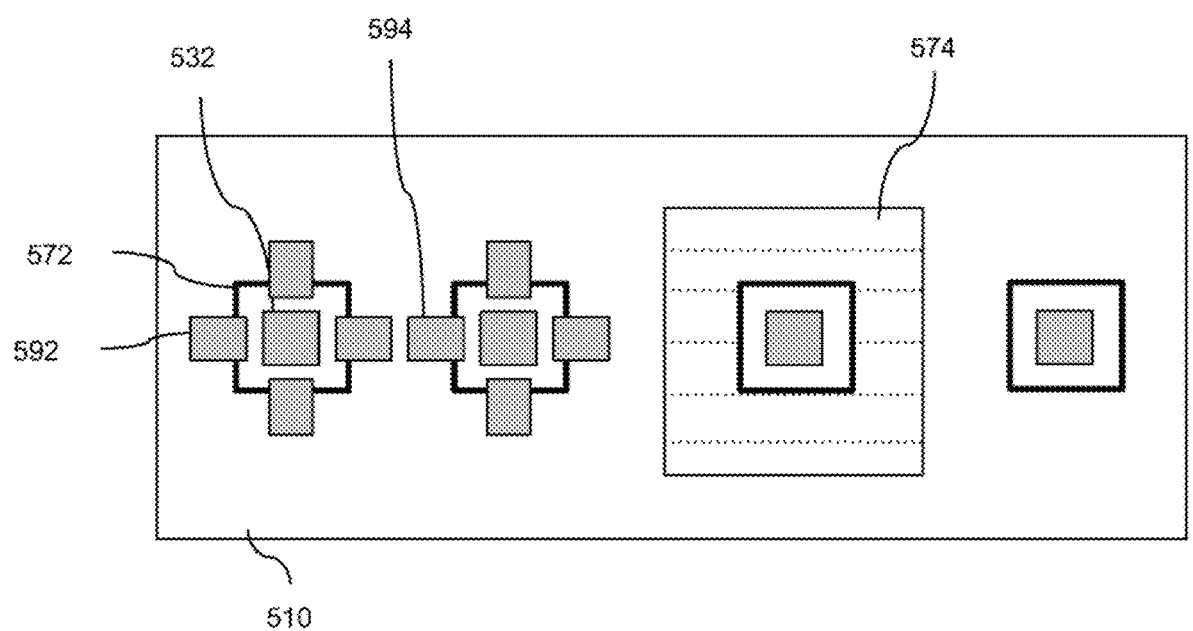
FIG. 5C illustrates a top view of the micro devices of FIG. 5B.
Figure 5D:
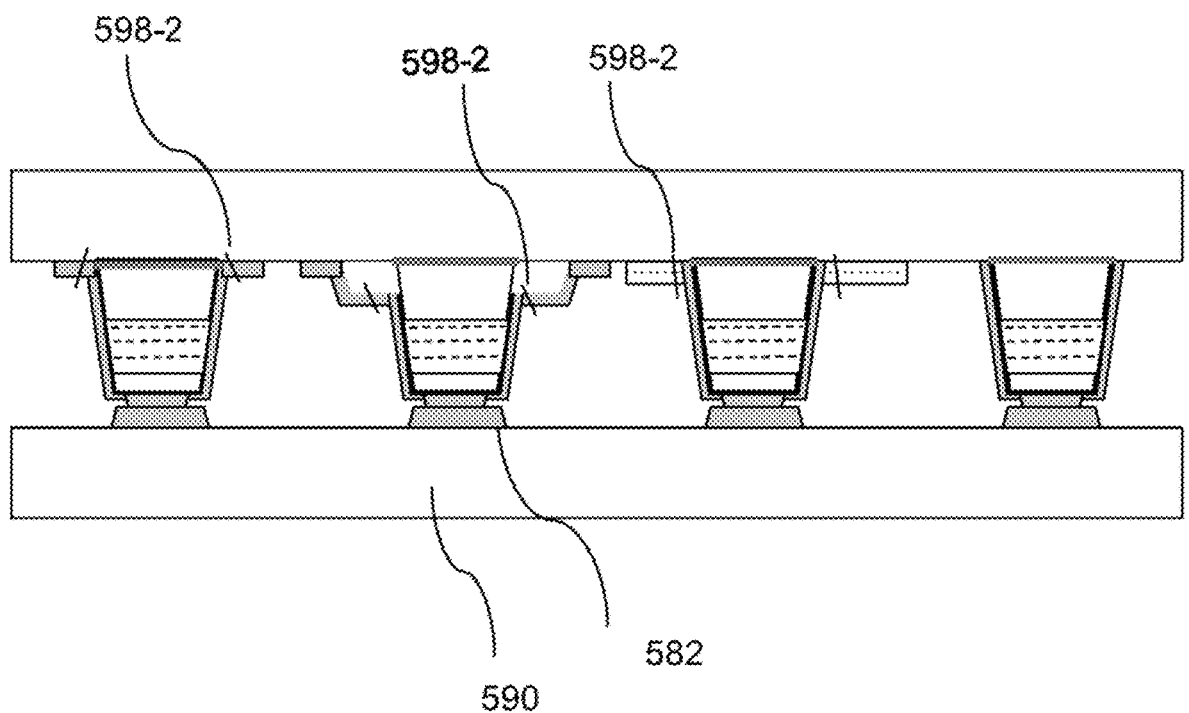
FIG. 5D illustrates a cross-sectional view of transfer step used for transferring the micro devices to another substrate.
Figure 5E:
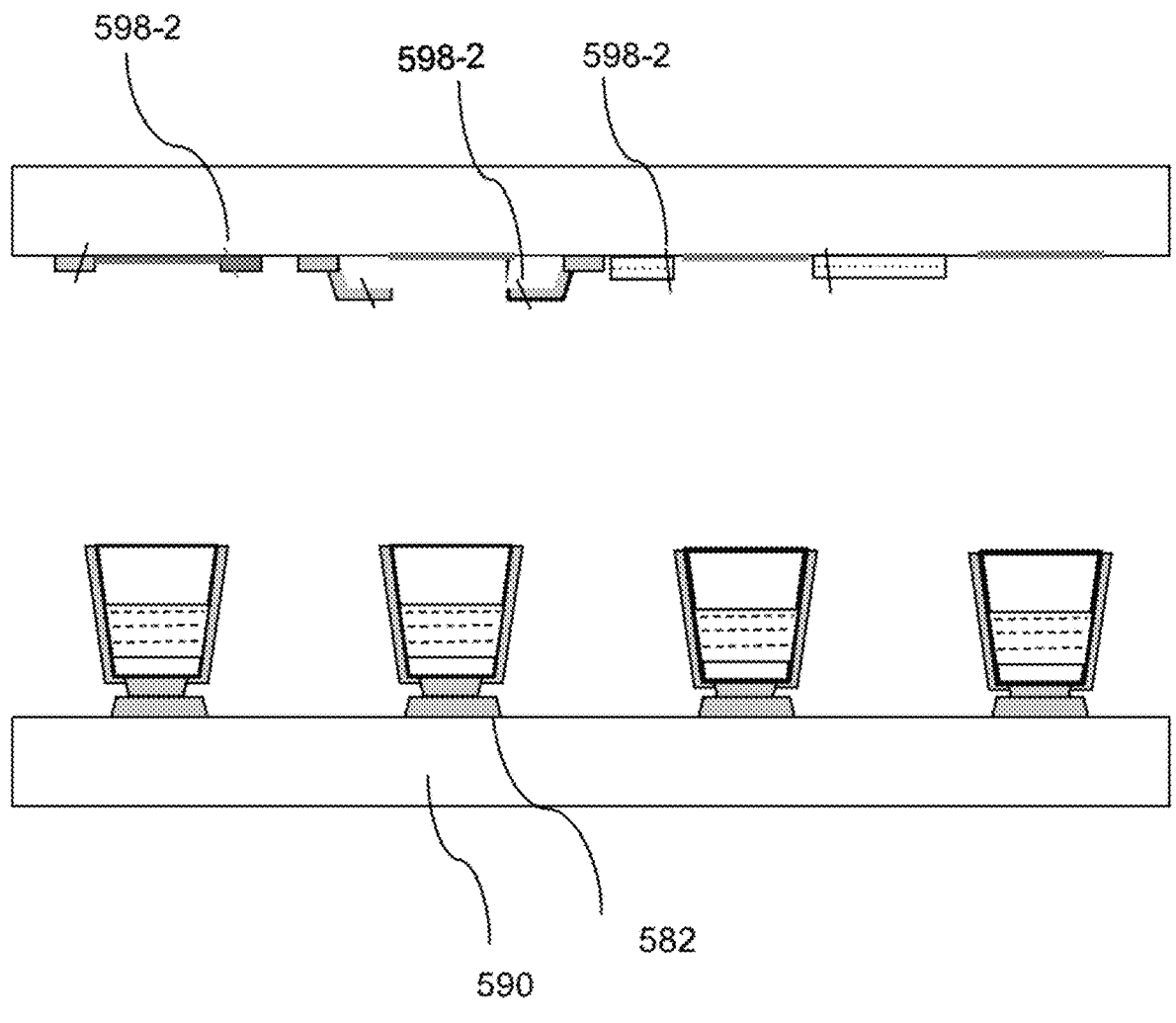
FIG. 5E illustrates a cross-sectional view of transferred micro devices to the substrate.

FIG. 5B illustrates the samples after removing the filler layer 574 and or etching the filler layer to create the anchor 574. In another case, the adhesive force of the bridge layer 598 after liftoff is enough to hold the device in place and act as an anchor. The final device on right side of FIG. 5B; these devices are shown in one substrate 510 for illustration purposes only. One can use either one or combination of them in a substrate. As shown in FIG. 5C, the anchor 574 may be covering at least a portion of or the entire periphery of the device or can be patterned to form arms 594 and 592. Either of the structures may be used for any of the anchor structure. FIG. 5D illustrates one example of transferring the devices to a receiver substrate 590. Here the micro-devices are bonded to the pads 582 or placed in a predefined area without any pads. The pressure force or separation force may release the anchor by breaking them. In another case, temperature may also be used to release the anchor. The viscosity of the layer between lift off of the micro device and donor substrate 510 may be increased to act as an anchor by controlling the temperature. FIG. 5E illustrates the devices after being transferred to the receiver substrate 590 and shows the possible release point 598-2 in the anchors. The anchor may also be directly connected to the donor substrate 510 or indirectly through other layers.

The devices on donor substrate 510 may be developed to have two contacts 532 and 480 on the same side facing away from the donor substrate 510. In one case, the devices may be transferred to the receiver substrate 590 directly from the donor substrate 510. Here, the contacts 532 and 480 may be bonded directly to the receiver substrate pads 582. The devices may be tested either in the donor 510 or in the cartridge substrate. In another embodiment, the devices may be transferred to a cartridge substrate first from the donor cartridge 510 prior to transferring to the receiver substrate 590. Here, the contacts 532 will not be directly bonded to the receiver substrate 590, i.e. the receiver substrate 590 does not need to have special pads 582. In this case, conductive layers are deposited and patterned to connect the contacts 532 to proper connection in the receiver substrate 590.

The system or receiver substrate 390, 490 and 590 may comprise micro light emitting diodes (LEDs), Organic LEDs, sensors, solid state devices, integrated circuits, (micro-electro-mechanical systems) MEMS, and/or other electronic components. Other embodiments are related to patterning and placing of micro devices in respect to the pixel arrays to optimize the micro-device utilizations in selective transfer process. The system or receiving substrate 390, 490 and 590 may be, but is not limited to, a printed circuit board (PCB), thin film transistor backplane, integrated circuit substrate, or, in one case of optical micro devices such as LEDs, a component of a display, for example a driving circuitry backplane. The patterning of micro device donor substrate and receiver substrate can be used in combination with different transfer technology including but not limited to pick and place with different mechanisms (e.g. electrostatic transfer head, elastomer transfer head), or direct transfer mechanism such as dual function pads and more.

Figure 6A:
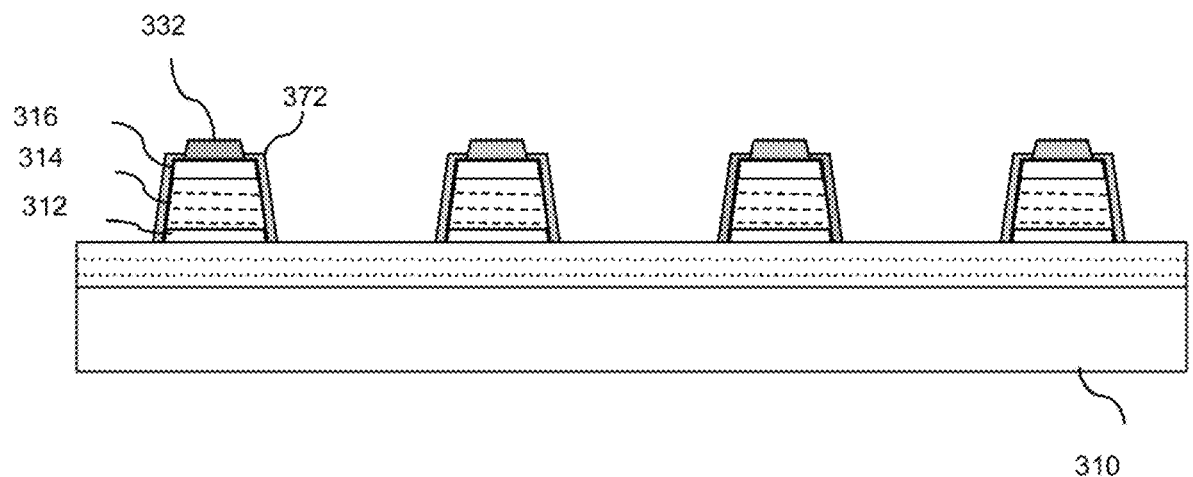
FIG. 6A illustrates a cross-sectional view of a mesa structure on a device (donor) substrate in accordance with another embodiment.
Figure 6B:
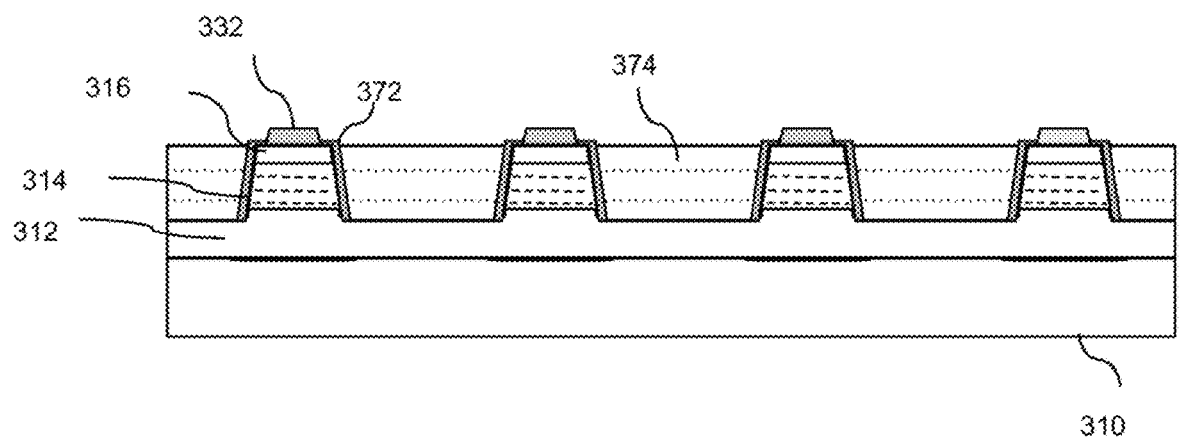
FIG. 6B illustrates a cross-sectional view of the step of filling the empty space between the mesa structures of FIG. 3A.
Figure 6C:
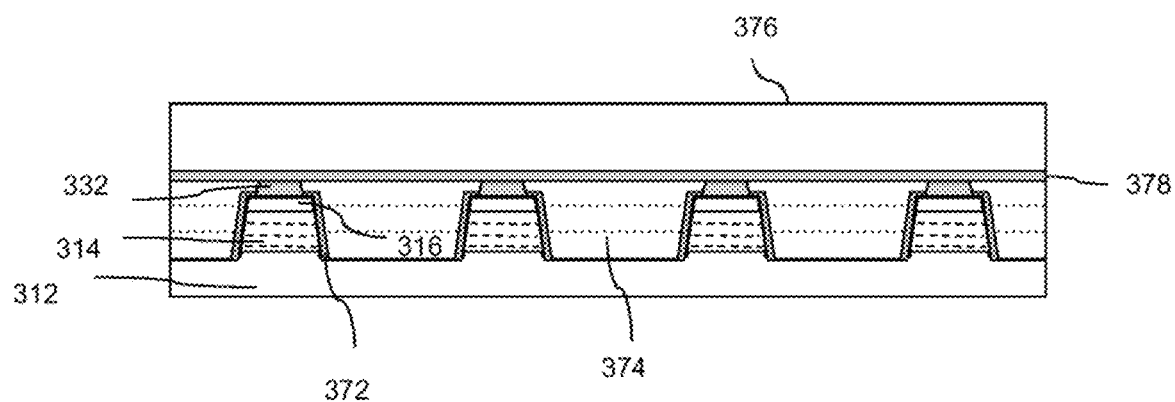
FIG. 6C illustrates a cross-sectional view of the step of transferring the devices (mesa structure) of FIG. 6B to a temporary substrate.
Figure 6D:
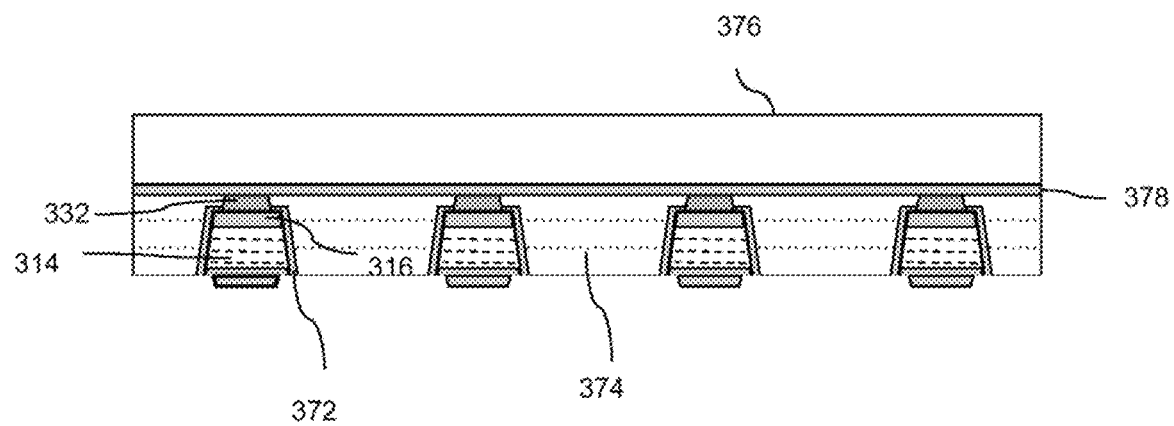
FIG. 6D illustrates a cross-sectional view of the step of removing the portions of the bottom conductive layer of FIG. 6C.
Figure 6E:
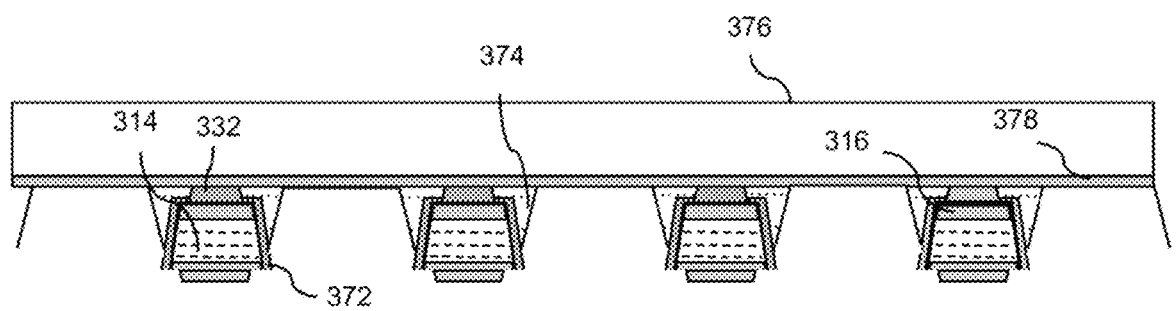
FIG. 6E illustrates a cross-sectional view of embodiments of micro devices with anchors in a filling layer.
Figure 6F:
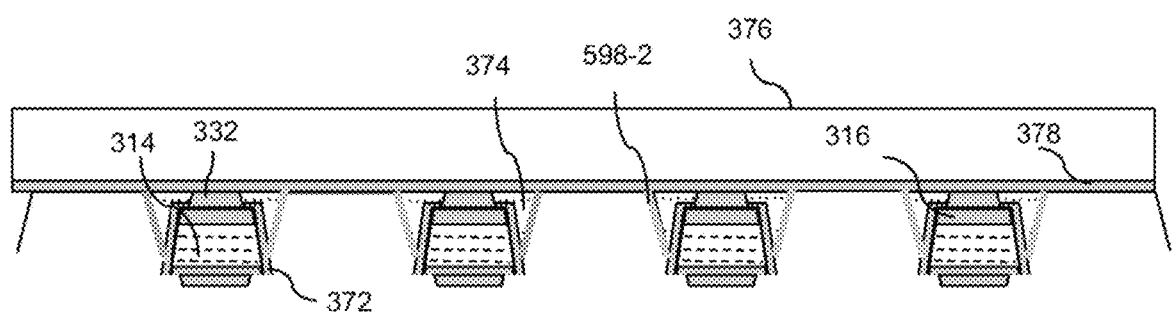
FIG. 6F illustrates a cross-sectional view of embodiments of micro devices with anchors in a filling layer.
Figure 6G:
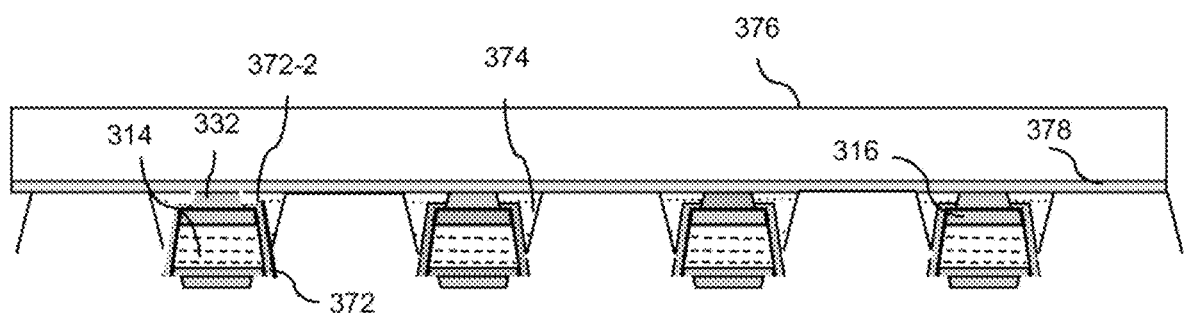
FIG. 6G illustrates a cross-sectional view of embodiments of micro devices with anchors in a filling layer.

FIG. 6A illustrates an alternative embodiment of the mesa structure of FIGS. 3A to 3G, in which the mesa structure is not etched through all of the layers initially. Here, the buffer layers 312 and/or some portion of the contact layer 312 may remain during the initial steps. The mesa structure is developed on the donor substrate 310. Micro-device structures are formed by etching through different layers, e.g. a first bottom conductive layer 312, functional layers 314, and the second top conductive layer 316. A top contact 332 may be deposited before or after the etching on top of the top conductive layer 316 The mesa structure can include other layers 372 that will be deposited and patterned before forming or after forming the mesa structure. These layers may be dielectric, MIS layer, contact, sacrificial layer and more. After the mesa structure development, a filler layer (s), e.g. dielectric material, 374 is used in between and around the micro devices to secure the micro devices together. The micro devices are bonded to a temporary substrate 376 by a substrate bonding layer(s) 378. Bonding layer(s) 378 may provide one or more of different forces, such as electrostatic, chemical, physical, thermal or so on. After the devices are removed from the donor substrate 310, as hereinbefore described, the extra portion of the bottom conductive layers 312 may be etched away or patterned to separate the devices (FIG. 6C). Other layers may be deposited and patterned, such as the contact bonding layer 380. Here, one can etch the filler layer 374 to separate the micro devices or remove the sacrificial layer to separate the devices. In another embodiment, temperature may be applied to separate the devices from the filler layer 374 and make them ready to be transferred to the receiver substrate 390. The separation may be done selectively, as hereinbefore described. In another embodiment, the filler layer 374 may be etched to form a housing, base or anchor 375, at least partially surrounding each micro device, e.g. in a frustum or frusto-pyramidal shape, as shown in FIG. 6E. Another layer may be deposited over the base 375 and used to make anchors 598-2. The filler base layer 375 may be left or be removed from the anchor setup after forming the extra layers 598-2. FIG. 6G shows a device with a sacrificial layer 372-2. The sacrificial layer 372-2 may be either removed by etching or can be thermally deformed or removed.

In another embodiment, the anchor is the same as housing 375 and is built by polymer, organic or other layers after the micro devices are transferred to the cartridge 376. The housing 375 may have different shapes. In one case the housing may match the device shape. The housing side walls may be shorter than the micro device height. The housing side wall may be connected to the micro device prior to the transfer cycle to provide support for different post processing of micro devices in the cartridge 376 and packaging of the microdevice cartridges for shipment and storage. The housing side walls may be separated or the connection to the microdevice may be weakened from the device prior or during the transfer cycle by different means. such as heating, etching, or light exposure.

The devices on the donor substrate 310 may be developed to have two contacts 332 and 380 on the same side facing away from the donor substrate 310. In this case, the conductive layer on the cartridge 376 may be patterned to bias the two contacts 332 and 380 of the device independently. In one case, the devices may be transferred to the receiver substrate 390 directly from the cartridge substrate 376. Here, the contacts 332 and 380 will not be directly bonded to the receiver substrate 390, i.e. the receiver substrate 390 does not need to have special pads. In this case, conductive layers are deposited and patterned to connect the contacts 332 and 380 to proper connection in the receiver substrate 390. In another embodiment, the devices may be transferred to a temporary substrate first from the cartridge 376 prior to transferring to the receiver substrate 390. Accordingly, the contacts 332 and 380 may be bonded directly to the receiver substrate pads. The devices can be tested either in the cartridge 376 or in the temporary substrate.

Figure 6H:
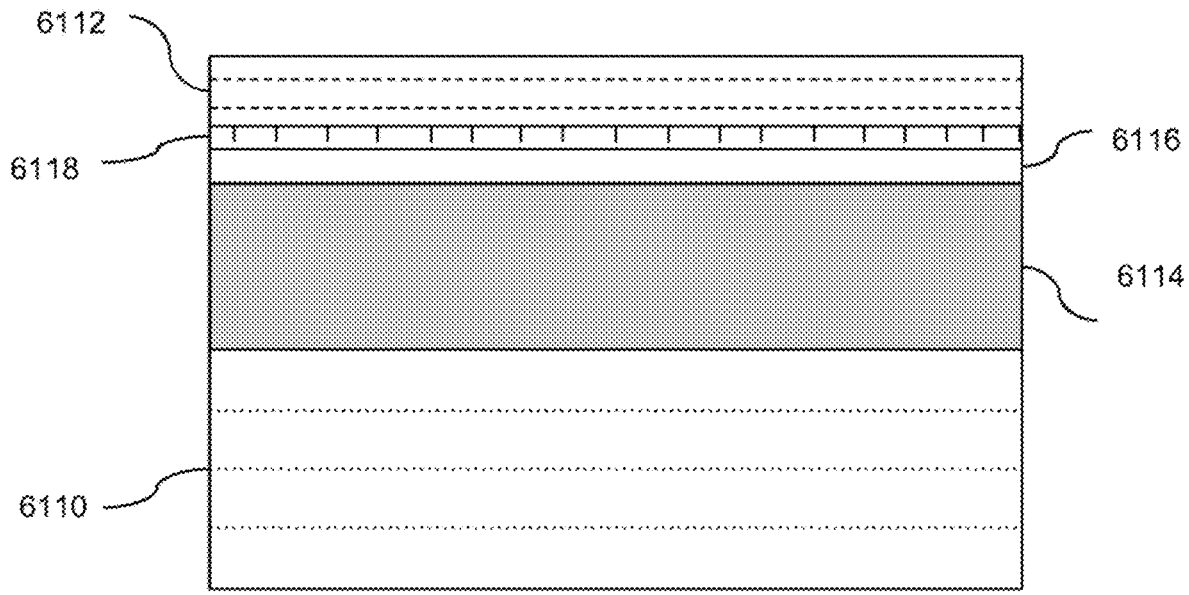
FIG. 6H illustrates a cross-sectional view of a preliminary step in another embodiment of the present invention.

Due to a mismatch between the substrate crystal lattice and the micro device layers, the growth of the layers contains several defects, such as dislocation, void, and others. To reduce the defects, at least one first and/or second buffer layer 6114 and 6118 with a separation layer 6116 therebetween or adjacent to may be deposited first on a donor substrate 6110, and the active layers 6112 are subsequently deposited over the buffer layers 6114 and/or 6118. The thickness of the buffer layers 6114 and 6118 may be substantial, e.g. a thick as the donor substrate 6110. During the separation (lift off) of the microdevice from the donor substrate 6110, the buffer layer 6114/6118 may also separated. Therefore, the buffer layer deposition should be repeated every time. FIG. 6H illustrates a structure on the substrate 6110 in which there the separation layer 6116 is between the first buffer layer 6114 and the actual device layers 6112. There may be a second buffer layer 6118 between the separation layer 6116 and the device layers 6112. The second buffer layer 6118 may also block the contamination from the separation layer 6116 to penetrate to the device layers 6112. Both buffer layers, 6114 and 6118 may comprise more than one layer. The separation layer 6116 may also comprise a stack of different materials. In one example, the separation layer 6116 reacts to a wavelength of light that other layers are not responding to. This light source may be used to separate the actual device 6112 from the buffer layer(s) 6114/6118 and the donor substrate 6110. In another example, the separation layer 6116 reacts to chemicals while the same chemical does not affect other layers. This chemical can be used to remove or change the property of the separation layer 6116 to separate the device from the buffer layer(s) 6114/6118 and the substrate 6110. This method leaves the first buffer layer 6114 intact on the donor substrate 6110 and therefore it can be reused for the next device development. Before the next device deposition, some surface treatment, such as cleaning or buffering, may be done. In another example the buffer layer(s) 6114/6118 may comprise zinc-oxide.

Figure 6I:
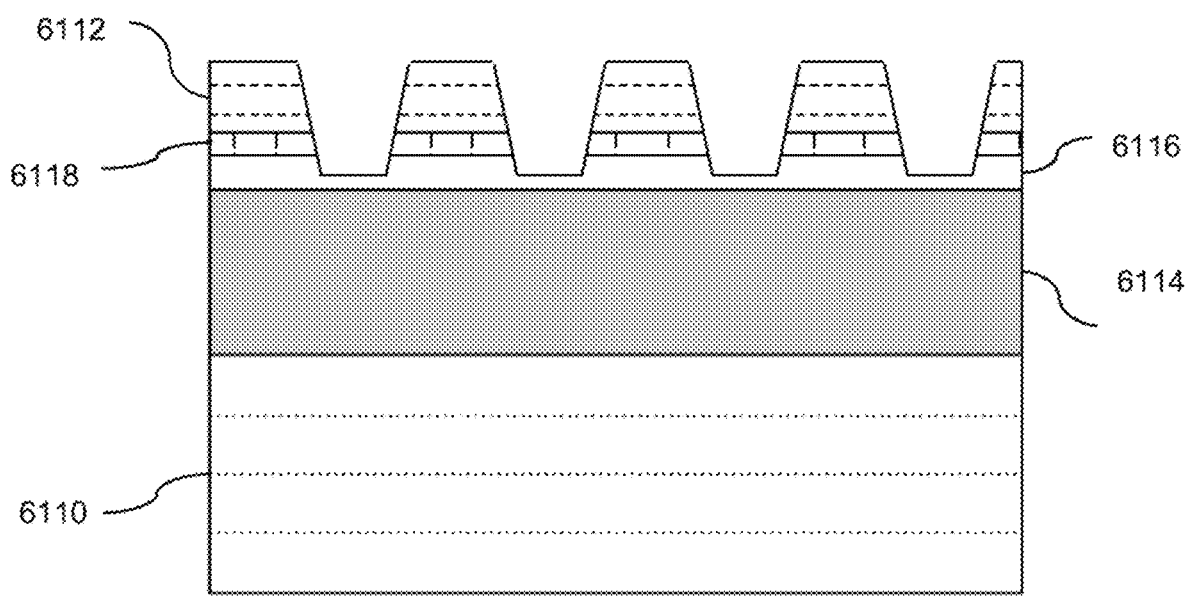
FIG. 6I illustrates a cross-sectional view of an etching step in the embodiment of FIG. 6H.
Figure 6J:
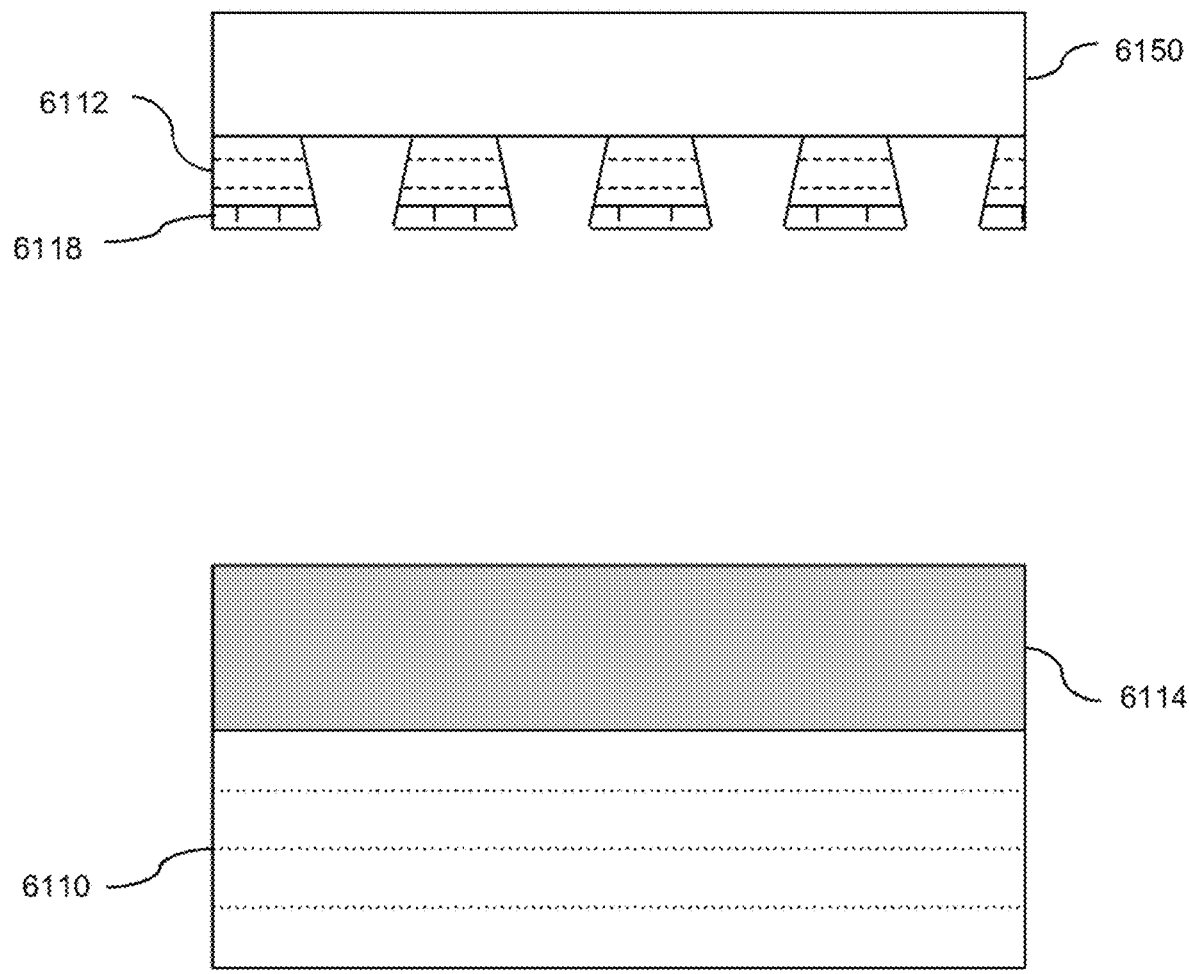
FIG. 6J illustrates a cross-sectional view of a separation step in the embodiment of FIG. 6H.

The microdevices may be separated by different etching processes, as demonstrated in FIG. 6I, prior to the separation process (lift off). The etching may etch the second buffer layer (if existing) 6118 and also part or all of the separation layer 6116, as well as the device layers 6112. In another example, either the second buffer layer 6118 or the separation layer 6116 are not etched. After the etching step, the microdevices are temporarily (or permanently) bonded to another substrate 6150 and the separation layer 6116 is removed or modified to separate the microdevices from the first and second buffer layer(s) 6114/6118. As demonstrated in FIG. 6J, the first buffer layer 6114 may stay substantially intact on the donor substrate 6110.

Figure 6K:
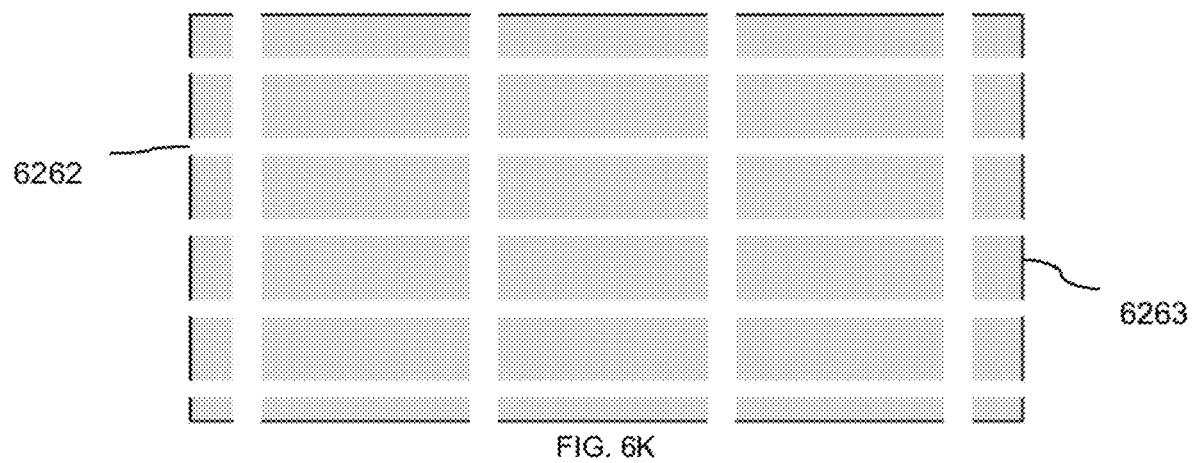
FIG. 6K illustrates a top view of another embodiment of the present invention.
Figure 6L:
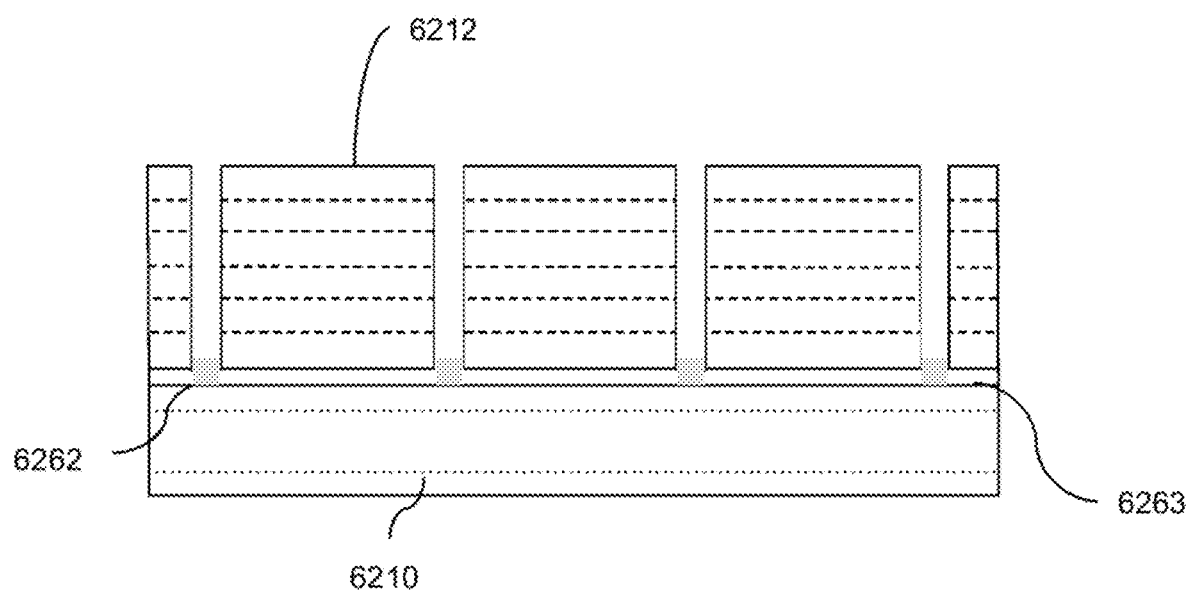
FIG. 6L illustrates a cross-sectional view of the embodiment of FIG. 6K.
Figure 6M:
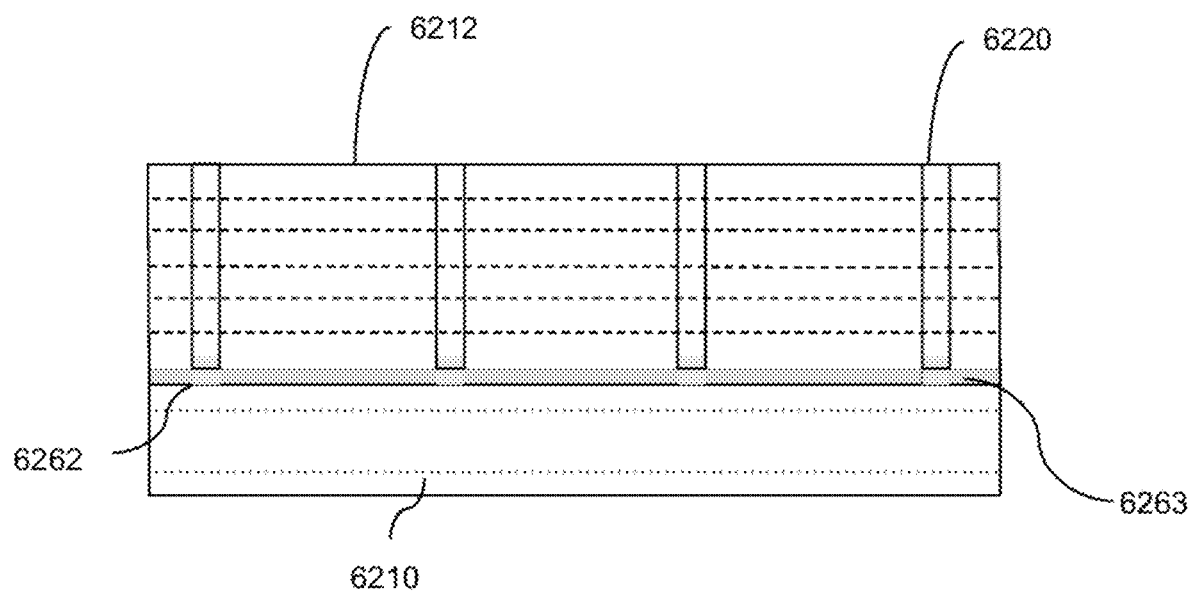
FIG. 6M illustrates a cross-sectional view of the embodiment of FIGS. 6K and 6L with filler material.

In another embodiment illustrated in FIGS. 6K-6M, the layers, e.g. the first bottom conductive layer 312, the functional layers 314, and the second top conductive layer 316, may be formed on the donor substrate 6210 as islands 6212. FIG. 6K illustrates a top view of the islands 6212 formed into an array of micro devices. The islands 6212 may be the same size or a multiple size of the cartridge. The islands 6212 may be formed starting from the buffer layers 6114/6118 or after the buffer layers. Here surface treatment or gaps 6262, 6263 may be formed on the surface to initiate the growth of the films as islands (FIG. 6L). To process the microdevices, the gaps may be filed by filler layers 6220, as if FIG. 6M. The filler 6220 maybe comprised of polymer, metals, or dielectric layers. After processing the microdevices, and the filler layers 6220 may be removed.

Figure 7A:
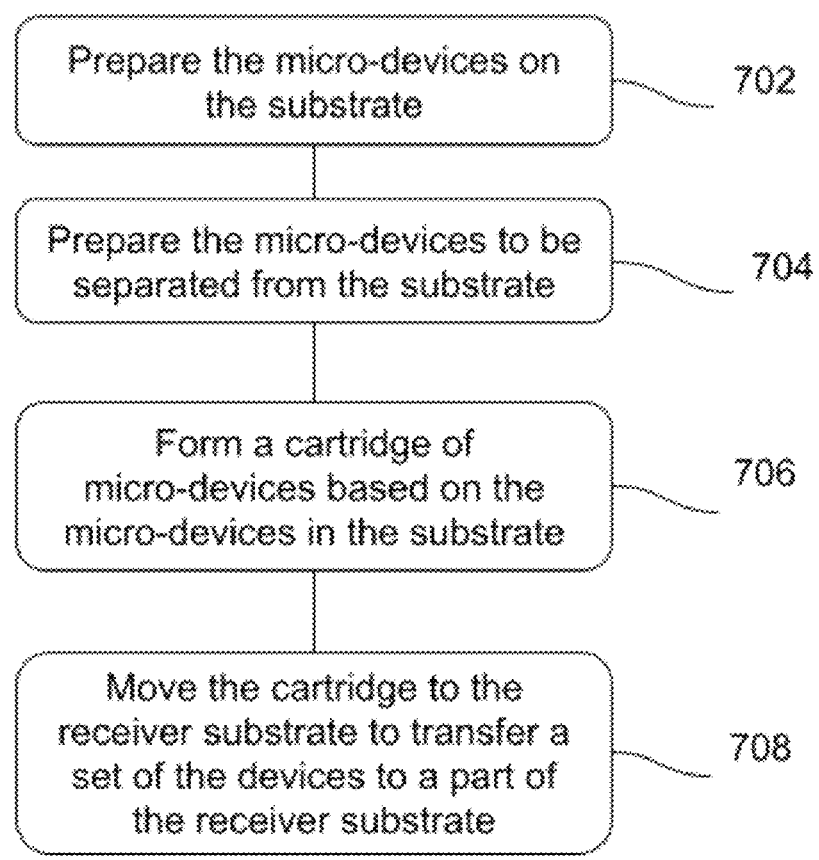
FIGS. 7A-7C shows examples flowcharts of developing micro device cartridge.

FIG. 7A highlights the process of developing microdevice cartridges. During the first step 702, the microdevices are prepared on a donor substrate, e.g. 310 or 510. During this step, the devices are formed and post processing are performed on the devices. During the second step 704, the devices are prepared to be separated from the donor substrate 310 or 510. This step can involve securing the micro-devices by using anchor, e.g. 375, 476-1, 592, 594, 598 and 598-2 or fillers, e.g. 374, 472 and 574. During the third step 706, the cartridge or temporary substrate, e.g. 376 or 476, is formed from the preprocessed micro devices in first and second steps 702, 704. In one case, during this step, the micro devices are bonded to the cartridge substrate 376 or 476 through a bonding layer, e.g. 378 or 478, directly or indirectly. Then the micro devices are separated from the micro device cartridge substrates 376 or 476. In another embodiment, the cartridge is formed on the micro-device donor substrate, e.g. 510. After the devices are secured on the cartridge substrate 376, 476 or 510, other processing steps can be done, such as removing some layers, e.g. 312, 374, 472, 574 adding electrical (e.g. contact 380 or 480) or optical (lens, reflectors, ... ) layers. The cartridge 376 or 476 is moved to the receiver substrate, e.g. 390, 490 or 590, to transfer the devices to the receiver substrate 390, 490 or 590. Some these steps can be rearranged or merged. A testing step 707A may be performed on the micro devices while they are still on the cartridge substrate, e.g. 376 or 476, or after the micro devices have been transferred to the receiver substrate, e.g. 390, 490 or 590, to determine whether the micro devices are defective. Defective micro devices may be removed or fixed in-situ 707B. For example, a set of micro-devices with a predetermined number may be tested, and if the number of defects exceeds a predetermined threshold, then the entire set of micro-devices may be removed, at least some of the defective micro-devices may be removed and/or at least some of the defective micro-devices may be fixed.

Figure 7B:
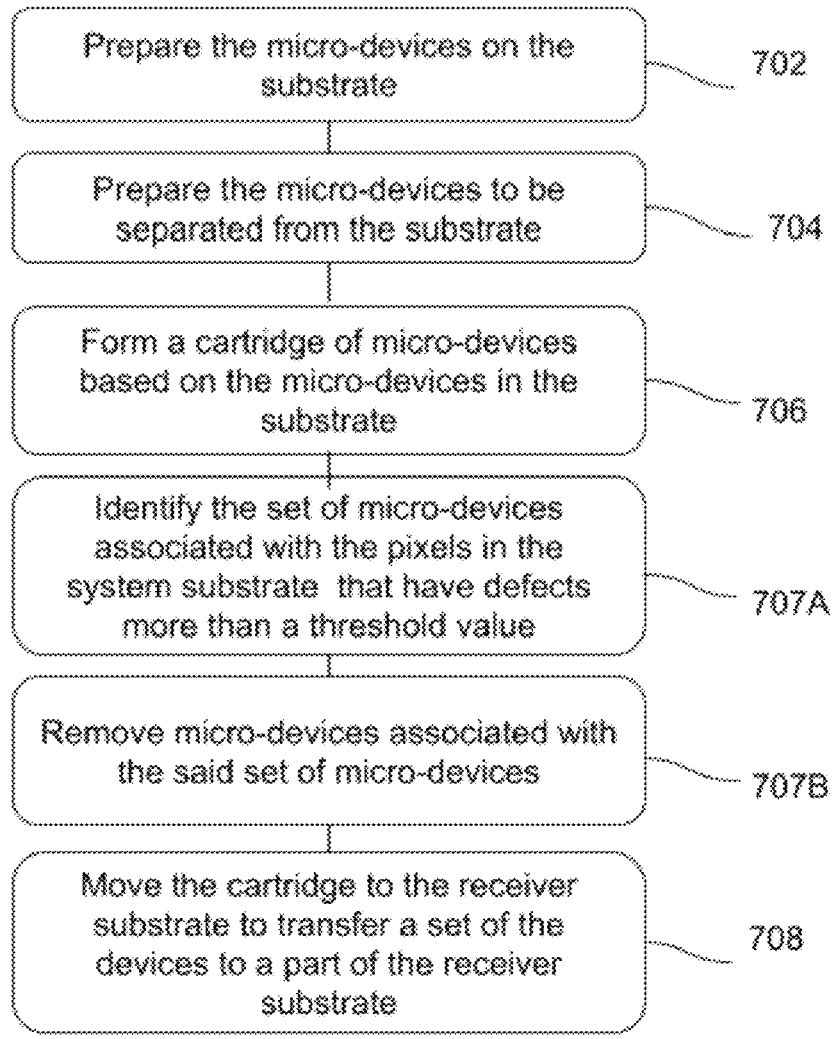

FIG. 7B highlights the process of developing micro-device cartridges. During the first step 702, the micro-devices are prepared on a substrate. During this step, the devices are formed and post processing are performed on the devices. During the second step 704, the devices are prepared to be separated from the substrate. This step can involve securing the micro-devices by using anchor or fillers. During the third step 706, the cartridge is formed from the preprocessed micro devices in first and second steps 702, 704. During the step 707A, the set of microdevices associated with the pixels in the system substrate has been identified that have defects more than a threshold value and remove the micro-devices associated with the said set of micro-devices during the step 707B. In one case, during this step, the micro devices are bonded to the cartridge substrate through a bonding layer directly or indirectly. Then the micro devices are separated from the micro device substrates. In another case, the cartridge is formed on the micro-device substrate. After the devices are secured on the cartridge substrate, other processing steps can be done such as removing some layers, adding electrical (e.g. contact) or optical (lense, reflectors, . . . ) layers. The cartridge is moved to the receiver substrate to transfer the devices to the receiver substrate. Some these steps can be rearranged or merged.

Figure 7C:
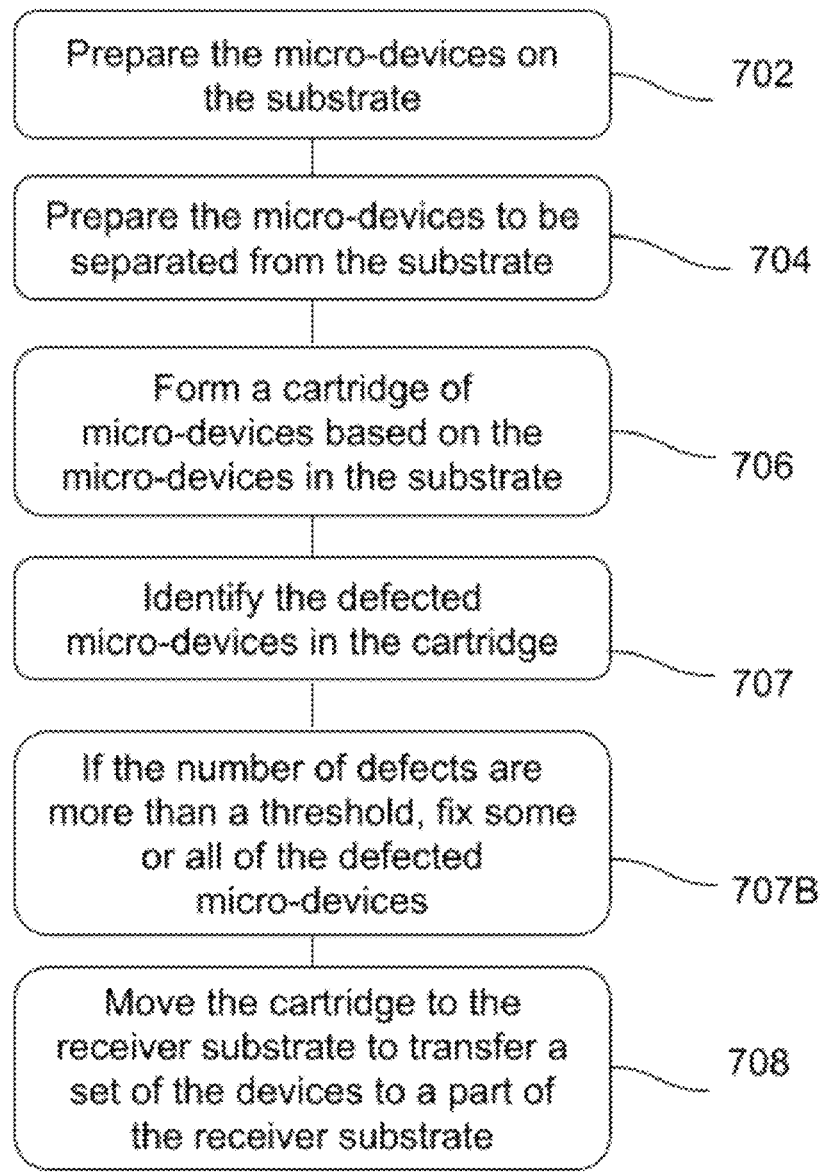

FIG. 7C highlights the process of developing micro-device cartridges. During the first step 702, the micro-devices are prepared on a substrate. During this step, the devices are formed and post processing are performed on the devices. During the second step 704, the devices are prepared to be separated from the substrate. This step can involve securing the micro-devices by using anchor or fillers. During the third step 706, the cartridge is formed from the preprocessed micro devices in first and second steps 702, 704. During the step 707, the defected microdevices have been identified in the cartridge and in case, if the number of defects are more than a threshold, fix some or all of the defected micro-devices during the step 707B. In one case, during this step, the micro devices are bonded to the cartridge substrate through a bonding layer directly or indirectly. Then the micro devices are separated from the micro device substrates. In another case, the cartridge is formed on the micro-device substrate. After the devices are secured on the cartridge substrate, other processing steps can be done such as removing some layers, adding electrical (e.g. contact) or optical (lense, reflectors, . . . ) layers. The cartridge is moved to the receiver substrate to transfer the devices to the receiver substrate. Some these steps can be rearranged or merged.

Figure 8:
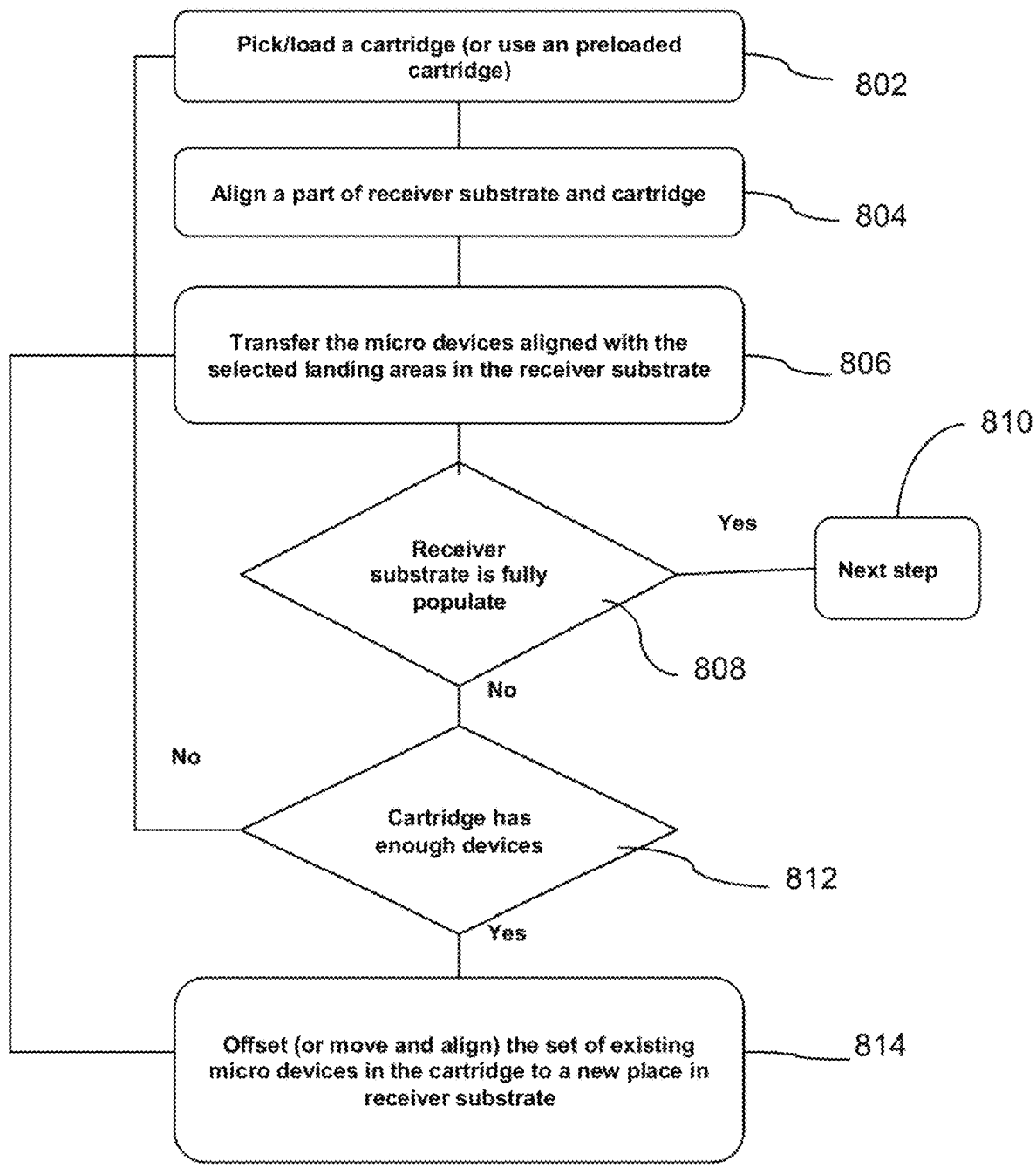
FIG. 8 is a flow chart of the micro device mounting process of the present invention.

FIG. 8 illustrates the steps of transferring the devices from the cartridge 376, 476 or 510, to the receiver substrate 390, 490 or 590. Here, during the first step 802, a cartridge 376, 476 or 510 is loaded (or picked) or in another embodiment, a spare equipment arm is pre-loaded with the cartridge 376, 476 or 510. During the second step 804, the cartridge 376, 476 or 510 is aligned with part (or all of) of the receiver substrate. The alignment can be done through using dedicated alignment mark on cartridge 376, 476 or 510 and the receiver substrate 390, 490 or 590, or using the microdevices and the landing are on the receiver substrate 390, 490 or 590. The micro devices are transferred to the selected landing areas during the third steps. If the receiver substrate 390, 490 or 590 is fully populated, the cartridge substrate 376, 476 or 510 is moved to the next steps, e.g. another receiver substrate 390, 490 or 590. If further population is needed for the current receiver substrate 390, 490 or 590, further transfer steps with one or more additional cartridges 376, 476 or 510 are conducted. Before a new transfer cycle, if the cartridge 376, 476 or 510 does not have enough devices, the cycle start from first step 802. If the cartridge 376, 476 or 510 has enough devices, the cartridge 376, 476 or 510 is offset (or moved and aligned) to a new area of the receiver substrate 390, 490 or 590 in step 814 and new cycle continuous to step 806. Some of these steps can be merged and/or rearranged.

Figure 9A:
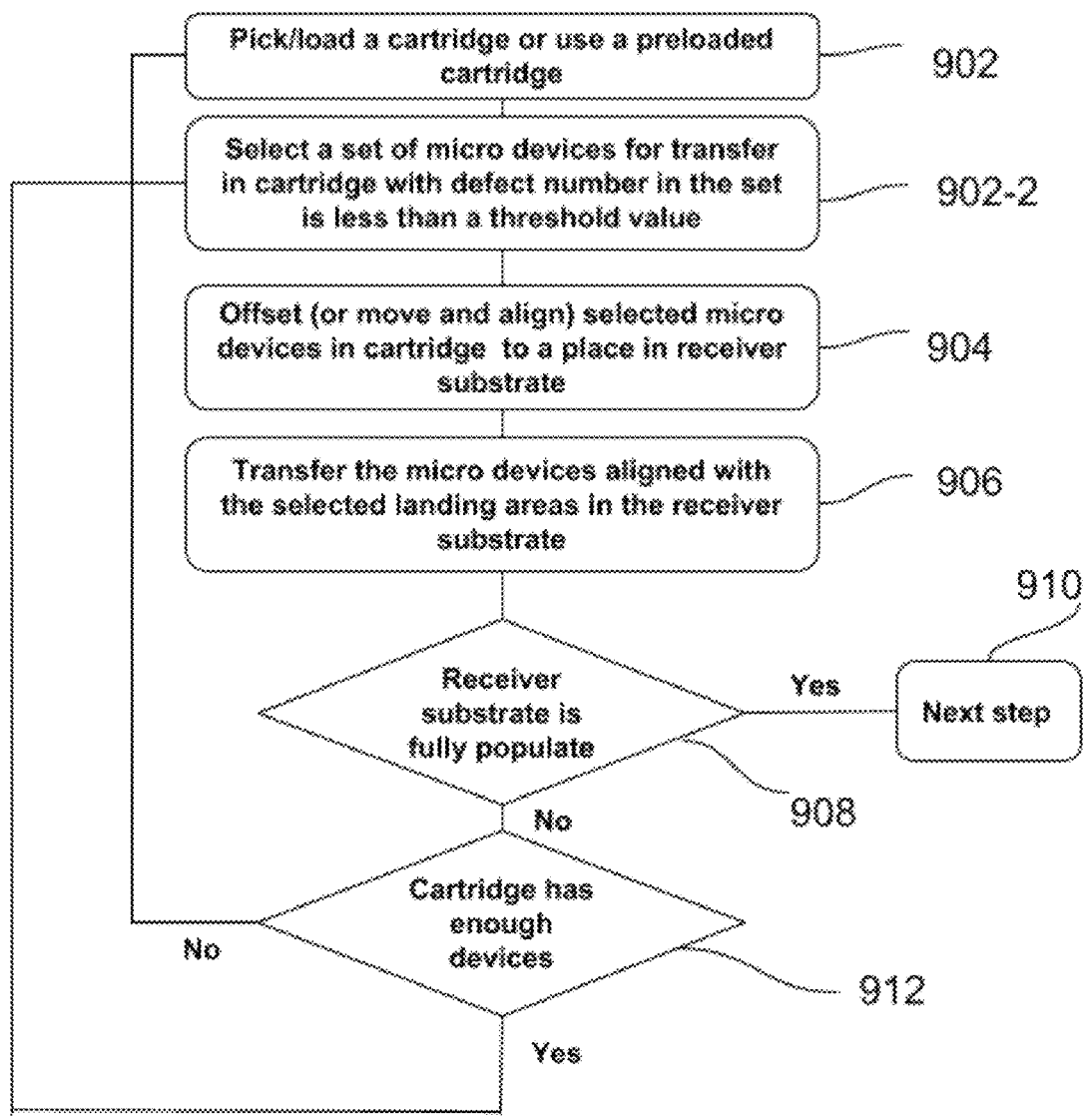
FIGS. 9A-9B shows exemplary flow charts of the micro device mounting process of the present invention.
Figure 9B:
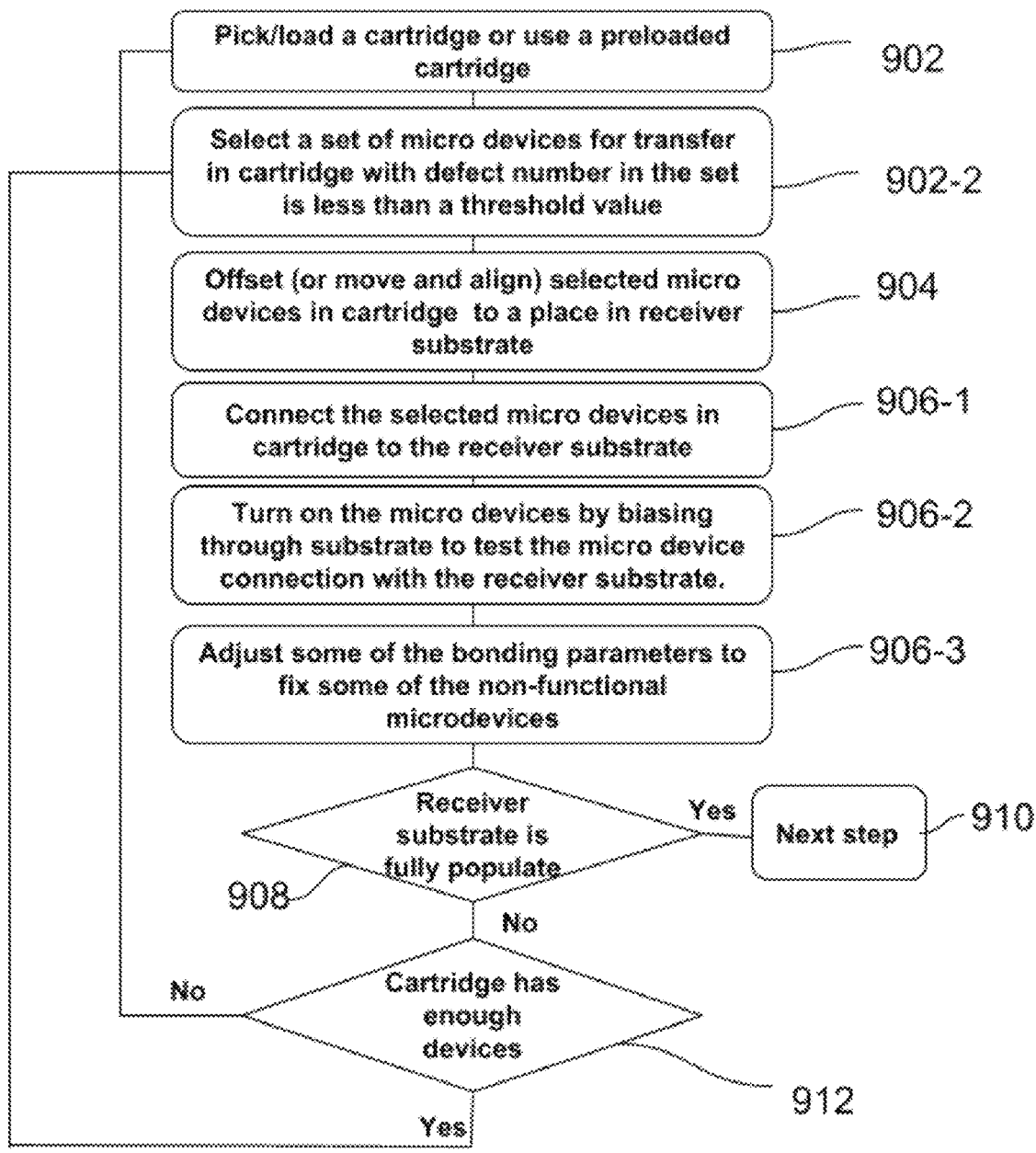

FIG. 9A illustrates the steps of transferring the devices from the cartridge, e.g. temporary substrate 376, 476 or 510, to the receiver substrate, e.g. 390, 490 or 590. Here, during the first step 902, a cartridge 376 or 476 is loaded (or picked) or in another embodiment, a spare equipment arm is pre-loaded with the cartridge. During the second step 902-2, a set of micro-devices is selected in cartridge 376, 476 or 510 that the number of defects in them is less than a threshold. During the third step 904, the cartridge 376, 476 or 510 is aligned with part (or all of) of the receiver substrate. The alignment can be done through using dedicated alignment marks on the cartridge 376, 476 or 510 and/or the receiver substrate 390, 490 or 590, or using the micro devices and the landing are on the receiver substrate 390, 490 or 590. The micro devices may then be transferred to the selected landing areas during the third step 906. In an optional step 906-2, the micro-devices may be turned on, e.g. by biasing through the receiver substrate 390, 40 or 590, to test the micro-device connections with the receiver substrate. If individual micro-devices are found to be defective or non-functional, an additional adjustment step 906-3 may be performed to correct or fix some or all of the non-functioning micro-devices.

If the receiver substrate is fully populated, the receiver substrate 390, 490 or 590 is moved to the next steps. If further population is needed for the receiver substrate 390, 490 or 590, further transfer steps from one or more additional cartridges 376, 476 or 510 are conducted. Before a new transfer cycle, if the cartridge 376, 476 or 510 does not have enough devices, the cycle starts from first step 902. If the cartridge 376, 476 or 510 has enough devices, the cartridge 376, 476 or 510 is offset (or moved and aligned) to a new area of the receiver substrate 390, 490 or 590 in step 902-2.

Figure 10:
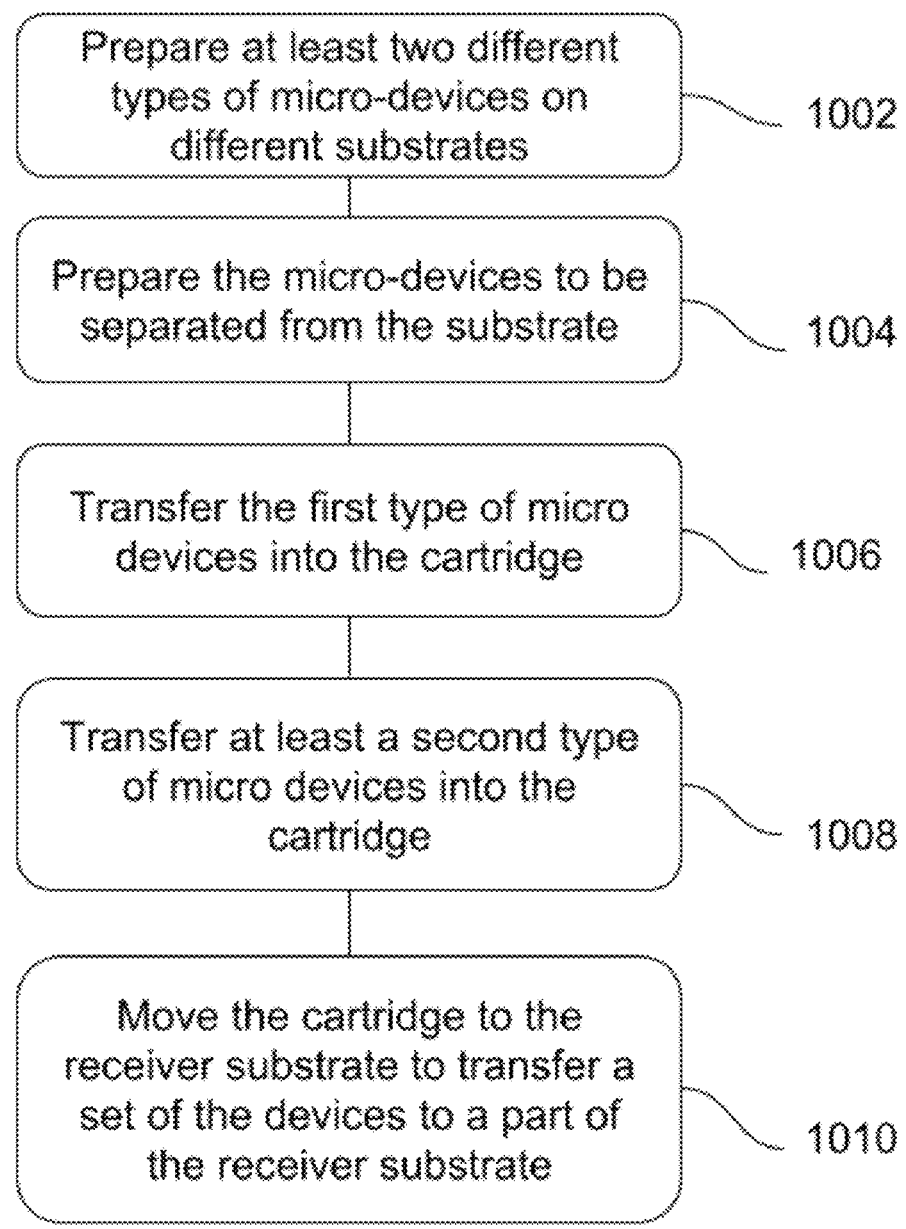
FIG. 10 is a flow chart of the micro device mounting process of the present invention.

FIG. 10 illustrates exemplary processing steps for developing multi-type micro device cartridges 376, 476, 510 or 1108. During the first step 1002, at least two different micro-devices are prepared on a difference donor substrates, e.g. 310 or 510. During this step, the devices are formed and post processing are performed on the devices. During the second step 1004, the devices are prepared to be separated from the donor substrates e.g. 310 or 510. This step can involve securing the micro-devices by using anchor, e.g. 375, 476-1, 592, 594, 598 and 598-2 or fillers, e.g. 374, 472 and 574. During the third step 1006, the first devices are moved to the cartridge 376, 476, 510 or 1108. During the fourth step 1008, at least second micro devices are moved to the cartridge 376, 476, 510 or 1108. In one case, during this step, the micro devices are bonded to the cartridge substrate 376, 476, 510 or 1108 through a bonding layer, e.g. 378 or 478, directly or indirectly. Then the micro devices are separated from the micro device donor substrates 310 or 510. In case of direct transfer, the different type of micro device can have different height to assist the direct transfer. For example, the second type of micro device that being transferred to the cartridge 376, 476, 510 or 1108 can be slightly taller than the first one (or the location on the cartridge 376, 476, 510 or 1108 can be slightly higher for the second micro device types). Here, after the cartridge 376, 476, 510 or 1108 is fully populated, the micro device height can be adjusted to make the surface of the cartridge 376, 476, 510 or 1108 planar. This can be done either by adding materials to the shorter micro devices or by removing material from taller micro devices. In another case, the landing area on the receiver substrate 390, 490 or 590 can have different height associated with the difference in the cartridge 376, 476, 510 or 1108. Another method of populating the cartridge 376, 476, 510 or 1108 is based on pick and place. The microdevices can be moved to the cartridge 376, 476, 510 or 1108 by means of pick-and-place process. Here, the force element on the pick-and-place head can be unified for the micro devices in one cluster in the cartridge 376, 476, 510 or 1108 or it can be single for each micro devices. Also, they can be moved to the cartridge 376, 476, 510 or 1108 with other means. In another embodiment, the extra devices are moved away from the cartridge substrate 376, 476, 510 or 1108, of the first or second (third or other) micro devices, and the other types of the micro devices are transferred into the empty areas on the cartridge 376, 476, 510 or 1108. After the devices are secured on the cartridge substrate 376, 476, 510 or 1108, other processing steps can be done such as adding filler layer 374, 474 or 574, removing some layers, adding electrical (e.g. contact 380, 480 or 580) or optical (lense, reflectors, . . . ) layers. The devices can be tested after each before being used to populate the receiver substrate 390, 490 or 590. The test can be electrical or optical or combination of two. The test can identify defects and/or performance of the devices on the cartridge. The cartridge 376, 476, 510 or 1108 is moved to the receiver substrate 390, 490 or 590 during the last step 1010 to transfer the devices to the receiver substrate 390, 490 or 590. Some these steps can be rearranged or merged.

The transferring processes described here (e.g. FIGS. 7, 8, 9, and 10) may include a stretching step to increase the pitch of the micro devices on the cartridge 376, 476, 510 or 1108. This step may be done prior to alignment or part of the alignment step. This step can increase the number of micro devices aligned with the landing area (or pad) on the receiver substrate 390, 490 or 590. Moreover, it can match the pitch between the array of micro devices on the cartridge 376, 476, 510 or 1108 that comprises of at least two micro devices to matches the pitch of landing area (or pads 382) on the receiver substrate 390, 490 or 590.

Figure 11A:
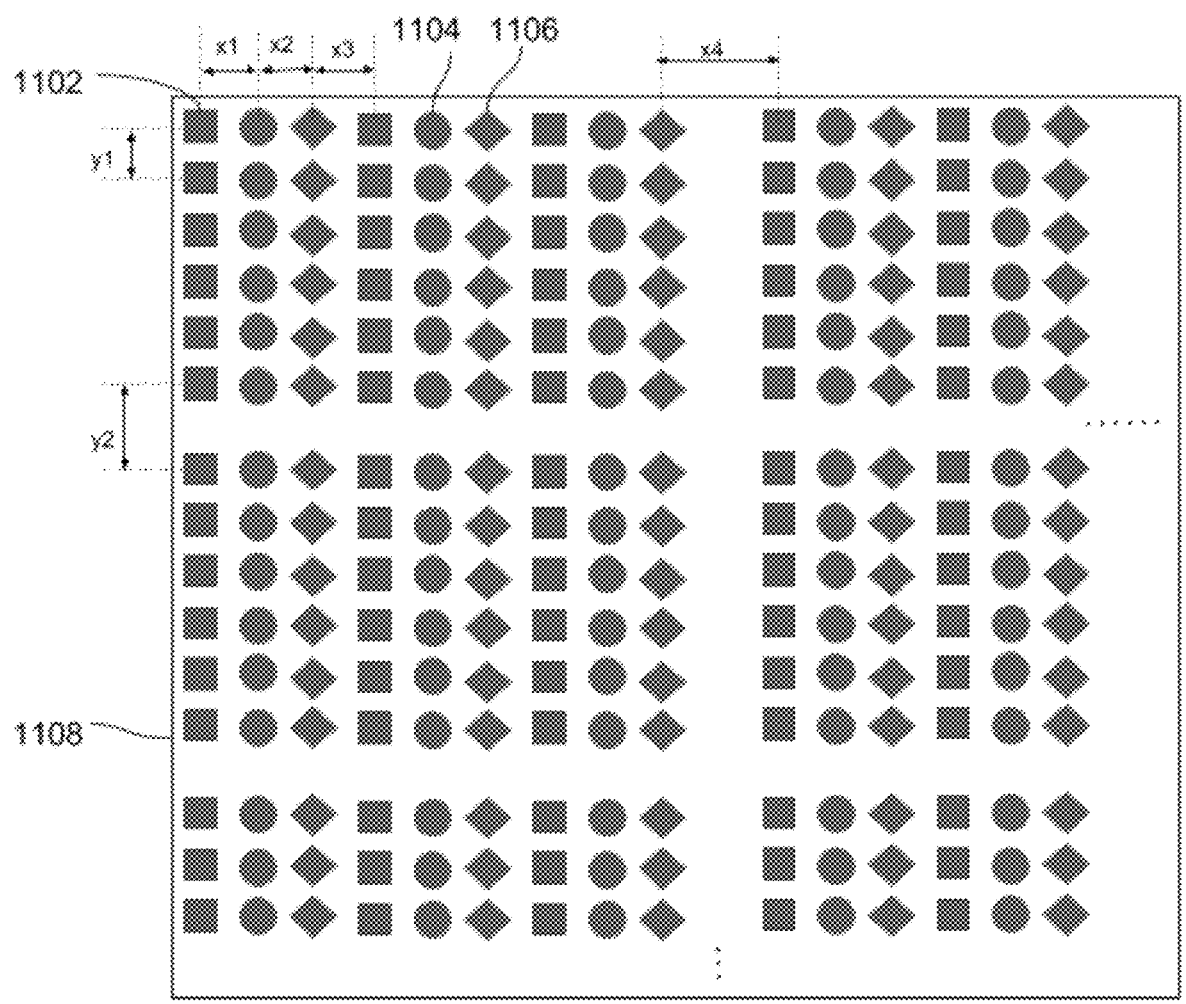
FIGS. 11A-11B illustrates examples of a donor or temporary (cartridge) substrate with different types of pixelated micro devices.
Figure 11B:
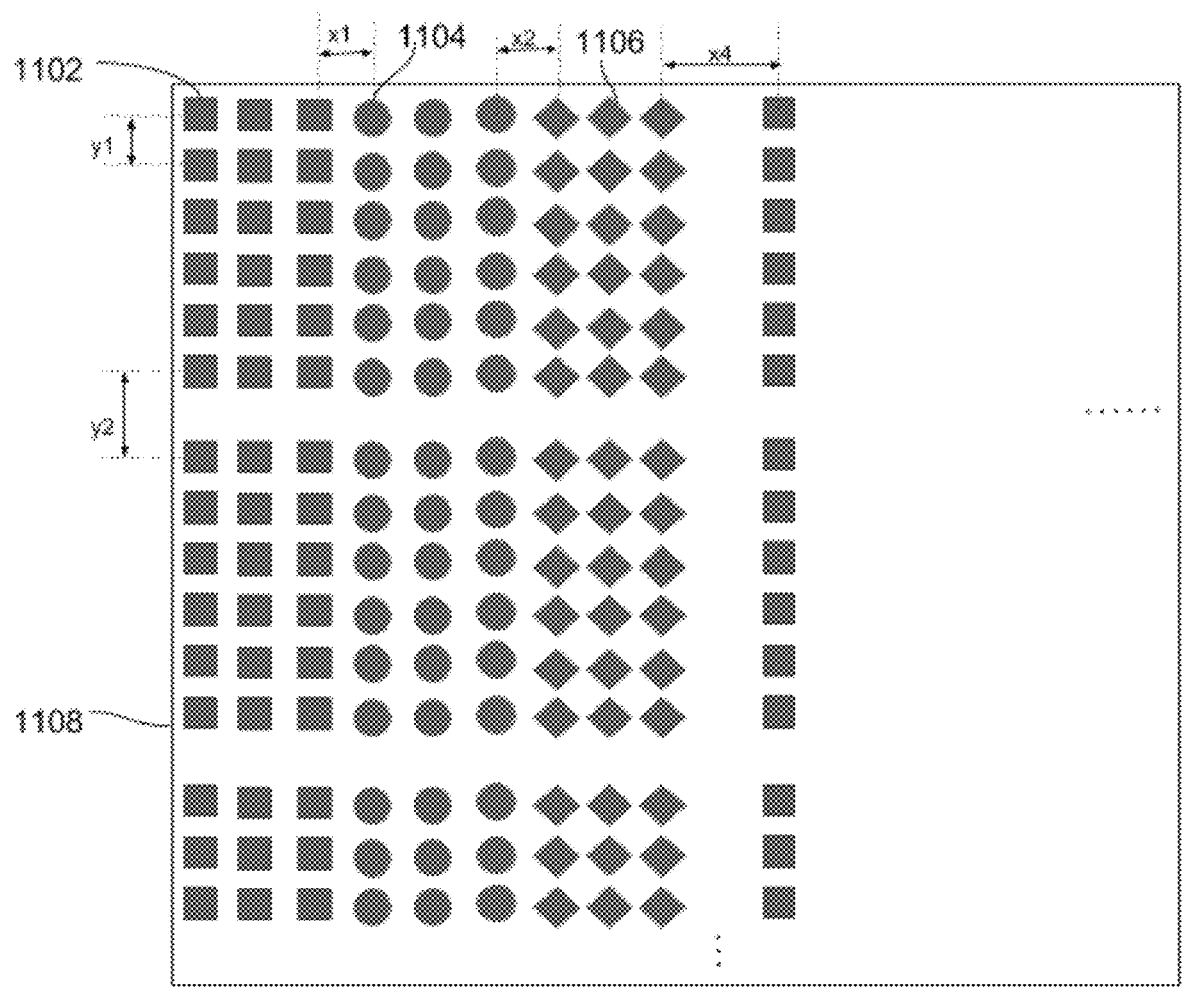

FIGS. 11A-11B illustrates examples of multi-type micro-device cartridge 1108, similar to temporary substrates 376, 376 or 510. In FIG. 11A, the cartridge 1108 includes three different types, e.g. colors (red, green and blue), of micro devices 1102, 1104, 1106. Although there may have more device types. The distance between micro devices x1, x2, x3, y1 are related to the pitch of the landing areas in the receiver substrate 390, 490 or 590. After a few devices, which can be related to the pixel pitch in the receiver substrate 390, 490 or 590, there may be a different pitch x4, y2. This pitch is to compensate for a mismatch between the pixel pitch and the micro device pitch (landing area pitch). In this case, if pick and place is used for developing the cartridge 1108, the force elements can be in the form of columns corresponding to the column of each micro device types or it can be separate element for each micro device. In FIG. 11B, the cartridge 1108 includes three different types, e.g. colors (red, green and blue), of micro devices 1102, 1104, 1106. A plurality of micro devices 1102, 1104, 1106 of each color can be arranged in the cartridge. A few micro devices can be arranged between the three different colors of micro devices 1102, 1104, 1106. The distance between micro devices x1, x2, x3, y1 are related to the pitch of the landing areas in the receiver substrate 390, 490 or 590. These different arrangements of pixelated micro devices on the donor or temporary (cartridge) substrate can be used.

Figure 12A:
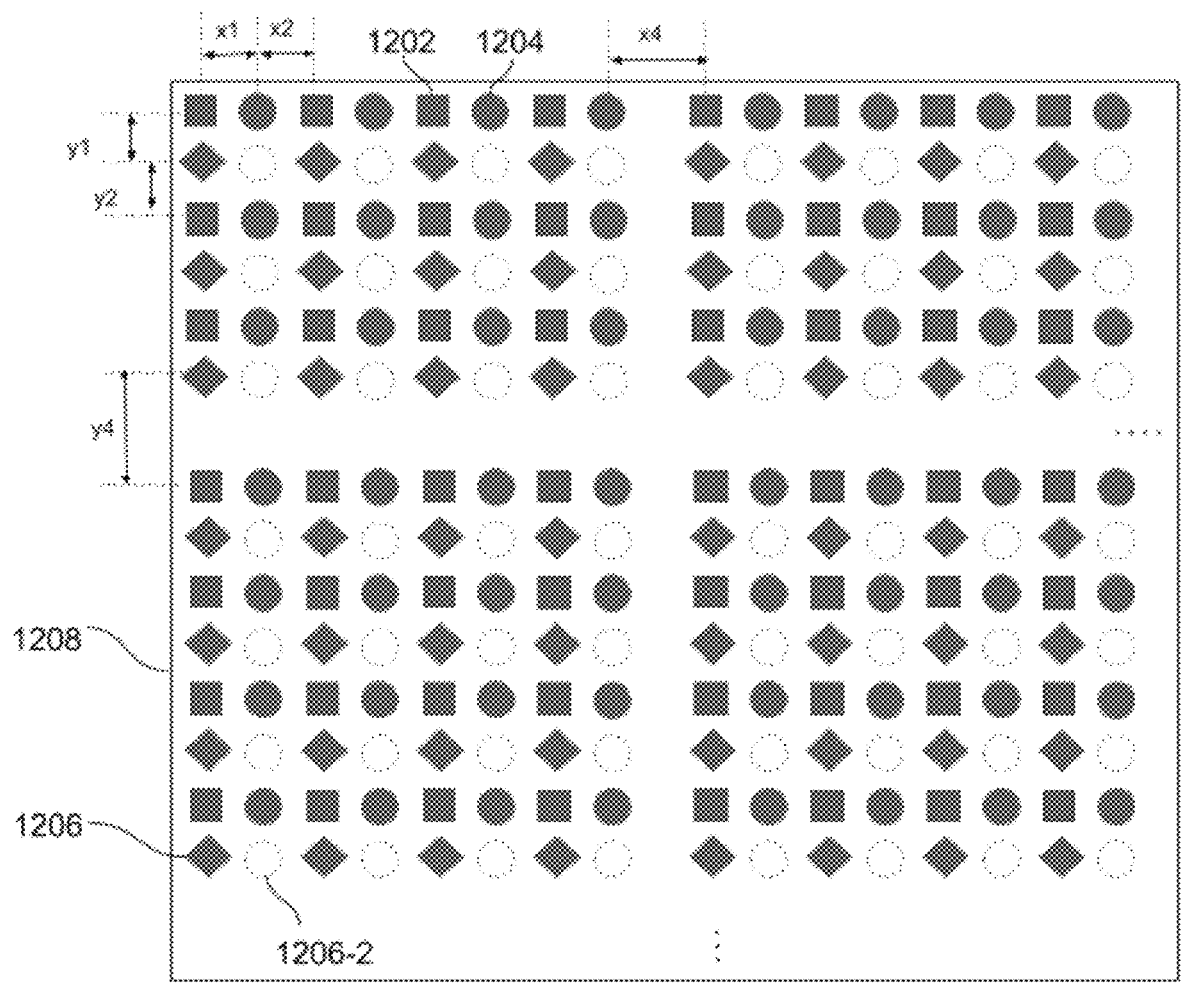
FIG. 12A-12B illustrates examples of a donor or temporary (cartridge) substrate with different types of pixelated micro devices.
Figure 12B:
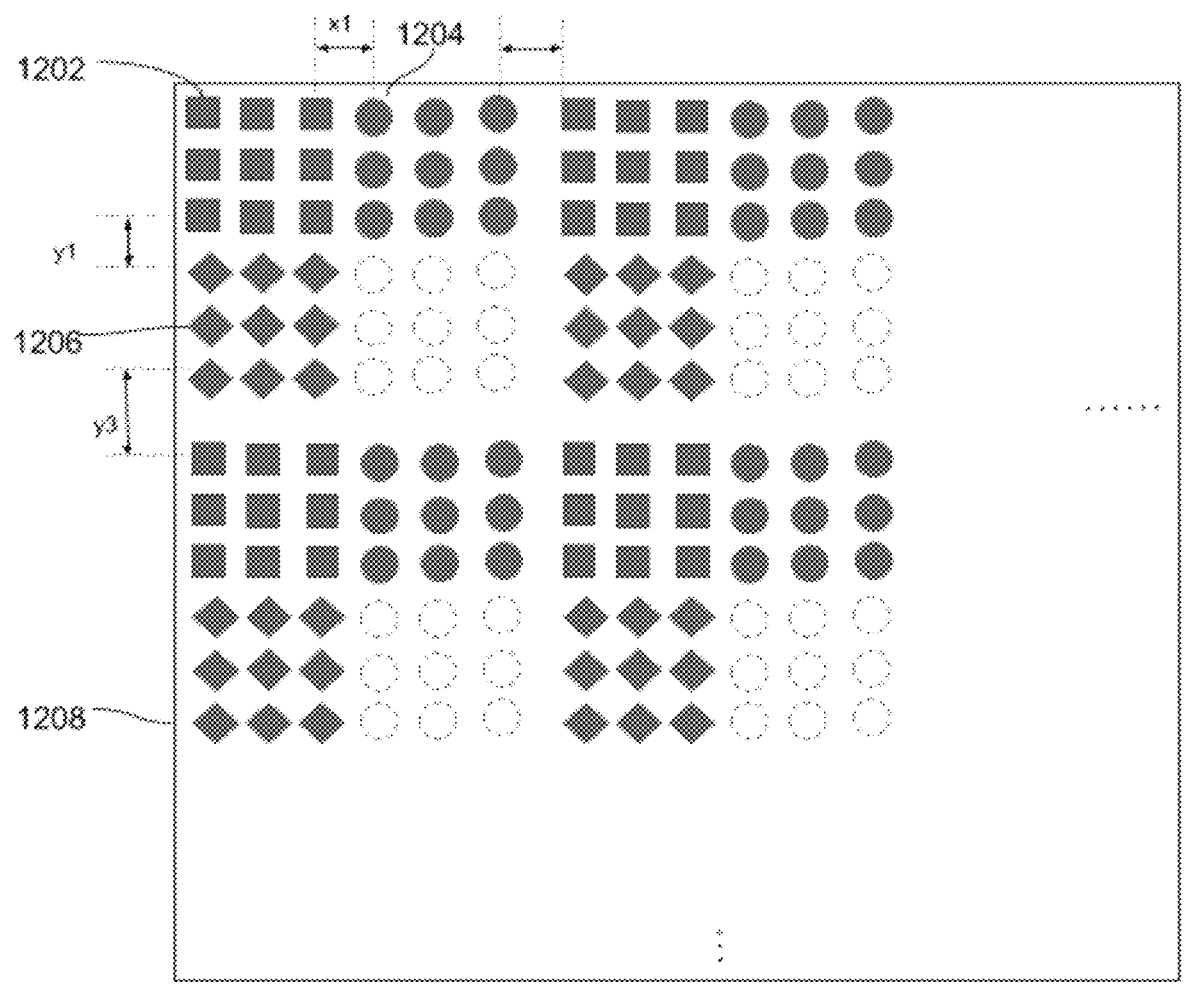

FIGS. 12A-12B illustrates examples of a multi-type micro-device cartridge 1208, similar to temporary substrates 376, 476 or 510. In FIG. 12A, the cartridge 1208 includes three different types, e.g. colors (red, green and blue), of micro devices 1202, 1204, 1206. The other area 1206-2 may be empty, populated with spare micro devices or include a fourth different type of micro device. The distance between micro devices x1, x2, y1 and y2 are related to the pitch of the landing areas in the receiver substrate 390, 490 or 590. After a few arrays of devices, which may be related to the pixel pitch in the receiver substrate 390, 490 or 590, there may be a different pitch x4, y4. This pitch is to compensate for a mismatch between the pixel pitch and the micro device pitch (landing area pitch). In FIG. 12B, the cartridge 1208 includes three different types, e.g. colors (red, green and blue), of micro devices 1202, 1204, 1206. A plurality of micro devices 1202, 1204, 1206 of each color can be arranged in the cartridge. A few micro devices can be arranged between the three different colors of micro devices 202, 1204, 1206. The distance between micro devices x1, x2, y1 and y2 are related to the pitch of the landing areas in the receiver substrate 390, 490 or 590. These different arrangements of pixelated micro devices on the donor or temporary (cartridge) substrate can be used to map the microdevices on a backplane.

Figure 13:
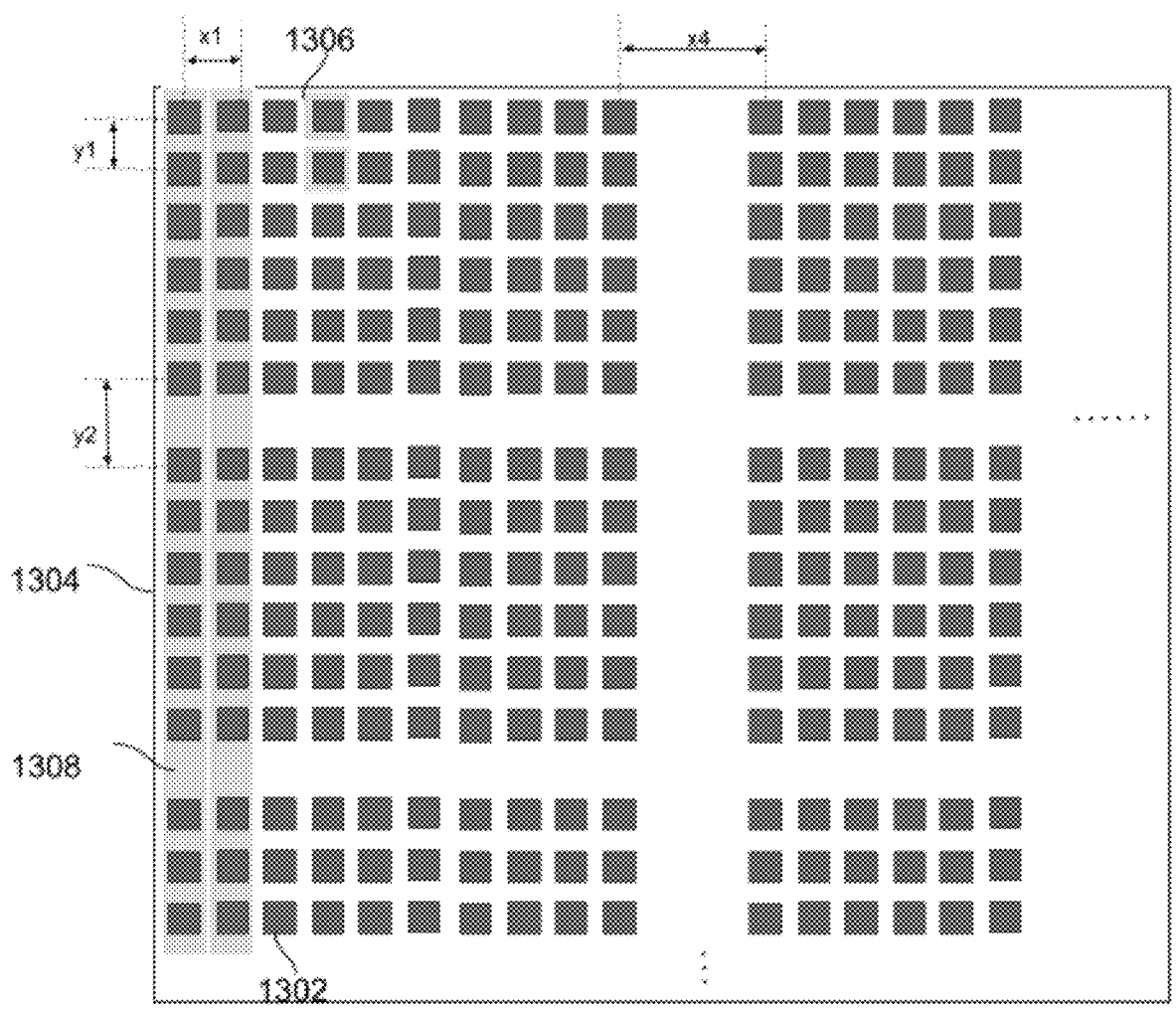
FIG. 13 illustrates an example of a donor substrate for the same type of micro devices, but a different pitch between sets of micro devices.

FIG. 13 illustrates one example of micro devices 1302 prepared on a donor substrate 1304, similar to donor substrates 310 or 510 before transferring to multi-type microdevice cartridge 376, 476, 510, 1108, 1208. Here, one can use supporting layers 1306 and 1308 for individual devices or for a group of devices. Here, the pitch can match the pitch in the cartridge 376, 476, 510, 1108, 1208 or it can be multiple of cartridge pitch.

In all the structures above, it is possible to move the micro devices from the first cartridge to a second one prior to using them in populating a substrate. Extra processing step can be done after transfer. or some of the processing steps can be divided between first and secondary cartridge structure.

Figure 14A:
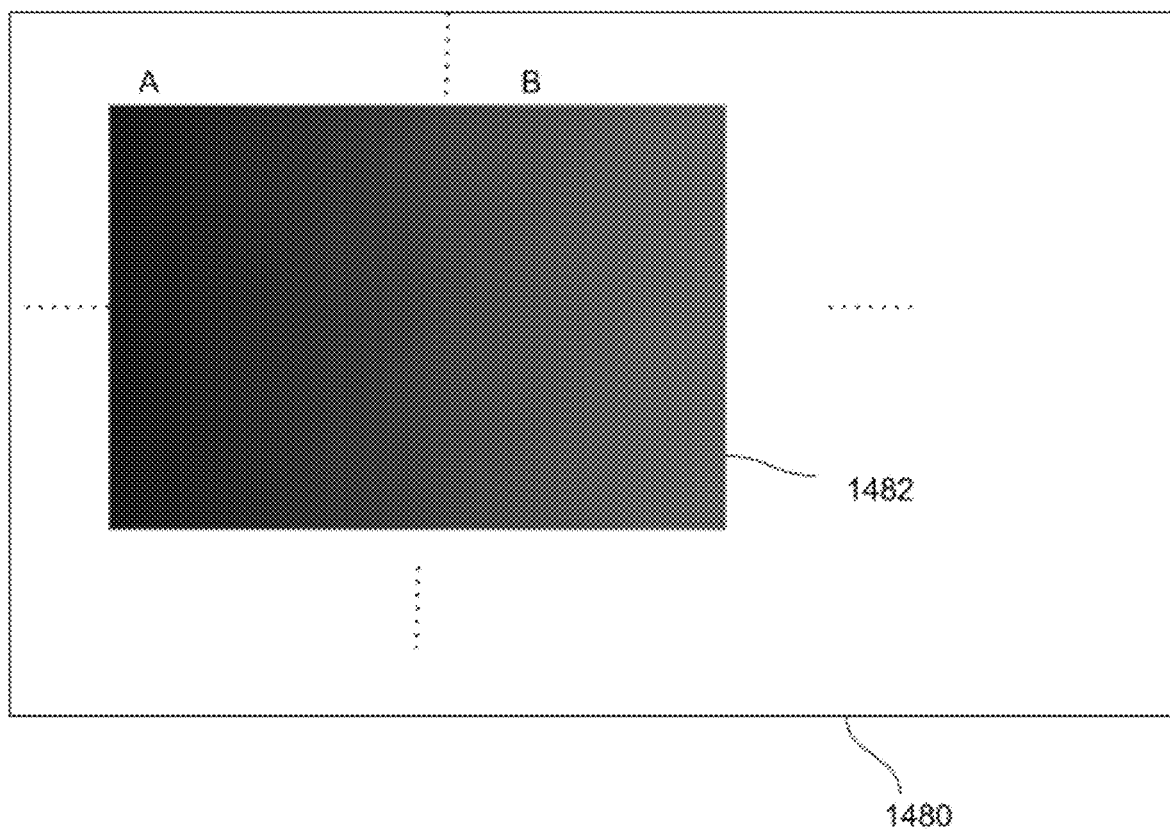
FIG. 14A illustrates an example of a donor or temporary substrate with non-uniformity of output across a block of micro devices.
Figure 14B:
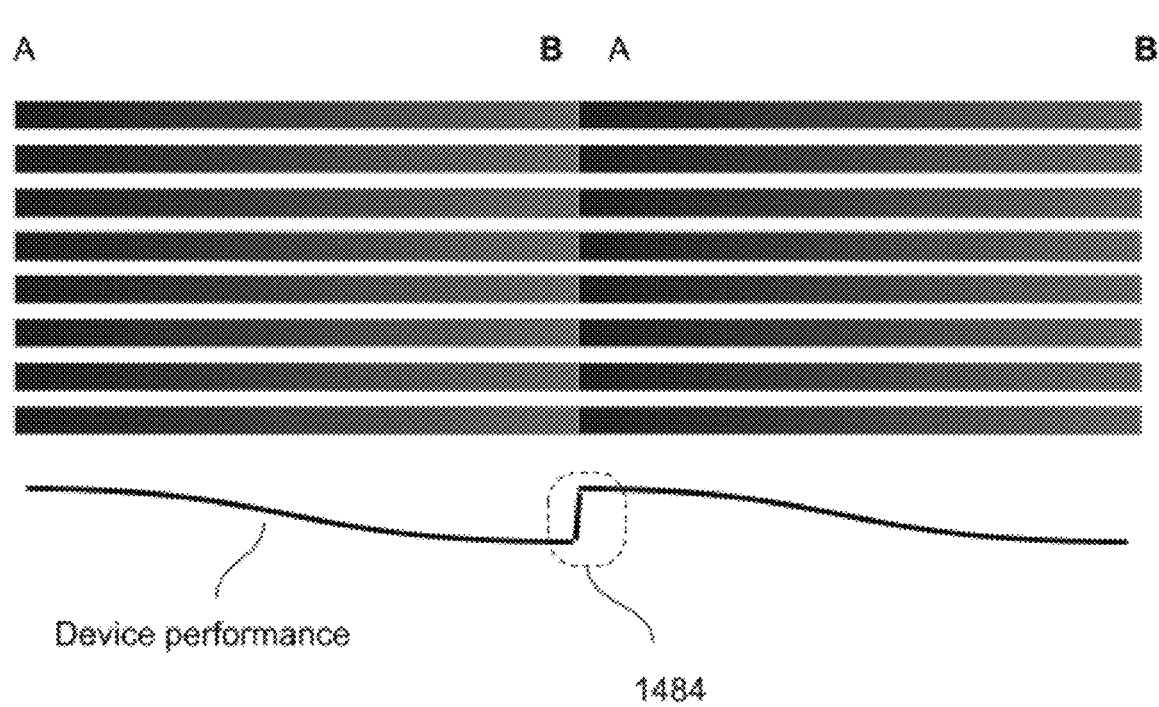
FIG. 14B illustrates an example of a receiver or system substrate with non-uniformity of output across a plurality of block of micro devices.

FIG. 14A illustrates an embodiment of microdevices in a donor substrate 1480, similar to donor substrates 310 or 510. As a result of manufacturing and material flaws, the microdevices may have a gradual decrease or increase in output power, i.e. non-uniformity, across the donor substrate 1480, as illustrated with darker to lighter coloring. Since the devices may be transferred together in a block, e.g. block 1482, or one or more at a time in sequence into the receiver substrates 390, 490 or 590, the adjacent devices in the receiver substrate 390, 490 or 590, the adjacent devices in the receiver substrate gradually degrade. However, a worse problem may occur where one block, e.g. 1482, or a series of adjacent blocks ends and another one, e.g. block 1483 or series of blocks starts, e.g. along an intersection line 1484, which may result in abrupt change in output performance as demonstrated in FIG. 14B. The abrupt change may result in visual artifact for optoelectronic devices, such as displays.

Figure 14C:
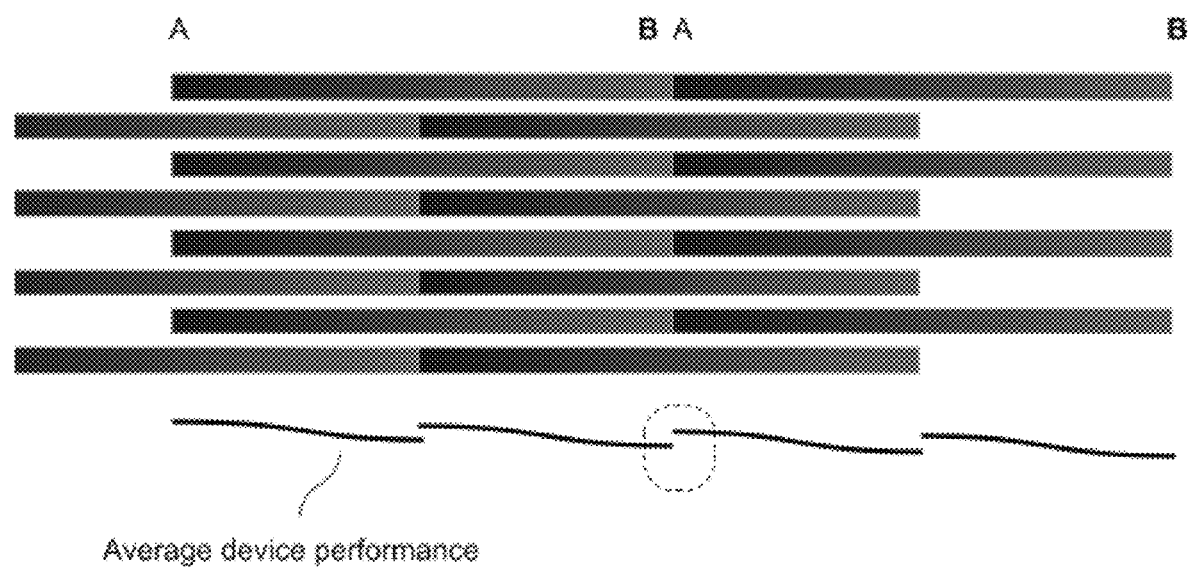
FIG. 14C illustrates an example of a system substrate with skewed blocks of micro devices.

In order to solve the problem of non-uniformity, one embodiment, illustrated in FIG. 14C, includes skewing or staggering the individual blocks 1482 and 1483 with blocks below and above them in the display, so that the edges or intersection lines of the blocks are not sharp lines, eliminating intersection line 1484, and whereby the blocks of devices form a skewed pattern on the display. Therefore, the average impact of the sharp transition is reduced significantly. The skew may be random and may have different profiles.

Figure 14D:
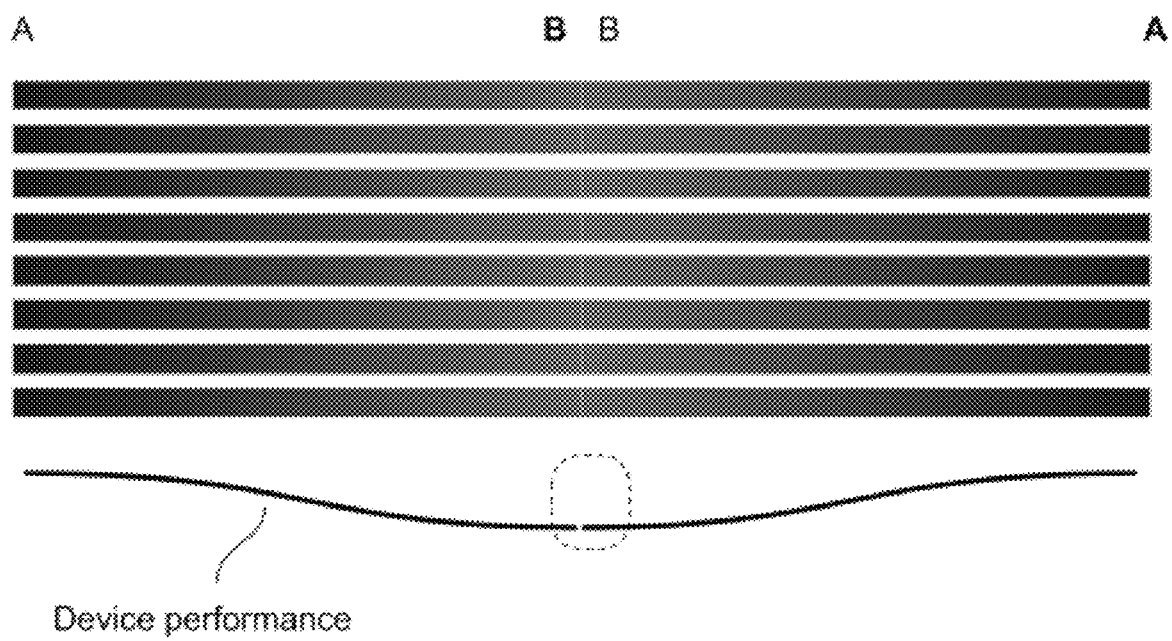
FIG. 14D illustrates an example of a system substrate with flipped blocks of micro devices.

FIG. 14D illustrates another embodiment in which the microdevices in adjacent blocks are flipped so that the devices with similar performance are adjacent one another, e.g. the performance in a first block 1482 decrease from a first outer side A to a first inner side B, while the performance of a second adjacent block 1483 increases from a second inner side B, adjacent to the first inner side A to a second outer side A, which may keep the changes and transitions between blocks very smooth and eliminate the long abrupt intersection 1484.

Figure 14E:
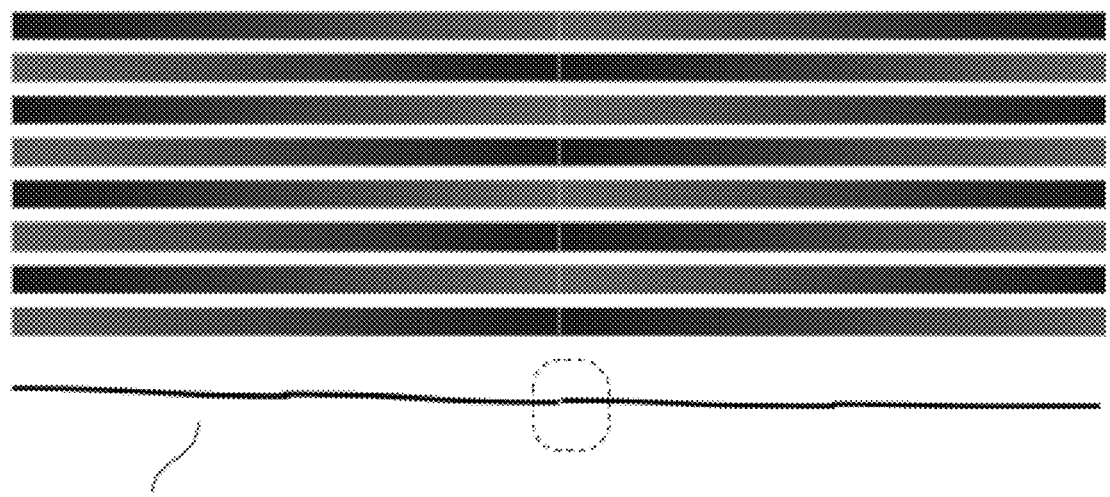
FIG. 14E illustrates an example of a system substrate with flipped and alternating blocks of micro devices.

FIG. 14E illustrates an exemplary combination of flipping the devices, e.g. alternating the high and low performing devices at the inner sides, and skewing the edges to improve the average uniformity furthermore. In the illustrated embodiment the device performance alternates between high and low in both directions, i.e. in adjacent horizontal blocks and in adjacent vertical blocks.

In one case, the performance of micro devices at the edges of the blocks is matched for adjacent transferred block (array) prior to the transfer to the receiver substrate 390, 490 or 590.

Figure 15A:
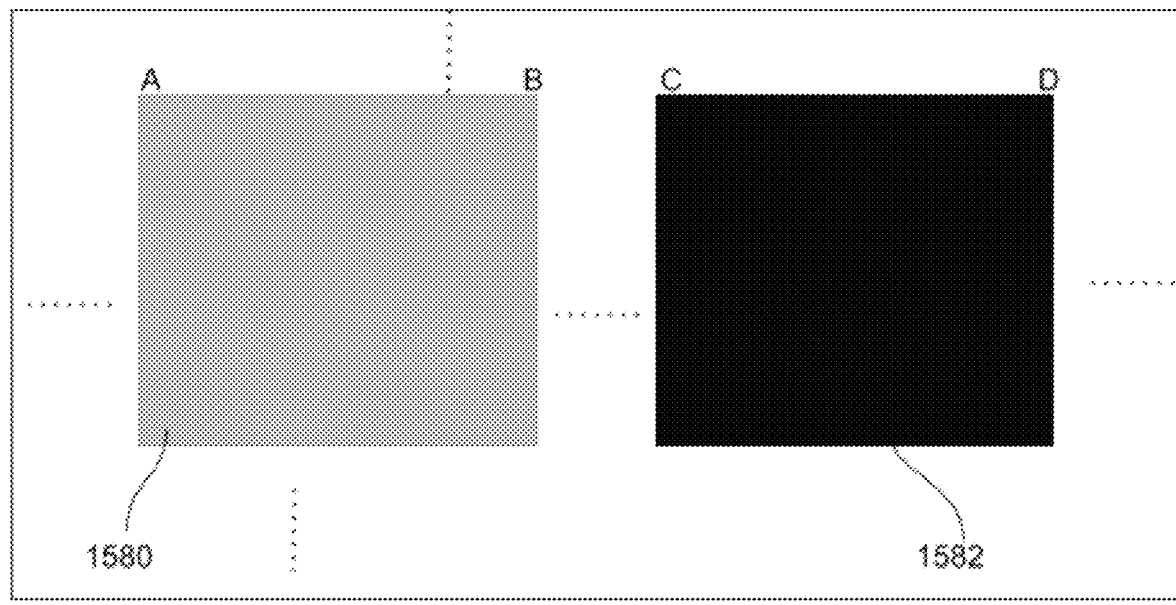
FIG. 15A illustrates an example of a donor substrate with two different blocks of micro devices.
Figure 15B:
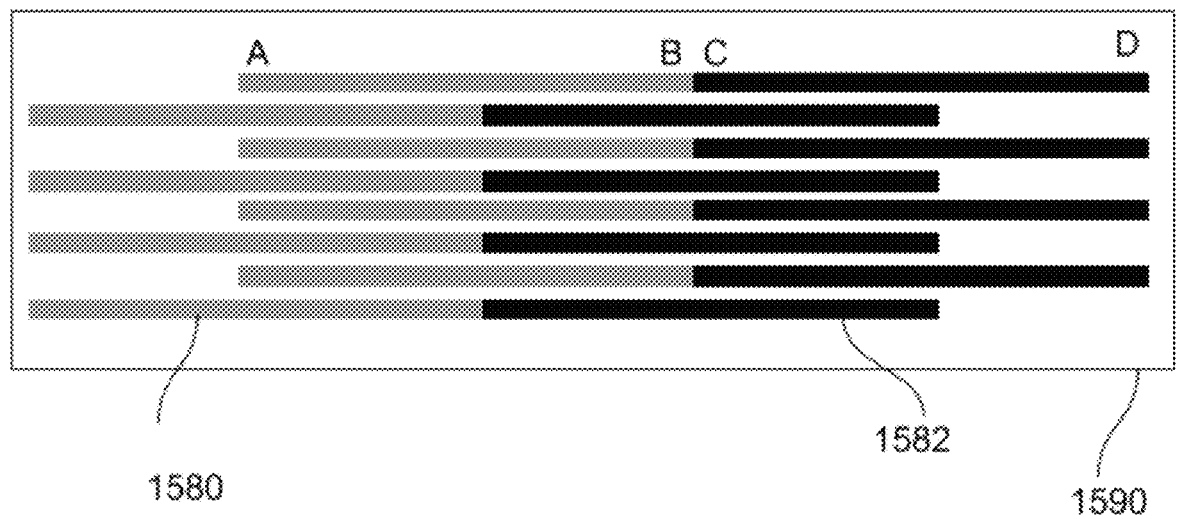
FIG. 15B illustrates an example of a system substrate with skewed blocks of different micro devices.

FIG. 15A illustrates using two or more blocks 1580 1582, to populate a block in the receiver substrate 1590. In the illustrated embodiment, the method of skewing or flipping may be used for further improving the average uniformity as demonstrated in FIG. 15B. Higher (or lower) output power sides B and C from blocks 1580 and 1582, respectively, may be positioned adjacent each other, as well as staggering or skewing the connection between blocks with the connection of the blocks thereabove and therebelow. Also, a random or defined pattern may be used to populate the cartridge or receiver substrate 1590 with more than one block.

Figure 16A:
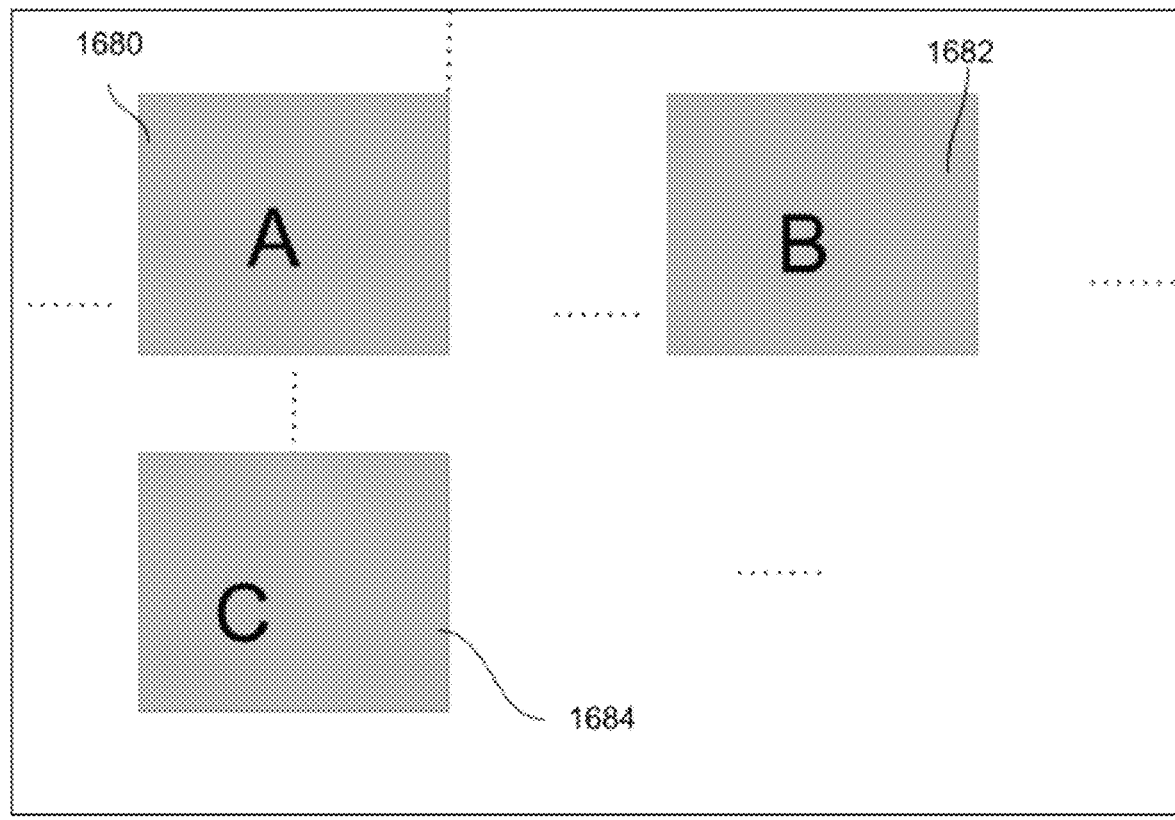
FIG. 16A illustrates an example of a donor substrate with three different types of blocks of pixelated micro devices.
Figure 16B:
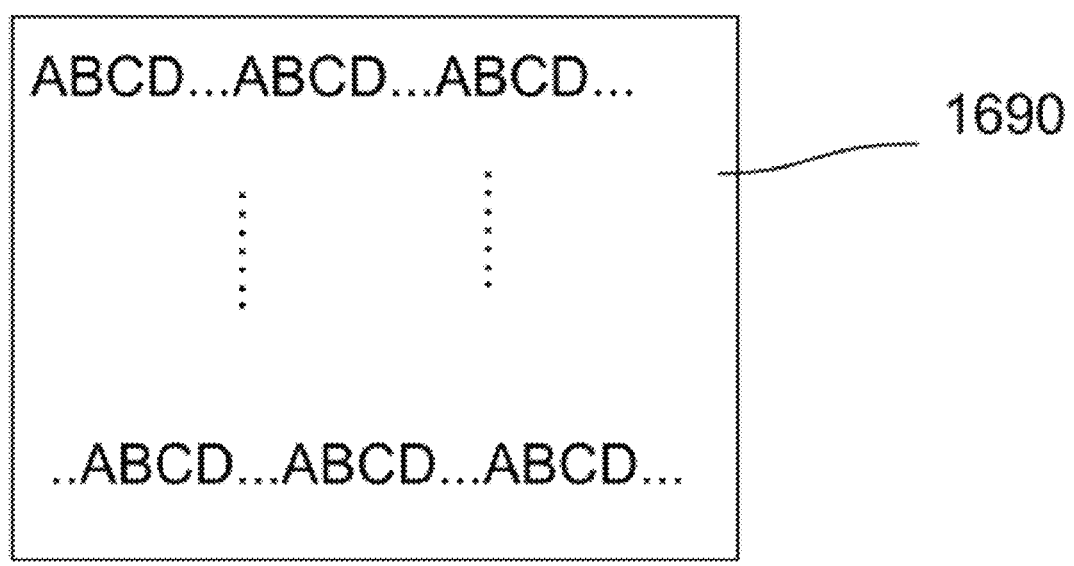
FIG. 16B illustrates an example of a system substrate with a plurality of different types of individual of micro devices from each block.

FIG. 16A illustrates samples with more than one block 1680, 1682 and 1684. The blocks 1680, 1682 and 1684 may be from the same donor substrate 310 or 510 or from different donor substrates 310 or 510. FIG. 16B illustrates an example of populating a cartridge 1690 from different blocks 1680, 1682 and 1684 to eliminate the non-uniformity found in any one block.

Figure 17A:
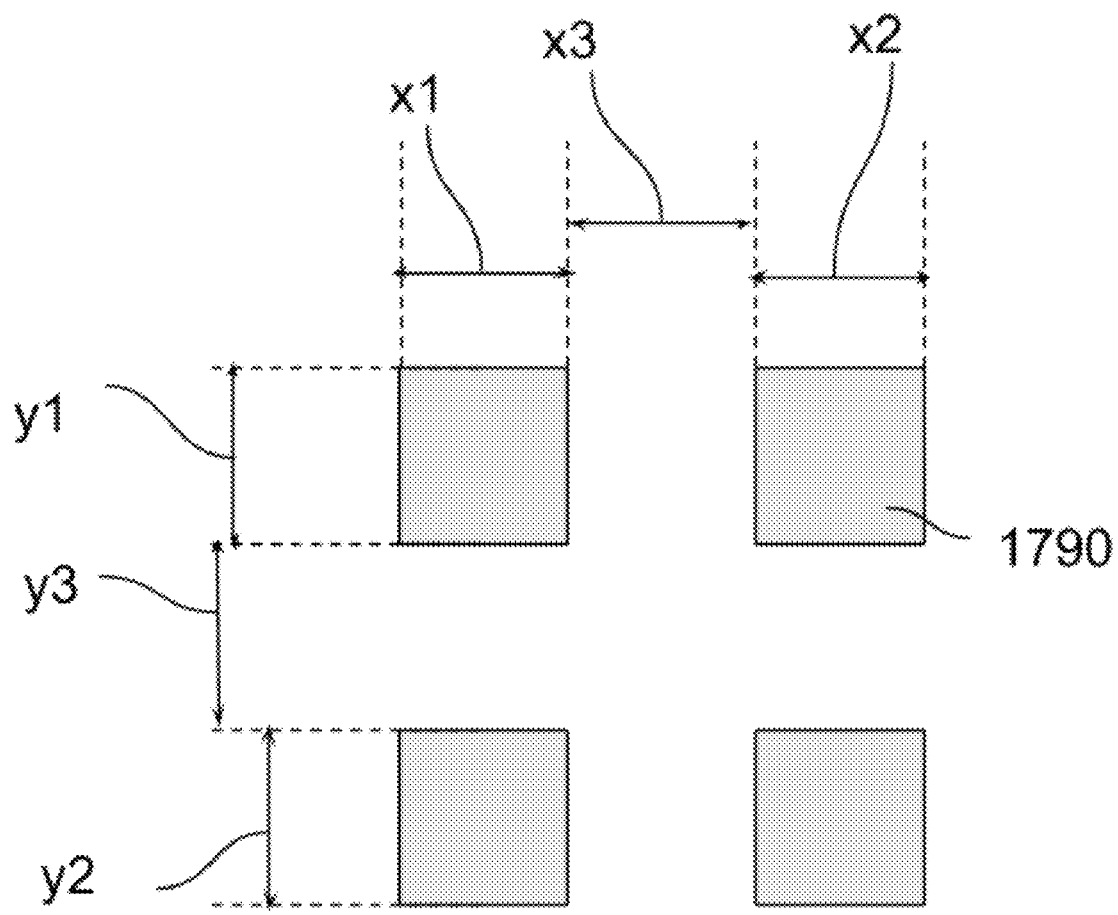
FIG. 17A illustrates an example of a cartridge substrate with a plurality of different types of blocks of pixelated micro devices.
Figure 17B:
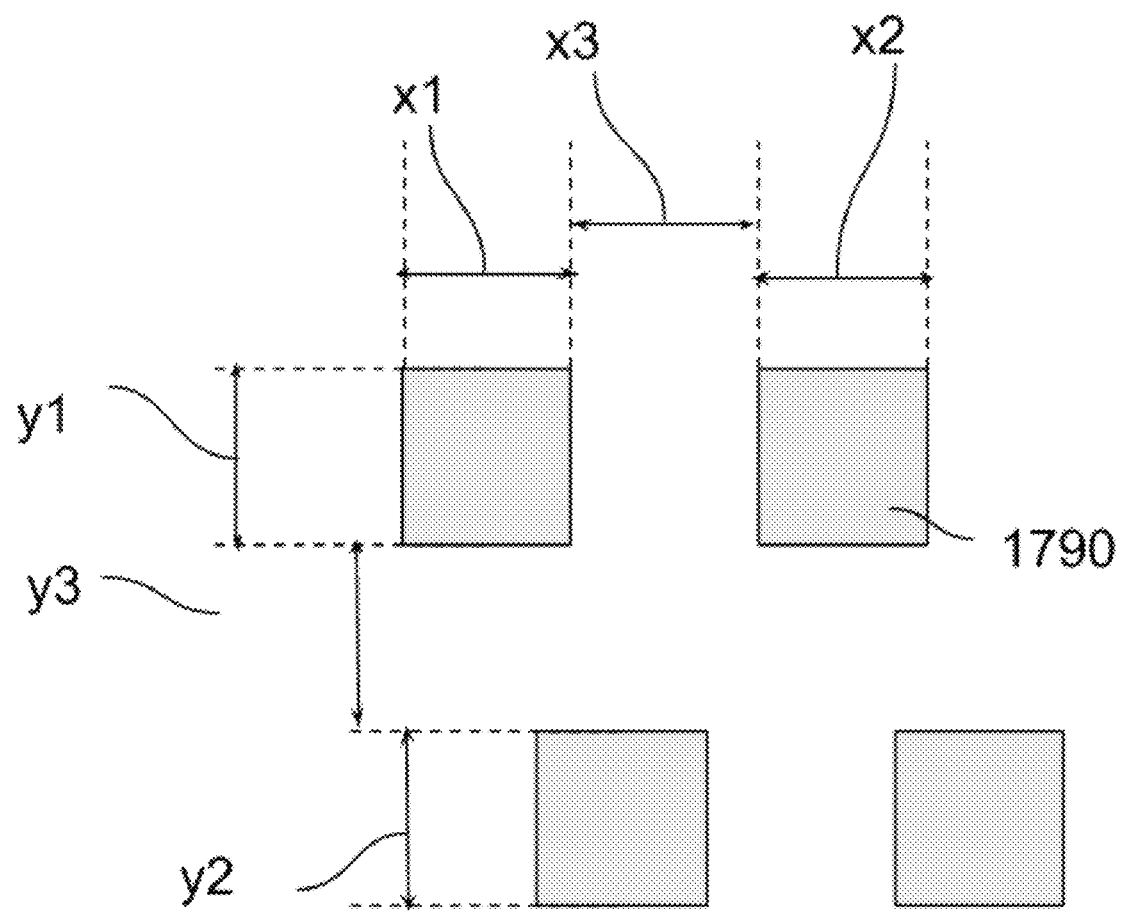
FIG. 17B illustrates an example of a cartridge substrate with a plurality of different types of offset blocks of pixelated micro devices.

FIGS. 17A and 17B illustrate structures with multiple cartridges 1790, The position of the cartridges 1790, as hereinbefore described, are chosen in a way to eliminate overlapping the same area in the receiver substrate 390, 490, 590 or 1590 with cartridges 1790 with the same microdevices during different transfer cycle. In one example, the cartridge 1790 may be independent, which means separate arms or controller is handling each cartridge independently. In another embodiment, the alignment may be done independently, but the other actions may be synchronized. In this embodiment, the receiver substrate 390, 490, 590 or 1590 may move to facilitate the transfer after the alignment. In another example, the cartridges 1790 move together to facilitate the transfer after the alignment. In another example, both the cartridges 1790 and the receiver substrate 390, 490, 590 or 1590 may move to facilitate the transfer. In another case, the cartridges 1790 may be assembled in advanced. In this case, a frame or substrate may hold the assembled cartridges 1790.

The distance X3, Y3 between cartridges 1790 may be a multiple of the width X1, X2 or length Y1, Y2 of the cartridge 1790. The distance may be a function of the moving steps in the different directions. For example, X3=KX1+HX2, where K is the movement step to left (directly or indirectly) and H is the movement steps to the right (directly or indirectly) for populating a receiver substrate 390, 490, 590 or 1590. The same may be used for the distance Y3 between the cartridges 1790 and the lengths of Y1 and Y2. As shown in FIG. 17A, the cartridges 1790 may be aligned in one or two directions. In another example, shown in FIG. 17B, the cartridges 1790 are not aligned in at least one direction. Each cartridge 1790 may have independent control for applying pressure and temperature toward the receiver substrate 390, 490, 590 or 1590. Other arrangements are also possible depending on the direction of movement between the receiver substrate 390, 490, 590 or 1590 and the cartridges 1790.

In another example, the cartridges 1790 may have different devices and therefore populating different areas in the receiver substrate 390, 490, 590 or 1590 with different devices. In this case, relative position of the cartridges 1790 and the receiver substrate 390, 490, 590 or 1590 changes after each transfer cycle to populate different area with all the required micro devices from different cartridges 1790.

In another embodiment, several arrays of cartridges 1790 are prepared. Here, after devices are transferred to the receiver substrate 390, 490, 590 or 1590 from first array of cartridges, the receiver substrate 390, 490, 590 or 1590 is moved to the next array of micro devices to fill the remaining areas in the receiver substrate 390, 490, 590 or 1590 or receive different devices.

In another example, the cartridges 1790 may be on a curve surface and therefore circular movement provides contact for transferring micro devices into the receiver substrate 390, 490, 590 or 1590.

Figure 18:
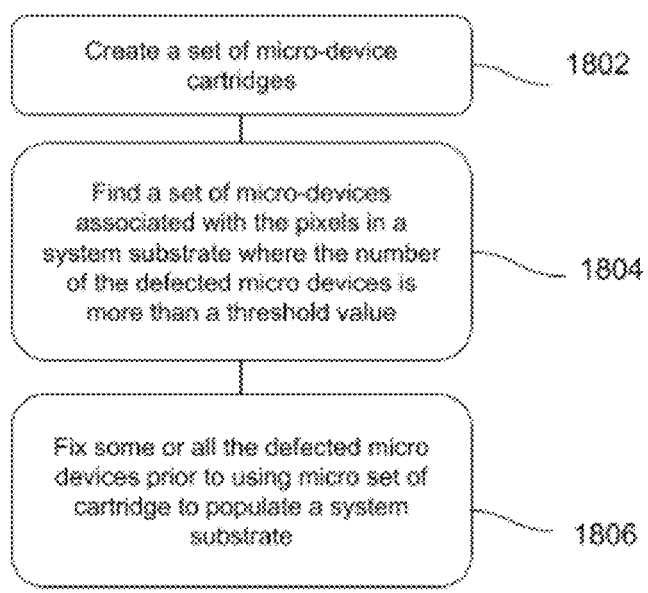
FIG. 18A-18E shows examples flowcharts of developing micro device cartridge.

FIG. 18A-18E highlights the process of developing micro-device cartridges and mitigating the defected microdevices. In FIG. 18A, during the first step 1802, a set of micro-devices are prepared on a substrate. During the second step 1804, the set of micro-devices associated with the pixels in a system substrate where the number of the defected micro devices is more than a threshold value can be found. During the third step 1806, some or all the defected micro devices prior to using micro set of cartridges to populate a system substrate can be fixed. Some these steps can be rearranged or merged.

Figure 18B:
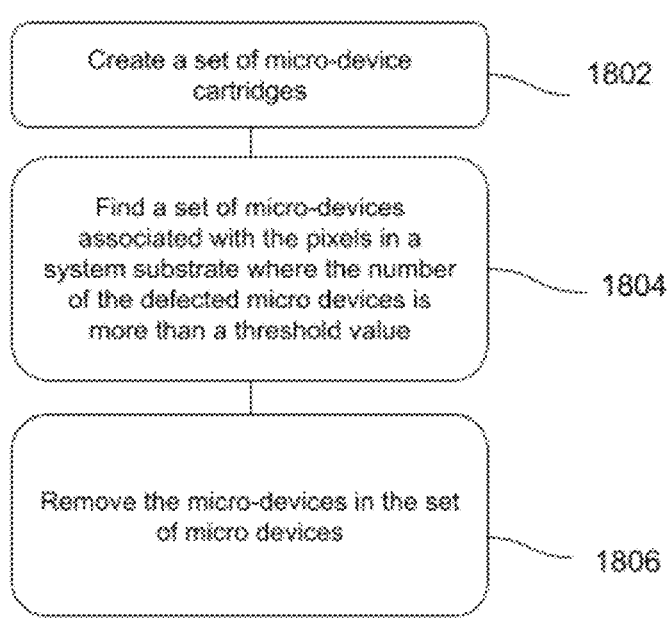

In FIG. 18B, during the first step 1802, a set of microdevices are prepared on a substrate. During the second step 1804, the set of micro-devices associated with the pixels in a system substrate where the number of the defected micro devices is more than a threshold value can be found. During the third step 1806, the micro-devices in the set of micro devices can be removed.

Figure 18C:
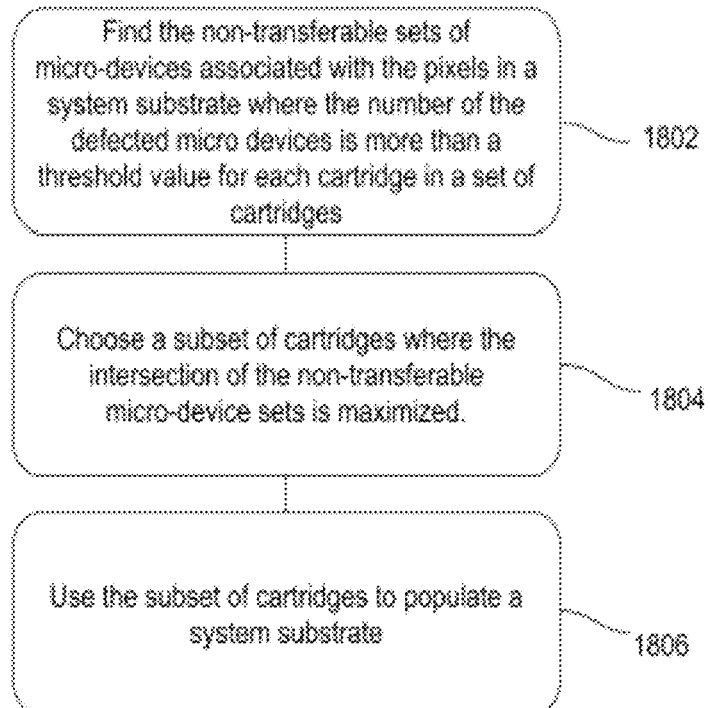

In FIG. 18C, during the first step 1802, the non-transferable sets of micro-devices associated with the pixels in a system substrate where the number of the defected micro devices is more than a threshold value for each cartridge in a set of cartridges can be found. During the second step 1804, a subset of cartridges where the intersection of the non-transferable micro-device sets is maximized can be chosen. During the third step 1806, the subset of cartridges to populate a system substrate may be used.

Figure 18D:
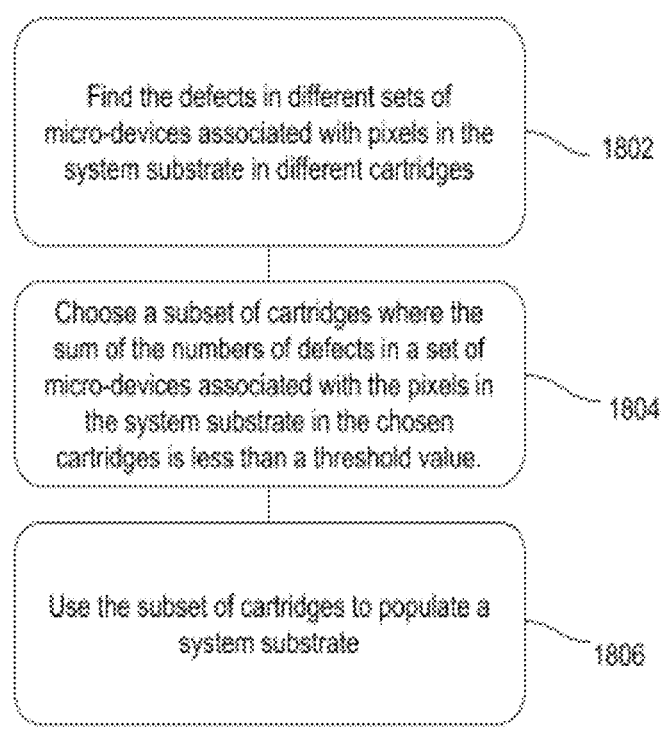

In FIG. 18D, during the first step 1802, the defects in different sets of micro-devices associated with pixels in the system substrate in different cartridges can be found. During the second step 1804, the defects in different sets of micro-devices associated with pixels in the system substrate in different cartridges can be chosen. During the third step 1806, the subset of cartridges to populate a system substrate may be used.

Figure 18E:
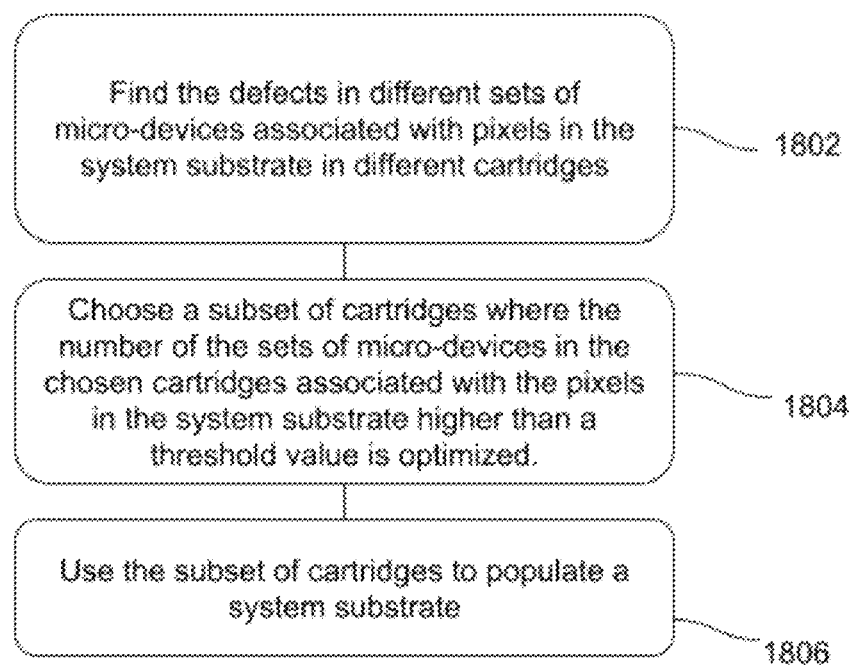

In FIG. 18E, during the first step 1802, the defects in different sets of micro-devices associated with pixels in the system substrate in different cartridges can be found. During the second step 1804, a subset of cartridges where the number of the sets of micro-devices in the chosen cartridges associated with the pixels in the system substrate higher than a threshold value is optimized can be chosen. During the third step 1806, the subset of cartridges to populate a system substrate may be used.

Figure 19:
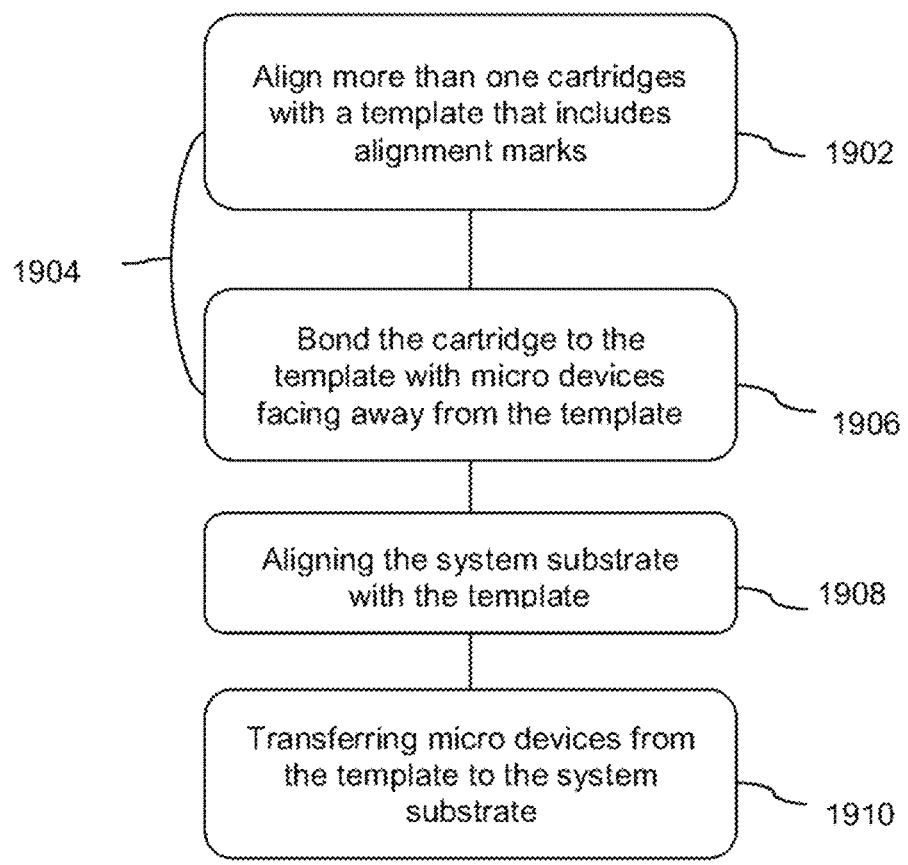
FIG. 19 shows an embodiment using a template for transferring multiple cartridges to populate a system substrate with micro devices.

FIG. 19 shows an embodiment using a template for transferring multiple cartridges to populate a system substrate with micro devices. here, the template has more than one cartridge. During first step 1902, at least one cartridge is aligned with the template which has some alignment mark facilitating the alignment process. During the second step 1904, at least one cartridge is bonded to the template. The bonding mechanism could be different forms such as thermal, optical, vacuum, van der waals, mechanical grip etc. There can be a loop 1906, that repeats the steps 1902, 1904 to bond more cartridges to the template. Then the template is aligned with the receiver substrate.

Figure 20:
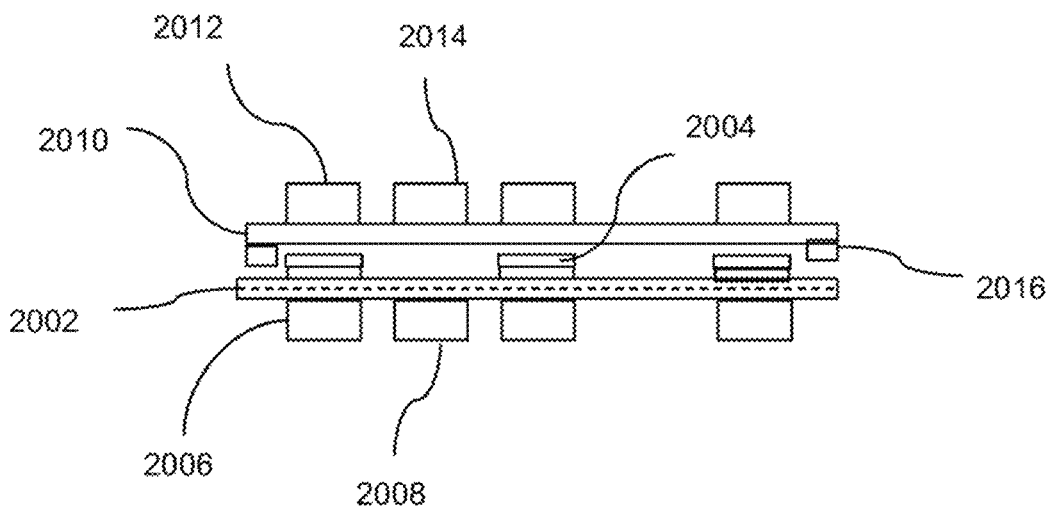
FIG. 20 shows an example of a template transfer system.

FIG. 20 shows an example of a template transfer system. Here, the template 2002, has multiple cartridges 2004 which can be loaded on a structure 2002-2. The said structure 2002-2 can offer more rigidity and also a high profile. The height profile can be controlled independently for each structure 2002-2. The structure 2002-2 can be the same size, smaller or larger than the cartridge. This structure 2002-2 can be also a bonding apparatus that assist the transfer of microdevices from the cartridge 2004 into receiver substrate 2010. The bonding apparatus can provide pressure, temperature, optical, and other type of force to assist the transfer. In another case, the bonding apparatus 2006 is at the other side of the template 2002. Also, some support structure 2008 can hold the template in place. The support 2008 can be at either side of the template 2002. In one case, the support structure can be the same as the bonding apparatus. In another case, there is a separate bonding apparatus for each cartridge. In another case, the bonding apparatus is the same for at least more than one cartridges. The receiver substrate 2010 also has support structures 2014, 2016. The support structure can be at either side of the receiver substrate. In one case, the receiver substrate may have bonding apparatus 2012 that can assist or initiate the bonding process. Either bonding apparatus 2006 or 2012 can be used for bonding. The support structure 2014 can be the same as the receiver bonding apparatus 2012. In another case, multiple template can be used to populate a receiver substrate. Here, each template can be aligned independently with the receiver substrate.

The support structure can be a suction apparatus, magnetic, a spring-loaded pin, a gas bed made of pressured gas such as air or nitrogen, etc.

The area between cartridge 2004 and bonding apparatus 2006 on the template 2002 can have different thermal and or mechanical property. In one case it can be made of different material with higher thermal conduction. In another case, vias may form on template in either different areas or at least in one of the area between the cartridge 2004 and apparatus 2006 and the other areas. The size of the VIAs can be adjusted for each area to adjust the mechanical property. In another case, the VIAs can be filed with different materials to adjust the mechanical and or thermal property of different areas of the template 2002.

A vertical optoelectronic stack layers includes a substrate, active layers, at least one buffer layer between the active layers and the substrate, and at least one separation layer between the buffer layer and the active layers, wherein the active layers may be physically removed from the substrate by means of changing the property of the separation layer while the buffer layer remains on the substrate.

In one embodiment, the process of changing the property of the separation layer(s) includes chemical reaction etches or deforming the separation layer.

In another embodiment, the process of changing the property of the separation layer(s) includes exposure to an optoelectronic wave, deforming the separation layer.

In another embodiment, the process of changing the property of the separation layer(s) includes a change in the temperature, deforming the separation layer.

In one embodiment, reusing the buffer layers for developing new optoelectronic stack layers, includes surface treatment.

In one embodiment, the surface treatment uses chemical or physical etching or polishing.

In another embodiment, the surface treatment uses deposition of an extra thin layer of buffer layer for resurfacing.

In one embodiment, the optoelectronic device is a light emitting diode.

In one embodiment, the separation layer may be zinc oxide.

An embodiment of this invention comprises a continuous pixelated structure that includes fully or partially continuous active layers, pixelated contact and/or current spreading layers.

In this embodiment, a pad and/or bonding layers may exist on top of a pixelated contact and/or current spreading layers.

In the above embodiment, a dielectric opening may exist on top of each pixelated contact and/or current spreading layers.

Another embodiment comprises a donor substrate that includes micro devices with bonding pads and filler layers filling the space between the micro devices.

Another embodiment comprises a temporary substrate that includes a bond layer that the micro devices from donor substrate are bonded to.

Another embodiment comprises a thermal transfer technique which includes the following steps:
1) aligning the micro devices on a temporary substrate to the bonding pads of a system substrate;
2) melting point of the bonding pads on the system substrate is higher than the melting point of bonding layer in temporary substrate;
3) a thermal profile is created that melts both said bonding pads and layer and after that keeps the bond layer melted and bond pad solidified; and
4) separating temporary substrate from the system substrate;

In another embodiment in the transfer technique, the thermal profile is created by both localized or global thermal sources or both.

Another embodiment comprises a micro device structure wherein at least one anchor holds the micro device to the donor substrate after the device is released from the donor substrate by a form of lift off process.

Another embodiment comprises a transfer technology for the micro device structure in which the anchor releases the micro device after or during the micro device is bonded to a pad in a receiver substrate either by the push force or by pull force.

In another embodiment, the anchor according to the micro device structure is comprised of at least one layer extending to the substrate from the side of the micro device.

In another embodiment, the anchor according to the micro device structure is comprised of a void and at least one layer on top of the void.

In another embodiment, the anchor according to the micro device structure is comprised of filling layers surrounding the devices.

Another embodiment comprises a structure according to the micro device structure where the viscosity of the layer between lift off micro device and donor substrate is increased to act as an anchor by controlling the temperature.

Another embodiment comprises a release process for the anchor in the micro device structure, in which the temperature is adjusted to reduce the force between the anchor and the micro-device.

Another embodiment comprises a process of transferring micro devices into a receiver substrate wherein microdevices are formed into a cartridge; aligning the cartridge with selected landing areas in the receiver substrate; and transferring micro devices in the cartridge associated with selected landing areas to the receiver substrate Another embodiment comprises a process of transferring micro devices into a receiver substrate wherein microdevices are formed into a cartridge; selecting a set of micro devices with defective micro devices less than a threshold; aligning the selected set of micro devices in the cartridge with selected landing areas in the receiver substrate; and transferring microdevices in the cartridge associated with selected landing areas to the receiver substrate An embodiment which includes the cartridge that has multi-type of micro-devices transferred therein.

An embodiment which comprises a micro device cartridge wherein a sacrificial layer separates at least one side of the micro device from the filler or bonding layer An embodiment which the sacrificial layer is removed to release the micro devices from the filler or bonding layer.

An embodiment which the sacrificial layer releases the micro devices from the filler under some conditions, such as high temperature.

The microdevices may be tested for extracting information related to micro devices including but not limited to defects, uniformity, operation condition, and more. In one embodiment, the microdevice(s) are temporarily bonded to a cartridge, which has one or more electrodes to test the microdevices. In one embodiment, another electrode is deposited after microdevices are located in the cartridge. This electrode can be used for testing the microdevices before or after patterning. In one embodiment, the cartridge is placed in a predefined position (it could be a holder). Either the cartridge and/or the receiver substrate are moved to get aligned. At least one selected microdevice is transferred to the receiver substrate. If more microdevices are available on/in the cartridge, either the cartridge or the receiver substrate are moved to get aligned with a new area in the same receiver substrate or a new receiver substrate and at least another selected device(s) is transferred to the new place. This process may continue until the cartridge does not have enough microdevices, at which time a new cartridge may be placed in the predefined position. In one example, transfer of the selected devices is controlled based on the information extracted from the cartridge. In one example, the defect information extracted from cartridge may be used to limit the number of defective devices transferred to the receiver substrate to below a threshold number by eliminating the transfer of a set of micro devices which have a defect number more than a threshold value or the cumulative number of transferred defects will be more than a threshold value. In another example, the cartridges will be binned based on one or more extracted parameters and each bin will be used for different applications. In another case, cartridges with close performance based on one or more parameters will be used in one receiver substrate. The examples presented here, may be combined to improve the cartridge transfer performance.

In an embodiment, physical contact and pressure and/or temperature may be used for transferring the devices from the cartridge into the receiver substrate. Here, the pressure and/or temperature may create a bonding force (or grip force) to hold the microdevices to the receiver substrate and/or also the temperature may reduce the contact force of between the microdevices and the cartridge. Thus, enabling the transfer of microdevices to the receiver substrate. In this case, the positions allocated to the microdevices on the receiver substrate have a higher profile compared to the rest of the receiver substrate to enhance the transfer process. In an embodiment, the cartridge does not have microdevices in areas that may be in contact with unwanted areas of the receiver substrate, such as the positions allocated to the other type of micro devices during the transfer process. These two examples may be combined. In an embodiment, the allocated positions for the microdevices on the substrate may have been selectively wetted with adhesive, or covered with bonding alloys, or an extra structure is placed on the allocated position. In a stamping process, a separate cartridge, printing, or other process may be used. In an embodiment, the selected microdevices on the cartridge may be moved closer to the receiver substrate to enhance the selective transfer. In another case, the receiver substrate applies a poll force to assist or initiate the microdevice transfer from the cartridge. The poll force can be in combination with other forces.

In one embodiment a housing will support the micro devices in the cartridge. The housing may be fabricated around the micro device on the donor substrate or cartridge substrate or fabricated separately and then micro devices are moved inside and bonded to the cartridge. In one embodiment, there may be at least one polymer (or another type of material) deposited on top of the cartridge substrate. The micro devices from donor substrate are pushed into the polymer layer. The micro devices are separated from the donor substrate selectively or generally. The layer may be cured before or after the devices are separated from the donor substrate. This layer may be patterned specially if multiple different devices are integrated into the cartridge. In this case, the layer may be created for one type, the micro devices buried in the layer and separated from their donor. Then another layer is deposited and patterned for the next type of micro devices. Then, the second microdevices buried in the associated layer. In all cases, this layer may cover part of the micro devices or the entire devices. In another case, the housing is built by polymer, organic or other layers after the micro devices are transferred to the cartridge. The housing may have different shapes. In one case the housing may match the device shape. The housing side walls may be shorter than the micro device height. The housing side wall may be connected to the micro device prior to the transfer cycle to provide support for different post processing of micro devices in the cartridge and packaging of the microdevice cartridges for shipment and storage. The housing side walls may be separated or the connection to the microdevice may be weakened from the device prior or during the transfer cycle by different means such as heating, etching, or light exposure. There may be a contact point that holds the microdevice to the cartridge substrate. The contact point to the cartridge may be either a bottom or a top side of the device. The contact point may be weakened or eliminated prior or during the transfer by different means such as heat, chemical process, or light exposure. This process may be performed for some selected devices or be globally for all the micro devices on the cartridge. The contact may be also electrically conductive to enable testing the micro devices by biasing the devices at the contact point and other electrodes connected to the micro devices. The cartridge may be beneath the receiver substrate during the transfer cycle to prevent the micro devices from falling off from the housing if the contact point is removed or weakened globally.

In one embodiment, the micro device cartridge may include at least one anchor that holds the micro devices to the cartridge surface. The cartridge and/or receiver substrates are moved so that some of the micro devices in the cartridge get aligned with some positions in the receiver substrate. This anchor may break under pressure either during pushing the cartridge and the receiver substrate toward each other or pulling the device by the receiver substrate. The micro devices may stay on the receiver substrate permanently. The anchor may be on the side of the microdevice or at the top (or bottom) of the microdevice.

The top side is the side of the device facing the cartridge and bottom is the opposite side of the microdevices. The other sides are referred as sides or side walls.

In one embodiment the microdevices may be tested for extracting information related to the micro devices, including but not limited to defects, uniformity, operation condition, and more. The cartridge may be placed in a predefined position (it could be a holder). Either the cartridge and/or the receiver substrate may be moved to get aligned. At least one selected microdevice may be transferred to the receiver substrate. If more microdevices are available on/in the cartridge, either the cartridge or receiver substrate may be moved to get aligned with a new area in the same receiver substrate or a new receiver substrate and at least another selected device(s) may be transferred to the new place. This process may continue until the cartridge does not have enough microdevices, at which time a new cartridge will be placed in the predefined position. In one case, transfer of the selected devices may be controlled based on the information extracted from the cartridge. In one case, the defect information extracted from cartridge may be used to limit the number of defective devices transferred to the receiver substrate to below a threshold number by eliminating the transfer of a set of micro devices, which have a defect number more than a threshold value or the cumulative number of transferred defects are more than a threshold value. In another case, the cartridges will be binned based on one or more extracted parameters and each bin may be used for different applications. In another case, cartridges with close performance based on one or more parameters may be used in a one receiver substrate. The examples presented here, may be combined to improve the cartridge transfer performance.

One embodiment comprises a method of transferring the microdevices to a receiver substrate. The method includes:

a) Preparing a cartridge which has a substrate in which microdevices are located on at least one surface of the cartridge substrate and has more microdevices in an area than micro device location in the same size corresponding area in the receiver substrate.
b) Testing the devices on the cartridge by extracting at least one parameter.
c) The cartridge is picked or transferred to a position with microdevices facing the receiver substrate.
d) The test data is used to select a set of microdevices on the cartridge.
e) The selected set of microdevices on cartridge and a selected position on the receiver substrate are aligned. The set of the microdevices are transferred to the receiver substrate from the cartridge.
f) The process d and e may continue until the cartridge does not have any useful devices or the receiver substrate is fully populated.

One embodiment comprises a cartridge which has more than one type of microdevices that are located in the cartridge in the same pitch as in the receiver substrate.

One embodiment comprises a cartridge which has a substrate, wherein the microdevices are located on the surface (directly or indirectly) thereof, and the microdevices are skewed in either rows or columns so that at least the edge of either one row or a column is not aligned with the edge of at least another row or a column.

One embodiment is a method of transferring the microdevices to a receiver substrate. The method includes transferring an array of microdevices into a substrate where at least the edge of either one row or a column of the transferred microdevices is not aligned with the edge of at least another row or a column of transferred devices.

One embodiment comprises a method of transferring the microdevices to a receiver substrate. The method includes transferring an array of devices from a donor substrate to a receiver substrate, wherein in any area on the receiver substrate similar to the size of transferred array at least there is either one row or column that has micro devices from two different areas from the donor substrate corresponding to the transferred array.

One embodiment comprises a process of transferring arrays of micro devices into a receiver substrate, wherein the micro devices are skewed at the edges of the array to eliminate abrupt change.

Another embodiment comprises a process of transferring arrays of micro devices into a receiver substrate, wherein the performance of the micro devices at the adjacent edges of two arrays of micro devices are matched prior to the transfer.

Another embodiment comprises a process of transferring arrays of micro devices into a receiver substrate where the array of micro devices is populated at least from two different areas of micro-device donor substrates.

Another embodiment comprises a process of transferring array of micro devices into a receiver substrate from cartridge where several micro-device cartridges are placed in different positions corresponding to different areas of the receiver substrate, then the cartridges are aligned with the receiver substrate, and micro-devices are transferred from cartridges to the receiver substrate.

According to one embodiment, a method of transferring a plurality of microdevices into a receiver substrate is provided. The method comprising arranging the plurality of microdevices in one or more cartridges, aligning the one or more cartridges with a template that has at least one alignment mark, bonding the one or more cartridges with the template, aligning the template with the receiver substrate; and transferring the plurality of microdevices from the template into the receiver substrate.

According to some embodiment, aligning the template with receiver substrate comprising stretching the template and the bonding of the one or more cartridges with the template by one of: a thermal bonding, an optical bonding, a vacuum bonding, van-der waals forces or a mechanical grip.

According to another embodiment, a transfer setup is provided. The transfer setup comprising a template that holds at least one cartridge filled with microdevices; and a bonding apparatus, on the template, to assist a transfer of the microdevices from the at least one cartridge to a receiver substrate by a transfer force.

According to yet another embodiment, each cartridge has a separate bonding apparatus. The transfer setup further comprising a support structure to hold the template in place and a height adjusting apparatus between the template and the at least one cartridge. The support structure comprises one of: a suction apparatus, a spring-loaded pin and a gas bed made of pressured gas.

According to further embodiment, an area between the at least one cartridge and the bonding apparatus on the template is having different thermal and mechanical properties and a plurality of vias are formed on different areas between the cartridge and the bonding apparatus on the template. A size of the plurality of vias is adjusted for each area to adjust the thermal and mechanical properties.

According to yet another embodiment, a method of transferring a plurality of microdevices into a system substrate is provided. The method comprising arranging the plurality of microdevices on one or more cartridges in the system substrate; selecting one or more transferable sets of micro devices in each cartridge; identifying a number of defected micro devices in each transferable set of micro devices; and simultaneously adjusting transfer of the defected micro devices into the system substrate.

According to another embodiment, wherein adjusting transfer of the defected microdevices comprising: fixing or removing the defected micro-devices in each cartridge if a sum of the number of the defected micro devices is more than a threshold value, choosing a subset of the one or more cartridges where an intersection of non-transferable set of micro-device sets is maximum, and using the subset of cartridges to adjust transfer to the system substrate, choosing a subset of cartridges where a sum of the numbers of defected micro device is less than a threshold value; and using the subset of cartridges to populate the system substrate. and choosing a subset of cartridges wherein the sum of number of defected micro device higher than a threshold value is optimized; and using the subset of cartridges to populate the system substrate.

According to yet another embodiment, the method further comprising biasing the micro-devices through the system substrate to test a connection between the transferred micro-devices and the receiver substrate and adjusting bonding parameters to fix identified number of the defected micro-devices.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A transfer setup comprising:
   a template having at least one alignment mark;
   a cartridge filled with microdevices aligned and bonded to a template, with the template being aligned with a receiver substrate; and
   a bonding apparatus on the template that transfers the microdevices from the cartridge to a receiver substrate by a transfer force.

2. The transfer setup of claim 1, wherein each cartridge, in a transfer of multiple cartridges, has a separate bonding apparatus.

3. The transfer setup of claim 1, further comprising:
   a support structure to hold the template in place.

4. The transfer setup of claim 3, wherein the support structure comprises one of:
   a suction apparatus, a spring-loaded pin and a gas bed made of pressured gas.

5. The transfer setup of claim 1, further comprising a height adjusting apparatus between the template and the cartridge.

6. The transfer setup of claim 1, wherein an area between the cartridge and the bonding apparatus on the template is having different thermal and mechanical properties.

7. The transfer setup of claim 1, wherein a plurality of vias are formed on different areas between the cartridge and the bonding apparatus on the template.

8. The transfer setup of claim 7, wherein a size of the plurality of vias is adjusted for each area to adjust thermal and mechanical properties.

* * * * *